US011011652B2

(12) United States Patent
Yamazaki et al.

(10) Patent No.: US 11,011,652 B2
(45) Date of Patent: May 18, 2021

(54) SEMICONDUCTOR DEVICE AND MANUFACTURING METHOD THEREOF

(71) Applicant: Semiconductor Energy Laboratory Co., Ltd., Atsugi (JP)

(72) Inventors: Shunpei Yamazaki, Setagaya (JP); Satoshi Shinohara, Fujisawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 16/847,912

(22) Filed: Apr. 14, 2020

(65) Prior Publication Data

US 2020/0243689 A1 Jul. 30, 2020

Related U.S. Application Data

(63) Continuation of application No. 16/053,188, filed on Aug. 2, 2018, now Pat. No. 10,658,522, which is a
(Continued)

(30) Foreign Application Priority Data

Jul. 8, 2011 (JP) ................. 2011-152099

(51) Int. Cl.
*H01L 29/786* (2006.01)
*H01L 29/04* (2006.01)
*H01L 29/24* (2006.01)

(52) U.S. Cl.
CPC ...... *H01L 29/78696* (2013.01); *H01L 29/045* (2013.01); *H01L 29/24* (2013.01);
(Continued)

(58) Field of Classification Search
CPC ............ H01L 29/786; H01L 29/78693; H01L 29/7869; H01L 29/78696
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101630692 A 1/2010
CN 101752428 A 6/2010
(Continued)

OTHER PUBLICATIONS

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.
(Continued)

*Primary Examiner* — Matthew E Warren
(74) *Attorney, Agent, or Firm* — Robinson Intellectual Property Law Office; Eric J. Robinson

(57) ABSTRACT

Provided are a transistor which has electrical characteristics requisite for its purpose and uses an oxide semiconductor layer and a semiconductor device including the transistor. In the bottom-gate transistor in which at least a gate electrode layer, a gate insulating film, and the semiconductor layer are stacked in this order, an oxide semiconductor stacked layer including at least two oxide semiconductor layers whose energy gaps are different from each other is used as the semiconductor layer. Oxygen and/or a dopant may be added to the oxide semiconductor stacked layer.

8 Claims, 26 Drawing Sheets

Related U.S. Application Data continuation of application No. 15/645,217, filed on Jul. 10, 2017, now Pat. No. 10,043,918, which is a continuation of application No. 15/356,976, filed on Nov. 21, 2016, now abandoned, which is a continuation of application No. 14/933,392, filed on Nov. 5, 2015, now Pat. No. 9,530,897, which is a continuation of application No. 14/590,133, filed on Jan. 6, 2015, now Pat. No. 9,196,745, which is a continuation of application No. 13/527,882, filed on Jun. 20, 2012, now Pat. No. 8,952,377.

(52) U.S. Cl.
CPC ........ *H01L 29/786* (2013.01); *H01L 29/7869* (2013.01); *H01L 29/78693* (2013.01)

(58) Field of Classification Search
USPC .............................................. 257/43, 59, 72
See application file for complete search history.

(56) References Cited

U.S. PATENT DOCUMENTS

| | | |
|---|---|---|
| 6,207,969 B1 | 3/2001 | Yamazaki |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,993,964 B2 | 8/2011 | Hirao et al. |
| 7,994,500 B2 | 8/2011 | Kim et al. |
| 8,058,645 B2 | 11/2011 | Jeong et al. |
| 8,063,421 B2 | 11/2011 | Kang et al. |
| 8,148,779 B2 | 4/2012 | Jeong et al. |
| 8,178,884 B2 | 5/2012 | Ha et al. |
| 8,188,480 B2 | 5/2012 | Itai |
| 8,203,143 B2 | 6/2012 | Imai |
| 8,232,551 B2 | 7/2012 | Kim et al. |
| 8,293,595 B2 | 10/2012 | Yamazaki et al. |
| 8,299,461 B2 | 10/2012 | Tanaka et al. |
| 8,309,961 B2 | 11/2012 | Yamazaki et al. |
| 8,324,621 B2 | 12/2012 | Yamazaki et al. |
| 8,362,478 B2 | 1/2013 | Yamazaki et al. |
| 8,436,342 B2 | 5/2013 | Park et al. |
| 8,492,757 B2 | 7/2013 | Sakata et al. |
| 8,492,758 B2 | 7/2013 | Yamazaki et al. |
| 8,497,502 B2 | 7/2013 | Yaegashi |
| 8,502,221 B2 * | 8/2013 | Yamazaki ........... H01L 29/7869 257/43 |
| 8,546,164 B2 | 10/2013 | Jeong et al. |
| 8,624,245 B2 | 1/2014 | Yamazaki |
| 8,629,432 B2 | 1/2014 | Sakata et al. |
| 8,633,480 B2 | 1/2014 | Yamazaki et al. |
| 8,692,252 B2 | 4/2014 | Takata et al. |
| 8,704,216 B2 | 4/2014 | Godo et al. |
| 8,748,881 B2 | 6/2014 | Yamazaki |
| 8,779,420 B2 | 7/2014 | Yamazaki |
| 8,779,426 B2 | 7/2014 | Heo et al. |
| 8,841,710 B2 | 9/2014 | Yamazaki et al. |
| 8,853,690 B2 | 10/2014 | Yamazaki et al. |
| 8,884,287 B2 | 11/2014 | Sakata et al. |
| 8,927,349 B2 | 1/2015 | Yamazaki |
| 9,064,899 B2 | 6/2015 | Godo et al. |
| 9,093,328 B2 | 7/2015 | Yamazaki et al. |
| 9,093,544 B2 | 7/2015 | Yamazaki et al. |
| 9,130,049 B2 | 9/2015 | Sano et al. |
| 9,190,528 B2 | 11/2015 | Yamazaki et al. |
| 9,214,520 B2 | 12/2015 | Yamazaki |
| 9,214,563 B2 | 12/2015 | Yamazaki et al. |
| 9,236,491 B2 | 1/2016 | Takata et al. |
| 9,318,617 B2 | 4/2016 | Yamazaki et al. |
| 9,324,881 B2 | 4/2016 | Yamazaki |
| 9,406,808 B2 | 8/2016 | Yamazaki et al. |
| 9,412,798 B2 | 8/2016 | Yamazaki et al. |
| 9,583,637 B2 | 2/2017 | Sano et al. |
| 9,660,102 B2 | 5/2017 | Godo et al. |
| 9,735,284 B2 | 8/2017 | Yamazaki |
| 9,853,066 B2 | 12/2017 | Yamazaki et al. |
| 9,853,167 B2 | 12/2017 | Yamazaki et al. |
| 9,859,441 B2 | 1/2018 | Yamazaki et al. |
| 9,997,638 B2 | 6/2018 | Godo et al. |
| 10,014,415 B2 | 7/2018 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |

(56) References Cited

U.S. PATENT DOCUMENTS

| | | |
|---|---|---|
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127551 A1 | 5/2009 | Imai |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0218572 A1 | 9/2009 | Dairiki et al. |
| 2009/0236596 A1 | 9/2009 | Itai |
| 2009/0250693 A1 | 10/2009 | Jeong et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2010/0006833 A1 | 1/2010 | Ha et al. |
| 2010/0038641 A1 | 2/2010 | Imai |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0117999 A1 | 5/2010 | Matsunaga et al. |
| 2010/0148170 A1 | 6/2010 | Ueda et al. |
| 2010/0163866 A1 | 7/2010 | Akimoto et al. |
| 2010/0163868 A1 | 7/2010 | Yamazaki et al. |
| 2011/0024751 A1 | 2/2011 | Yamazaki et al. |
| 2011/0062436 A1 | 3/2011 | Yamazaki et al. |
| 2011/0068335 A1 | 3/2011 | Yamazaki et al. |
| 2011/0084264 A1 | 4/2011 | Yamazaki et al. |
| 2011/0109351 A1 | 5/2011 | Yamazaki et al. |
| 2011/0114943 A1 | 5/2011 | Yamazaki et al. |
| 2011/0127521 A1* | 6/2011 | Yamazaki ......... H01L 29/78696 257/43 |
| 2011/0127522 A1 | 6/2011 | Yamazaki |
| 2011/0127523 A1 | 6/2011 | Yamazaki |
| 2011/0127579 A1* | 6/2011 | Yamazaki ......... H01L 29/7869 257/192 |
| 2011/0133180 A1 | 6/2011 | Yamazaki |
| 2011/0140100 A1 | 6/2011 | Takata et al. |
| 2011/0156026 A1* | 6/2011 | Yamazaki ......... H01L 21/02422 257/43 |
| 2011/0175082 A1* | 7/2011 | Kim ............... H01L 27/1225 257/43 |
| 2011/0193083 A1 | 8/2011 | Kim et al. |
| 2011/0212605 A1* | 9/2011 | Yamazaki ......... H01L 29/78606 438/482 |
| 2012/0033152 A1 | 2/2012 | Ha et al. |
| 2012/0119205 A1 | 5/2012 | Taniguchi et al. |
| 2012/0126223 A1* | 5/2012 | Maeng ............. H01L 29/7869 257/43 |
| 2012/0153278 A1 | 6/2012 | Jeong et al. |
| 2012/0220077 A1 | 8/2012 | Ha et al. |
| 2012/0256179 A1 | 10/2012 | Yamazaki et al. |
| 2012/0280227 A1 | 11/2012 | Wakana et al. |
| 2012/0305912 A1 | 12/2012 | Koyama et al. |
| 2012/0319102 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009220 A1 | 1/2013 | Yamazaki et al. |
| 2014/0193946 A1 | 7/2014 | Yamazaki et al. |
| 2015/0333089 A1 | 11/2015 | Yamazaki et al. |
| 2016/0336456 A1 | 11/2016 | Yamazaki et al. |
| 2017/0250201 A1 | 8/2017 | Yamazaki et al. |
| 2018/0122958 A1 | 5/2018 | Yamazaki et al. |
| 2018/0308982 A1 | 10/2018 | Yamazaki |

FOREIGN PATENT DOCUMENTS

| | | |
|---|---|---|
| CN | 102648526 A | 8/2012 |
| EP | 1737044 A | 12/2006 |
| EP | 2105967 A | 9/2009 |
| EP | 2141743 A | 1/2010 |
| EP | 2144294 A | 1/2010 |
| EP | 2146379 A | 1/2010 |
| EP | 2197034 A | 6/2010 |
| EP | 2207206 A | 7/2010 |
| EP | 2226847 A | 9/2010 |
| EP | 2423966 A | 2/2012 |
| EP | 2544237 A | 1/2013 |
| GB | 2153589 | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2007-096055 A | 4/2007 |
| JP | 2007-150158 A | 6/2007 |
| JP | 2007-220816 A | 8/2007 |
| JP | 2008-140984 A | 6/2008 |
| JP | 2008-276212 A | 11/2008 |
| JP | 2009-231613 A | 10/2009 |
| JP | 2010-016347 A | 1/2010 |
| JP | 2010-016348 A | 1/2010 |
| JP | 2010-021333 A | 1/2010 |
| JP | 2010-021520 A | 1/2010 |
| JP | 2010-021555 A | 1/2010 |
| JP | 2010-034534 A | 2/2010 |
| JP | 2010-040552 A | 2/2010 |
| JP | 2010-056546 A | 3/2010 |
| JP | 2010-067954 A | 3/2010 |
| JP | 2010-073881 A | 4/2010 |
| JP | 2010-161327 A | 7/2010 |
| JP | 2010-186860 A | 8/2010 |
| JP | 2010-186994 A | 8/2010 |
| JP | 2010-199307 A | 9/2010 |
| JP | 2010-267955 A | 11/2010 |
| JP | 2010-287735 A | 12/2010 |
| JP | 2011-077450 A | 4/2011 |
| JP | 2011-086923 A | 4/2011 |
| JP | 2011-091375 A | 5/2011 |
| JP | 2011-100997 A | 5/2011 |
| JP | 2011-103452 A | 5/2011 |
| JP | 2011-119714 A | 6/2011 |
| JP | 2011-119718 A | 6/2011 |
| JP | 2011-124360 A | 6/2011 |
| JP | 2011-135063 A | 7/2011 |
| JP | 2011-138934 A | 7/2011 |
| JP | 2011-243745 A | 12/2011 |
| JP | 2012-059860 A | 3/2012 |
| JP | 2012-160679 A | 8/2012 |
| JP | 2012-191131 A | 10/2012 |
| KR | 10-0787455 | 12/2007 |
| KR | 2008-0066678 A | 7/2008 |

(56) References Cited

FOREIGN PATENT DOCUMENTS

| | | |
|---|---|---|
| KR | 2008-0079906 A | 9/2008 |
| KR | 2009-0101828 A | 9/2009 |
| KR | 2009-0105558 A | 10/2009 |
| KR | 2010-0098306 A | 9/2010 |
| KR | 2011-0078596 A | 7/2011 |
| WO | WO-2004/114391 | 12/2004 |
| WO | WO-2007/142167 | 12/2007 |
| WO | WO-2008/126884 | 10/2008 |
| WO | WO-2009/028453 | 3/2009 |
| WO | WO-2009/034953 | 3/2009 |
| WO | WO-2009/072532 | 6/2009 |
| WO | WO-2010/093051 | 8/2010 |
| WO | WO-2011/033936 | 3/2011 |
| WO | WO-2011/036999 | 3/2011 |
| WO | WO-2011/043203 | 4/2011 |
| WO | WO-2011/046003 | 4/2011 |
| WO | WO-2011/055620 | 5/2011 |
| WO | WO-2011/055631 | 5/2011 |
| WO | WO-2011/065243 | 6/2011 |
| WO | WO-2011/065329 | 6/2011 |
| WO | WO-2011/068066 | 6/2011 |

OTHER PUBLICATIONS

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemisry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase" Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Appied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Chinese Office Action (Application No. 201210235123.4) dated Jan. 29, 2016.

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Jeon.S et al., "Low-Frequency Noise Performance of a Bilayer InZnO_InGaZnO Thin-Film Transistor for Analog Device Applications", IEEE Electron Device Letters, Oct. 1, 2010, vol. 31, No. 10, pp. 1128-1130.

Ghaffarzadeh.K et al., "Light-Bias Induced Instability and Persistent Photoconductivity in In—Zn—O/Ga—In—Zn—O Thin Film

(56) References Cited

OTHER PUBLICATIONS

Transistors", SID Digest '11 : SID International Symposium Digest of Technical Papers, Jun. 1, 2011, vol. 42, No. 1, pp. 1154-1157.
Korean Office Action (Application No. 2012-0073339) dated Aug. 29, 2018.
Chinese Office Action (Application No. 201611205405.4) dated Nov. 26, 2019.

* cited by examiner

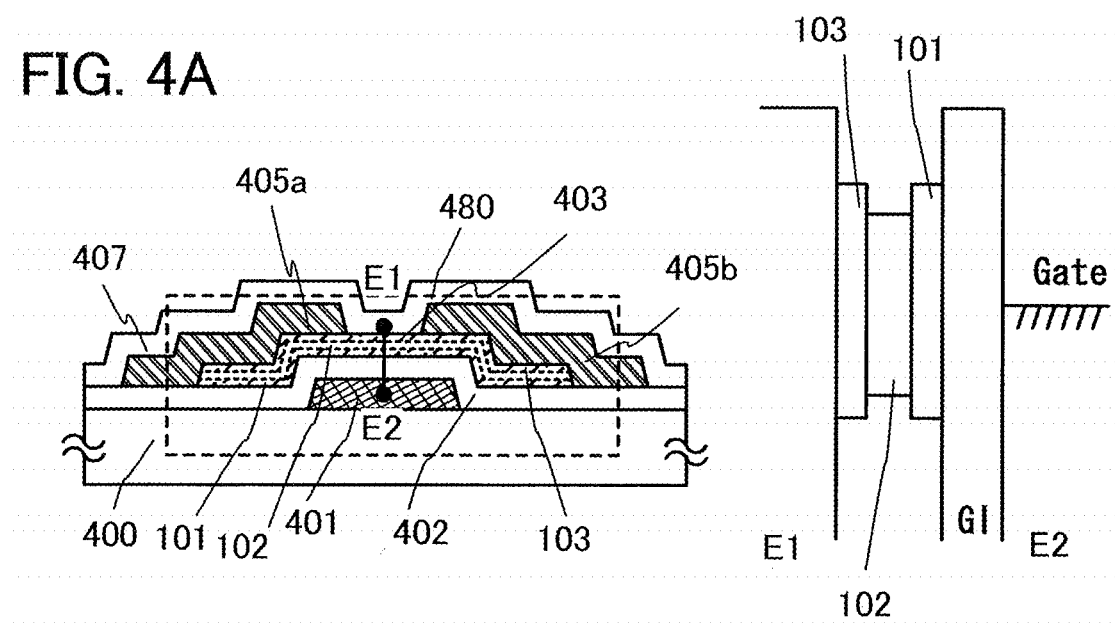
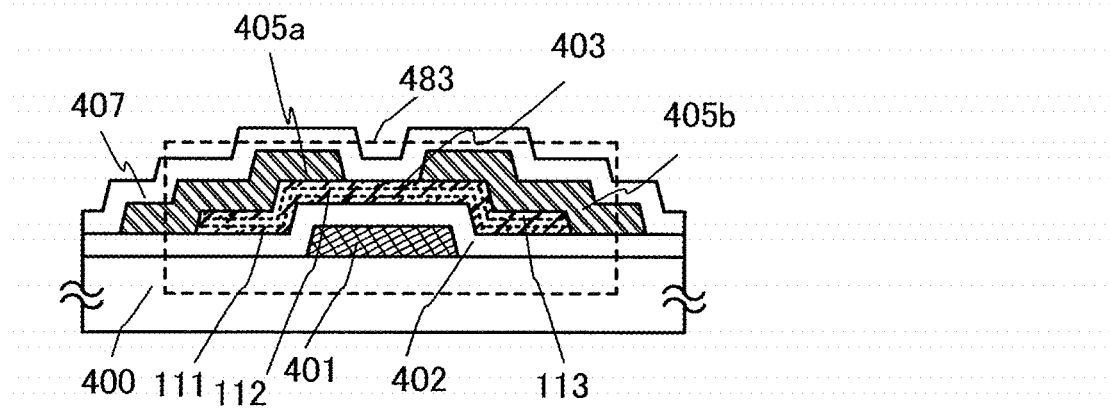

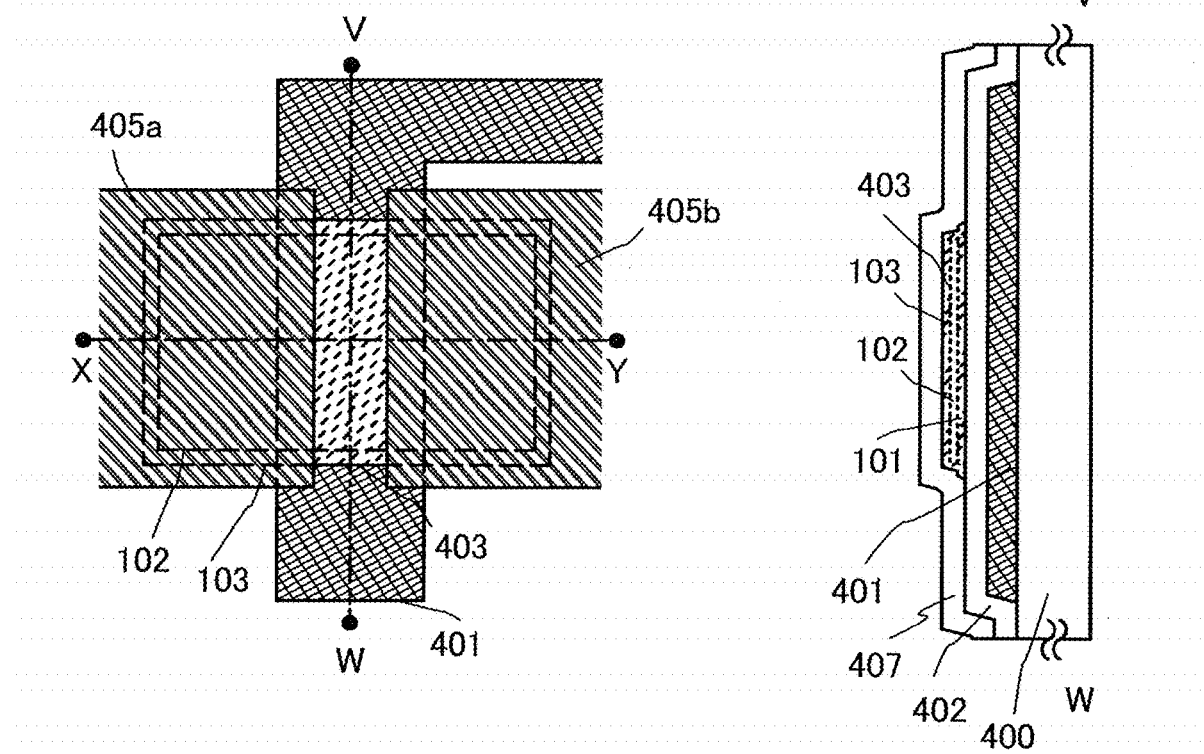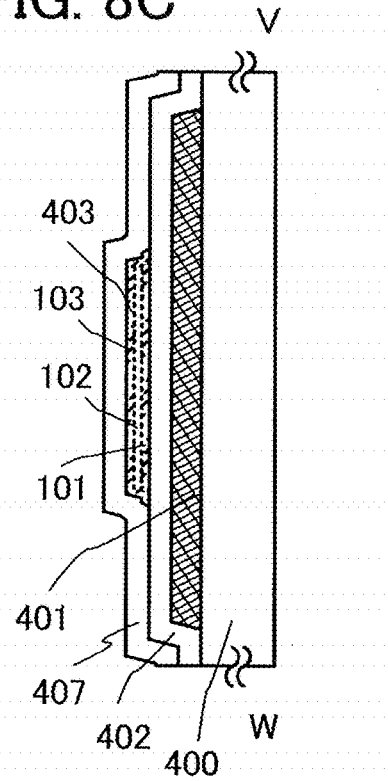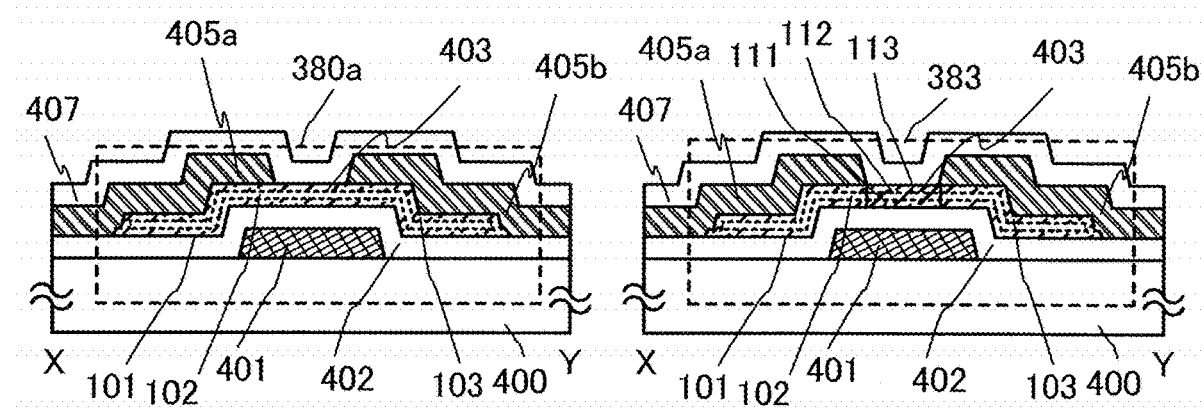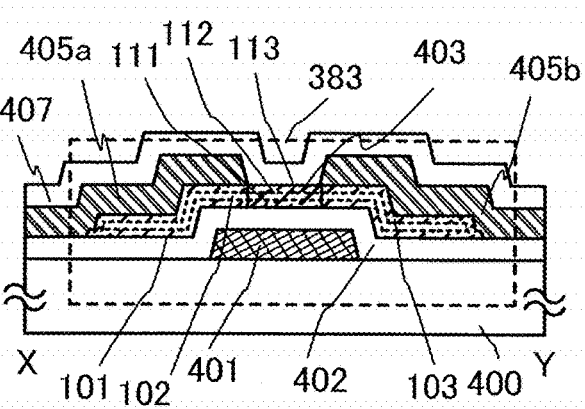

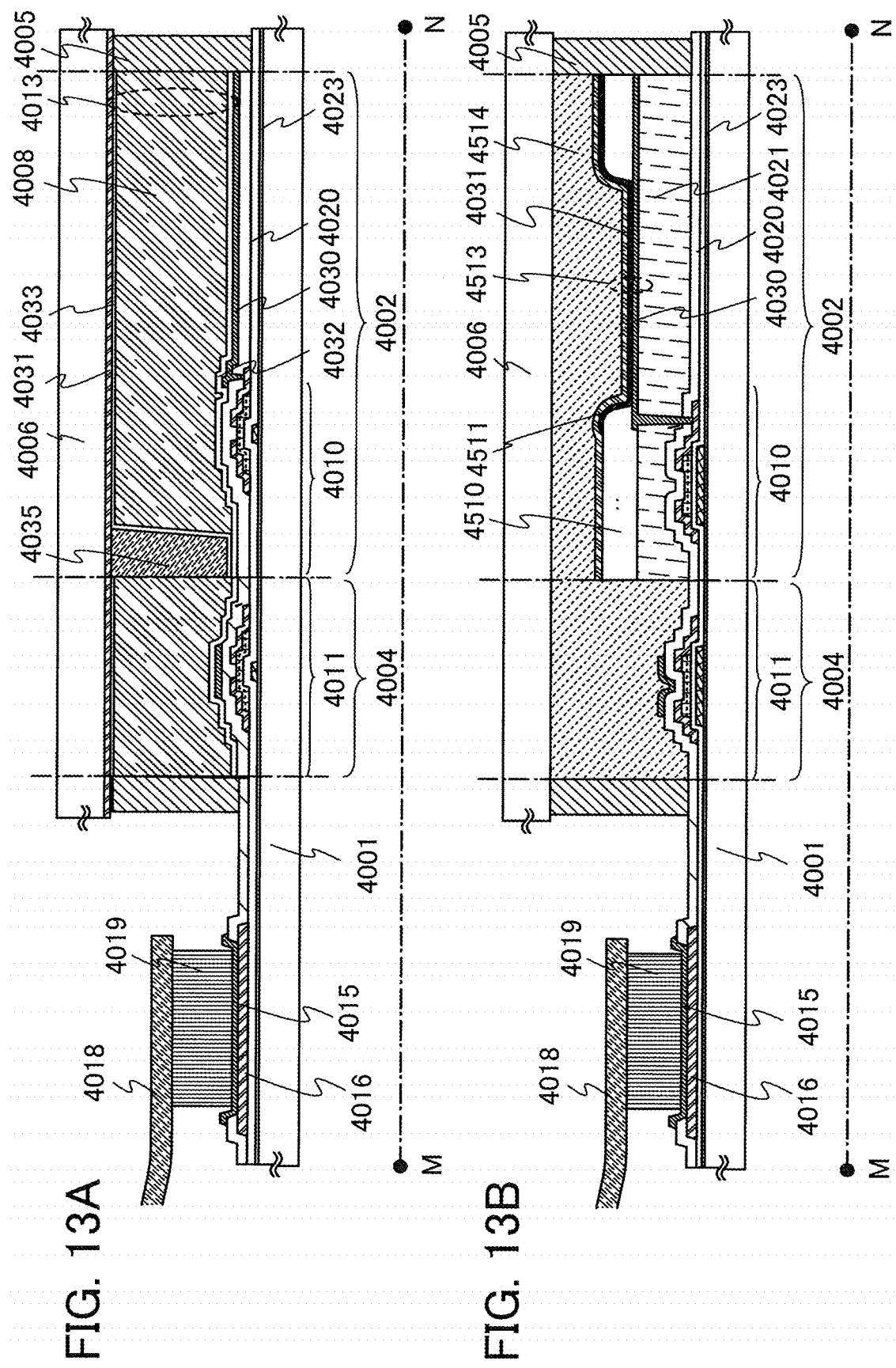

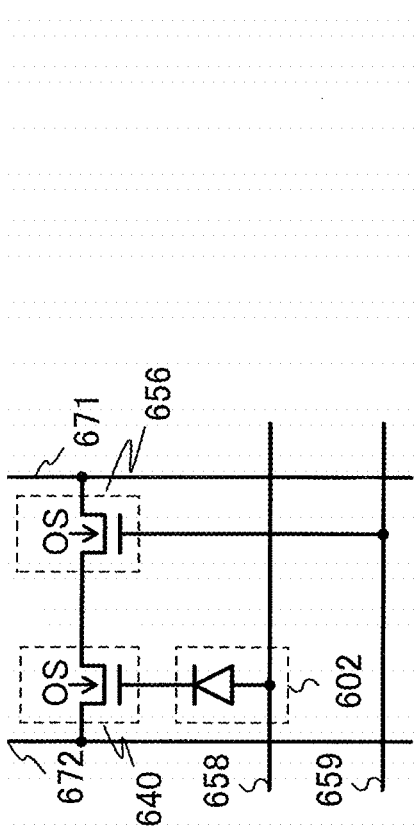

SEMICONDUCTOR DEVICE AND MANUFACTURING METHOD THEREOF

BACKGROUND OF THE INVENTION

1. Field of the Invention

The present invention relates to a semiconductor device and a method for manufacturing the semiconductor device.

In this specification, the semiconductor device generally means any device which can function by utilizing semiconductor characteristics, and an electrooptic device, a semiconductor circuit, and electronic equipment are all included in the category of the semiconductor device.

2. Description of the Related Art

Attention has been focused on a technique for forming a transistor with use of a semiconductor thin film formed over a substrate having an insulating surface (the transistor also referred to as a thin film transistor (TFT)). The transistor has been applied to a wide range of electronic devices such as an integrated circuit (IC) or an image display device (display device). A silicon semiconductor material is widely known as a material for a semiconductor thin film applicable to a transistor. As another material, an oxide semiconductor has attracted attention.

For example, a transistor whose active layer includes an amorphous oxide containing indium (In), gallium (Ga), and zinc (Zn) is disclosed (see Patent Document 1).

REFERENCE

Patent Document 1: Japanese Published Patent Application No. 2006-165528

SUMMARY OF THE INVENTION

An improvement in the on-state characteristics (e.g., on-state current and field-effect mobility) of a transistor leads to high-speed response to an input signal and high-speed operation of a semiconductor device; thus, a semiconductor device with higher performance can be achieved. Meanwhile it is necessary that the off-state current of the transistor be sufficiently small for low power consumption of the semiconductor device. As described above, the electrical characteristics requisite for a transistor vary depending on its purpose or object, and it is useful to adjust the electrical characteristics with high accuracy.

It is one object of one embodiment of the present invention to provide a transistor structure and a manufacturing method thereof, in which the threshold voltage, which is one of electrical characteristics, of a transistor using an oxide semiconductor for its channel formation region can take a positive value, providing a switching element of so-called normally-off type.

It is preferable that a channel be formed at a threshold voltage at which the gate voltage is a positive threshold voltage as close to 0 V as possible in a transistor. If the threshold voltage of the transistor is negative, the transistor tends to be so-called normally-on type, in which current flows between the source electrode and the drain electrode even at a gate voltage of 0 V. Electrical characteristics of a transistor included in a circuit are important in an LSI, a CPU, or a memory, and govern power consumption of a semiconductor device. In particular, of the electrical properties of the transistor, the threshold voltage ($V_{th}$) is important. If the threshold voltage value is negative even while the field-effect mobility is high, it is difficult to control the circuit. Such a transistor in which a channel is formed even at a negative voltage so that a drain current flows is not suitable as a transistor used in an integrated circuit of a semiconductor device.

Further, it is important that the characteristics of a transistor be close to the normally-off characteristics even when the transistor is not a normally-off transistor depending on its material or manufacturing condition. It is an object of one embodiment of the present invention to provide a structure and a manufacturing method thereof, in which the threshold voltage of a transistor is close to zero even when the threshold voltage is negative, that is, even when the transistor is a so-called normally-on transistor.

Further, it is an object of one embodiment of the present invention to provide a structure and a manufacturing method thereof, in which on-state characteristics (e.g., on-state current and field-effect mobility) of a transistor are increased, leading to high-speed response and high-speed operation of a semiconductor device for a higher performance semiconductor device.

It is an object of one embodiment of the present invention to provide a transistor which has electrical characteristics requisite for its purpose and uses an oxide semiconductor layer, and to provide a semiconductor device including the transistor.

It is an object of one embodiment of the present invention to achieve at least one of the above-described objects.

In a bottom-gate transistor in which at least a gate electrode layer, a gate insulating film, and a semiconductor layer are stacked in this order, an oxide semiconductor stacked layer including at least two oxide semiconductor layers whose energy gaps are different from each other is used as the semiconductor layer.

The oxide semiconductor stacked layer may have a stacked structure consisting of a first oxide semiconductor layer and a second oxide semiconductor layer, in the case of which the stack order of them is not limited as long as their energy gaps are different from each other: either one whose energy gap is larger or the other whose energy gap is smaller is provided as the oxide semiconductor layer which is in contact with the gate insulating film.

Specifically, the energy gap of one oxide semiconductor layer in the oxide semiconductor stacked layer is larger than or equal to 3 eV and that of the other oxide semiconductor layer is smaller than 3 eV. The term "energy gap" is synonymous with "band gap" or "forbidden band width" in this specification.

The oxide semiconductor stacked layer may have a stacked structure consisting of three or more oxide semiconductor layers, in the case of which either the energy gaps of all the oxide semiconductor layers are different from each other, or the energy gaps of a plurality of oxide semiconductor layers among the three or more oxide semiconductor layers are substantially the same as each other.

For example, the oxide semiconductor stacked layer has a stacked structure consisting of a first oxide semiconductor layer, a second oxide semiconductor layer, and a third oxide semiconductor layer, in which the energy gap of the second oxide semiconductor layer is smaller than those of the first oxide semiconductor layer and the third oxide semiconductor layer, or the electron affinity of the second oxide semiconductor layer is larger than those of the first oxide semiconductor layer and the third oxide semiconductor layer. In that case, the energy gap and the electron affinity can be equal to each other between the first oxide semiconductor layer and the third oxide semiconductor layer. The stacked structure in which the second oxide semiconductor layer whose energy gap is smaller is sandwiched by the first oxide semiconductor layer and the third oxide semiconductor layer whose energy gaps are larger enables the off-state current (leakage current) of the transistor to be reduced. The electron affinity means an energy difference between the vacuum level and the conduction band of the oxide semiconductor.

Electrical properties of a transistor using an oxide semiconductor layer are affected by the energy gap of the oxide semiconductor layer. For example, the on-state characteristics (e.g., on-state current and field-effect mobility) of the transistor using an oxide semiconductor layer can increase as the energy gap of the oxide semiconductor layer gets smaller, whereas the off-state current of the transistor can decrease as the energy gap of the oxide semiconductor layer gets larger.

It is difficult to provide a transistor with appropriate electrical characteristics by a single oxide semiconductor layer because the electrical characteristics of the transistor are mostly determined by the energy gap of the oxide semiconductor layer.

By using the oxide semiconductor stacked layer using a plurality of oxide semiconductor layers having different energy gaps, the electrical characteristics of the transistor can be adjusted with higher accuracy, providing the transistor with appropriate electrical characteristics.

Accordingly, semiconductor devices for a variety of purposes such as high functionality, high reliability, and low power consumption can be provided.

One embodiment of the present invention disclosed in this specification is a semiconductor device including a gate insulating film over a gate electrode layer, an oxide semiconductor stacked layer including a first oxide semiconductor layer and a second oxide semiconductor layer whose energy gaps are different from each other over the gate insulating film to overlap with the gate electrode layer, and a source and drain electrode layers over the oxide semiconductor stacked layer.

One embodiment of the present invention disclosed in this specification is a semiconductor device including a gate insulating film over a gate electrode layer, an oxide semiconductor stacked layer including a first oxide semiconductor layer, a second oxide semiconductor layer, and a third oxide semiconductor layer, which are stacked in this order, over the gate insulating film to overlap with the gate electrode layer, and a source and drain electrode layers over the oxide semiconductor stacked layer. The energy gap of the second oxide semiconductor layer is smaller than those of the first oxide semiconductor layer and the third oxide semiconductor layer.

One embodiment of the present invention disclosed in this specification is a semiconductor device including a gate insulating film over a gate electrode layer, a source and drain electrode layers over the gate insulating film, and an oxide semiconductor stacked layer including a first oxide semiconductor layer and a second oxide semiconductor layer whose energy gaps are different from each other over the gate insulating film and the source and drain electrode layers to overlap with the gate electrode layer.

One embodiment of the present invention disclosed in this specification is a semiconductor device including a gate insulating film over a gate electrode layer, a source and drain electrode layers over the gate insulating film, and an oxide semiconductor stacked layer including a first oxide semiconductor layer, a second oxide semiconductor layer, and a third oxide semiconductor layer, which are stacked in this order, over the gate insulating film and the source and drain electrode layers to overlap with the gate electrode layer. The energy gap of the second oxide semiconductor layer is smaller than those of the first oxide semiconductor layer and the third oxide semiconductor layer.

In the oxide semiconductor stacked layer, the upper oxide semiconductor layer may cover a top and side surfaces of the lower oxide semiconductor layer. For example, in the above-described structure, the second oxide semiconductor layer may cover a top and side surfaces of the first oxide semiconductor layer, and/or the third oxide semiconductor layer may cover a top surface of the second oxide semiconductor layer and a side surface of the second oxide semiconductor layer (or respective side surfaces of the first oxide semiconductor layer and the second oxide semiconductor layer).

In the oxide semiconductor stacked layer, the concentration of oxygen in a region which overlaps with neither the source electrode layer nor the drain electrode layer may be higher than that in a region which overlaps with either the source electrode layer or the drain electrode layer.

In the oxide semiconductor stacked layer, a region which does not overlap with the gate electrode layer may include a dopant to form a low-resistance region.

One embodiment of the present invention disclosed in this specification is a method for manufacturing a semiconductor device, in which a gate insulating film is formed over a gate electrode layer, an oxide semiconductor stacked layer including a first oxide semiconductor layer and a second oxide semiconductor layer whose energy gaps are different from each other is formed over the gate insulating film to overlap with the gate electrode layer, and a source and drain electrode layers is formed over the oxide semiconductor stacked layer.

One embodiment of the present invention disclosed in this specification is a method for manufacturing a semiconductor device, in which a gate insulating film is formed over a gate electrode layer, an oxide semiconductor stacked layer is formed by forming a first oxide semiconductor layer over the gate insulating film to overlap with the gate electrode layer, forming a second oxide semiconductor layer whose energy gap is smaller than that of the first oxide semiconductor layer over the first oxide semiconductor layer, and forming a third oxide semiconductor layer whose energy gap is larger than that of the second oxide semiconductor layer, and a source and drain electrode layers is formed over the oxide semiconductor stacked layer.

One embodiment of the present invention disclosed in this specification is a method for manufacturing a semiconductor device, in which a gate insulating film is formed over a gate electrode layer, a source and drain electrode layers is formed over the gate insulating film, and an oxide semiconductor stacked layer including a first oxide semiconductor layer and a second oxide semiconductor layer whose energy gaps are different from each other is formed over the gate insulating film and the source and drain electrode layers to overlap with the gate electrode layer.

One embodiment of the present invention disclosed in this specification is a method for manufacturing a semiconductor device, in which a gate insulating film is formed over a gate electrode layer, a source and drain electrode layers is formed over the gate insulating film, and an oxide semiconductor stacked layer is formed by forming a first oxide semiconductor layer over the gate insulating film and the source and drain electrode layers to overlap with the gate electrode layer, forming a second oxide semiconductor layer whose energy gap is smaller than that of the first oxide semiconductor layer over the first oxide semiconductor layer, and forming a third oxide semiconductor layer whose energy gap is larger than that of the second oxide semiconductor layer.

A dopant may be selectively added to the oxide semiconductor stacked layer to form low-resistance regions whose resistances are lower than that of a channel formation region and which include the dopant, with the channel formation region provided therebetween in the oxide semiconductor stacked layer. The dopant is an impurity by which the electrical conductivity of the oxide semiconductor stacked layer is changed. As the method for addition of the dopant, an ion implantation method, an ion doping method, a plasma immersion ion implantation method, or the like can be used.

With the oxide semiconductor stacked layer including the low-resistance regions between which the channel formation region is provided in the channel length direction, on-state characteristics (e.g., on-state current and field-effect mobility) of the transistor are increased, which enables high-speed operation and high-speed response.

Further, heat treatment (dehydration or dehydrogenation treatment) by which hydrogen or water is eliminated may be performed on the oxide semiconductor layer. The dehydration or dehydrogenation treatment can serve as heat treatment for forming a mixed region. Further, in the case where a crystalline oxide semiconductor layer is used as the oxide semiconductor layer, the heat treatment for forming a mixed region can serve as heat treatment for crystallization.

The dehydration or dehydrogenation treatment may accompany elimination of oxygen which is a main constituent material of an oxide semiconductor to lead to a reduction in oxygen. An oxygen vacancy exists in a portion where oxygen is eliminated in an oxide semiconductor film, which gives rise to a donor level which causes a change in the electrical characteristics of a transistor.

Thus, oxygen is preferably supplied to the oxide semiconductor layer after being subjected to the dehydration or dehydrogenation treatment. By supply of oxygen to the oxide semiconductor layer, oxygen vacancies in the film can be repaired.

For example, an oxide insulating film including much (excessive) oxygen, which serves as a supply source of oxygen, may be provided so as to be in contact with the oxide semiconductor layer, whereby oxygen can be supplied from the oxide insulating film to the oxide semiconductor layer. In the above structure, heat treatment may be performed in the state where the oxide semiconductor layer after being subjected to the heat treatment and the oxide insulating film are at least partly in contact with each other to supply oxygen to the oxide semiconductor layer.

Further or alternatively, oxygen (which includes at least one of an oxygen radical, an oxygen atom, and an oxygen ion) may be added to the oxide semiconductor layer after being subjected to the dehydration or dehydrogenation treatment to supply oxygen to the oxide semiconductor layer. As the method for addition of oxygen, an ion implantation method, an ion doping method, a plasma immersion ion implantation method, plasma treatment, or the like can be used.

Further, it is preferable that the oxide semiconductor layer in the transistor include a region where the oxygen content is higher than that in the stoichiometric composition ratio of the oxide semiconductor in a crystalline state. In that case, the oxygen content is higher than that in the stoichiometric composition ratio of the oxide semiconductor. Alternatively, the oxygen content is higher than that of the oxide semiconductor in a single crystal state. In some cases, oxygen exists between lattices of the oxide semiconductor.

By removing hydrogen or water from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. Accordingly, the Fermi level (Ef) of the oxide semiconductor can be changed to the same level as the intrinsic Fermi level (Ei). Thus, by using the oxide semiconductor layer for a transistor, variation in the threshold voltage $V_{th}$ of the transistor and a shift of the threshold voltage $\Delta V_{th}$ due to an oxygen vacancy can be reduced.

One embodiment of the present invention relates to a semiconductor device including a transistor or a semiconductor device including a circuit including a transistor. For example, one embodiment of the present invention relates to a semiconductor device including a transistor whose channel formation region is formed of an oxide semiconductor or a semiconductor device including a circuit including the transistor. For example, one embodiment of the present invention relates to electronic equipment which includes, as a component, an LSI; a CPU; a power device mounted in a power circuit; a semiconductor integrated circuit including a memory, a thyristor, a converter, an image sensor, or the like; an electro-optical device typified by a liquid crystal display panel; or a light-emitting display device including a light-emitting element.

By using the oxide semiconductor stacked layer using a plurality of oxide semiconductor layers whose energy gaps are different from each other, the electrical characteristics of the transistor can be adjusted with higher accuracy, providing the transistor with appropriate electrical characteristics.

Accordingly, semiconductor devices for a variety of purposes such as high functionality, high reliability, and low power consumption can be provided.

BRIEF DESCRIPTION OF THE DRAWINGS

In the accompanying drawings:

FIGS. 4A to 4C illustrate one embodiment of a semiconductor device;

FIGS. 8A to 8D each illustrate one embodiment of a semiconductor device;

FIGS. 13A and 13B each illustrate one embodiment of a semiconductor device;

FIGS. 14A and 14B illustrate one embodiment of a semiconductor device;

DETAILED DESCRIPTION OF THE INVENTION

Hereinafter, embodiments of the present invention disclosed in this specification are described with reference to the accompanying drawings. The present invention disclosed in this specification is not limited to the following description, and it will be easily understood by those skilled in the art that modes and details can be variously changed without departing from the spirit and the scope of the present invention. Therefore, the present invention disclosed in this specification is not construed as being limited to the description of the following embodiments. The ordinal numbers such as "first" and "second" in this specification are used for convenience and infer neither the order of manufacturing steps nor the stack order of layers. The ordinal numbers in this specification do not constitute particular names which specify the present invention, either.

Embodiment 1

In this embodiment, an embodiment of a semiconductor device and a method for manufacturing the semiconductor device is described with reference to FIGS. 1A and 1B and FIGS. 3A to 3C. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and under a channel formation region with a gate insulating film provided therebetween.

Figure 1A:
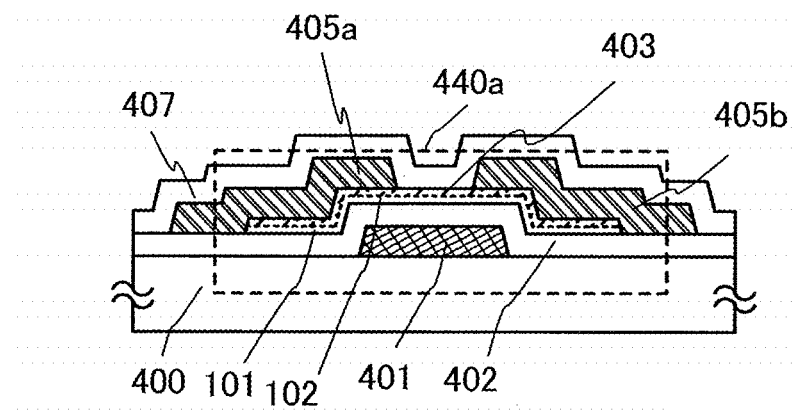
FIGS. 1A and 1B each illustrate one embodiment of a semiconductor device.
Figure 1B:
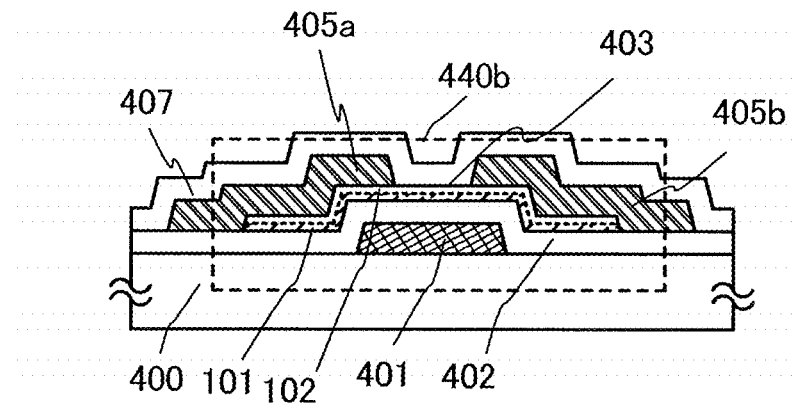

A transistor 440a shown in FIG. 1A and a transistor 440b shown in FIG. 1B are examples of an inverted staggered, bottom-gate transistor.

As shown in FIGS. 1A and 1B, each of the transistors 440a and 440b include a gate electrode layer 401, a gate insulating film 402, an oxide semiconductor stacked layer 403 including a first oxide semiconductor layer 101 and a second oxide semiconductor layer 102 whose energy gaps are different from each other, a source electrode layer 405a, and a drain electrode layer 405b, which are provided in this order over a substrate 400 having an insulating surface. An insulating film 407 is formed over each of the transistors 440a and 440b.

In FIGS. 1A and 1B, the interface between the first oxide semiconductor layer 101 and the second oxide semiconductor layer 102 is shown by a dotted line, by which the oxide semiconductor stacked layer 403 is illustrated schematically. The interface between the first oxide semiconductor layer 101 and the second oxide semiconductor layer 102 is not always clear, which depends on their materials, formation conditions, and heat treatment. In the case where the interface is not clear, a mixed region or a mixed layer of a plurality of oxide semiconductor layers may be formed. This applies to the other drawings of this specification.

Figure 3A:
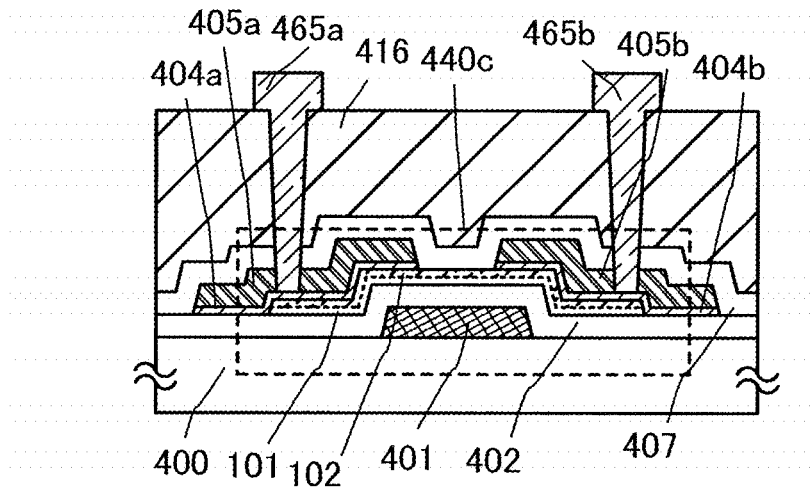
FIGS. 3A to 3C each illustrate one embodiment of a semiconductor device.
Figure 3B:
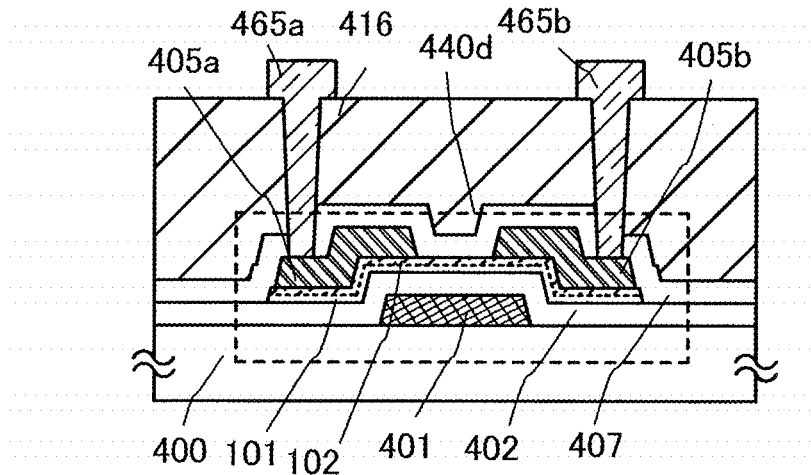
Figure 3C:
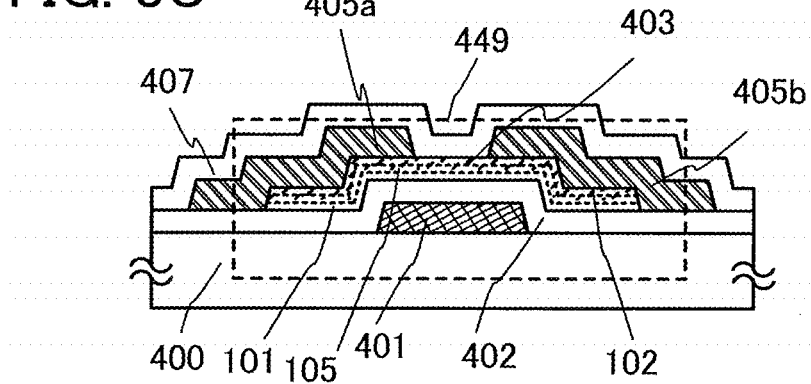

For example, a transistor 449 which includes a mixed region 105 between the first oxide semiconductor layer 101 and the second oxide semiconductor layer 102 is shown in FIG. 3C.

In the oxide semiconductor stacked layer 403 in the transistor 449, the interface between the first oxide semiconductor layer 101 and the second oxide semiconductor layer 102 is unclear, and the mixed region 105 is formed between the first oxide semiconductor layer 101 and the second oxide semiconductor layer 102. The interface which is "unclear" means, for example, an interface where a clear continuous boundary cannot be observed between the stacked oxide semiconductor layers in cross-sectional observation (TEM image) of the oxide semiconductor stack 403, with a high resolution transmission electron microscope.

The mixed region 105 is a region where elements contained in the first oxide semiconductor layer 101 and the second oxide semiconductor layer 102 that are stacked are mixed, and at least the composition of constituent elements in the mixed region 105 is different from either of respective those of constituent elements in the first oxide semiconductor layer 101 and the second oxide semiconductor layer 102. For example, when a stacked-layer structure of a first oxide semiconductor layer including indium, tin, and zinc and a second oxide semiconductor layer including indium, gallium, and zinc is used as the oxide semiconductor stack 403, the mixed region 105 formed between the first oxide semiconductor layer and the second oxide semiconductor layer contains indium, tin, gallium, and zinc. In addition, even in the case where elements contained in the first oxide semiconductor layer 101 and the second oxide semiconductor layer 102 are the same as each other, the mixed region 105 can have a different composition (composition ratio) from that of each of the first oxide semiconductor layer 101 and the second oxide semiconductor layer 102. Thus, the energy gap of the mixed region 105 is also different from that of the first oxide semiconductor layer 101 and that of the second oxide semiconductor layer 102, and the energy gap of the mixed region 105 is a value between the energy gap of the first oxide semiconductor layer 101 and the energy gap of the second oxide semiconductor layer 102.

Thus, the mixed region 105 enables a continuous bond to be formed in the energy band diagram of the oxide semiconductor stacked layer 403, suppressing scattering in the interface between the first oxide semiconductor layer 101 and the second oxide semiconductor layer 102. Since the interface scattering can be suppressed, the transistor 449 using the oxide semiconductor stacked layer 403 provided with the mixed region 105 can have higher field-effect mobility.

The mixed region 105 can form a gradient between the first oxide semiconductor layer 101 and the second oxide semiconductor layer 102 in the energy band diagram. The shape of the gradient may have a plurality of steps.

The interfaces between the first oxide semiconductor layer 101 and the mixed region 105 and between the second oxide semiconductor layer 102 and the mixed region 105 are shown by dotted lines, by which unclear (indistinct) interfaces in the oxide semiconductor stacked layer 403 are illustrated schematically.

The mixed region 105 can be formed by performing heat treatment on the oxide semiconductor stacked layer 403 including the plurality of oxide semiconductor layers. The heat treatment is performed at a temperature at which elements in the oxide semiconductor stacked layer can be dispersed by heat under such a condition that the stacked oxide semiconductor layers are not turned into a mixed region whose composition (composition ratio) is uniform entirely over the oxide semiconductor stacked layer.

The stack order of the first oxide semiconductor layer 101 and the second oxide semiconductor layer 102 in the oxide semiconductor stacked layer 403 is not limited as long as their energy gaps are different from each other.

Specifically, the energy gap of one oxide semiconductor layer in the oxide semiconductor stacked layer 403 is larger than or equal to 3 eV and that of the other oxide semiconductor layer is smaller than 3 eV.

The transistor 440a shown in FIG. 1A is an example in which the energy gap of the second oxide semiconductor layer 102 is larger than that of the first oxide semiconductor layer 101. In this embodiment, an In—Sn—Zn-based oxide film (with an energy gap of 2.6 eV to 2.9 eV, or 2.8 eV as a typical example) and an In—Ga—Zn-based oxide film (with an energy gap of 3.0 eV to 3.4 eV, or 3.2 eV as a typical example) are used as the first oxide semiconductor layer 101 and the second oxide semiconductor layer 102 in the transistor 440a, respectively.

On the other hand, the transistor 440b shown in FIG. 1B is an example in which the energy gap of the second oxide semiconductor layer 102 is smaller than that of the first oxide semiconductor layer 101. In this embodiment, an In—Ga—Zn-based oxide film (with an energy gap of 3.2 eV) and an In—Sn—Zn-based oxide film (with an energy gap of 2.8 eV) are used as the first oxide semiconductor layer 101 and the second oxide semiconductor layer 102 in the transistor 440b, respectively.

In this manner, either one whose energy gap is larger or the other whose energy gap is smaller is provided as the oxide semiconductor layer which is in contact with the gate insulating film 402, as either the first oxide semiconductor layer 101 or the second oxide semiconductor layer 102 in the oxide semiconductor stacked layer 403.

FIG. 4A illustrates a transistor 480 in which a stacked layer consisting of the first oxide semiconductor layer 101, the second oxide semiconductor layer 102, and a third oxide semiconductor layer 103 is used to form the oxide semiconductor stacked layer 403.

The transistor 480 includes the gate electrode layer 401, the gate insulating film 402, the oxide semiconductor stacked layer 403 including the first oxide semiconductor layer 101, the second oxide semiconductor layer 102, and the third oxide semiconductor layer 103, the source electrode layer 405a, and the drain electrode layer 405b, which are provided in this order over the substrate 400 having an insulating surface. The insulating film 407 is formed over the transistor 480.

Respective energy gaps of the first oxide semiconductor layer 101, the second oxide semiconductor layer 102, and the third oxide semiconductor layer 103 in the oxide semiconductor stacked layer 403 of the transistor 480 are not the same as each other but take at least two different values.

In the case where the oxide semiconductor stacked layer 403 has a stacked structure consisting of three or more oxide semiconductor layers, either respective energy gaps of all the oxide semiconductor layers are different from each other, or the energy gaps of a plurality of oxide semiconductor layers among the three or more oxide semiconductor layers are substantially the same as each other.

Figure 9A:
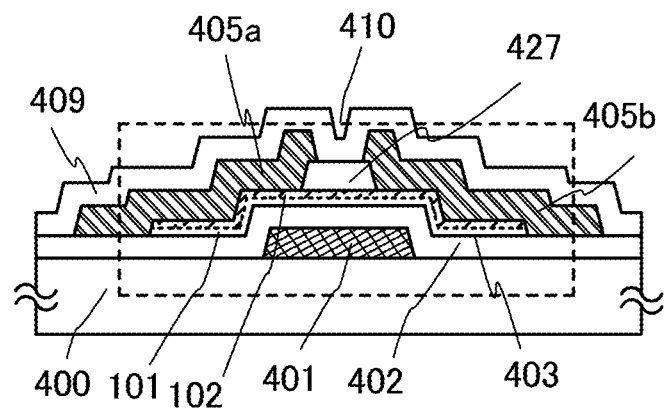
FIGS. 9A to 9C each illustrate one embodiment of a semiconductor device.

Further, a transistor 410 is shown in FIG. 9A as another embodiment of a semiconductor device. The transistor 410 is one of bottom-gate transistors referred to as a channel-protective type (also referred to as a channel-stop type) and is also referred to as an inverted staggered transistor.

As shown in FIG. 9A, the transistor 410 includes the gate electrode layer 401, the gate insulating film 402, the oxide semiconductor stacked layer 403 including the first oxide semiconductor layer 101 and the second oxide semiconductor layer 102 whose energy gaps are different from each other, an insulating film 427, the source electrode layer 405a, and the drain electrode layer 405b, which are provided in this order over the substrate 400 having an insulating surface. An insulating film 409 is formed over the transistor 410.

The insulating film 427 is provided over the oxide semiconductor stacked layer 403 to overlap with the gate electrode layer 401, and functions as a channel protective film.

The insulating film 427 may be formed using a material and a method similar to those of the insulating film 407; as a typical example, a single layer or a stacked layer using one or more of inorganic insulating films such as a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, an aluminum nitride oxide film, and an aluminum oxide film can be used.

When the insulating film 427 in contact with the oxide semiconductor stacked layer 403 (or a film in a stacked-layer structure of the insulating film 427, which is in contact with the oxide semiconductor stacked layer 403) contains much oxygen, the insulating film 427 (or the film in contact with the oxide semiconductor stacked layer 403) can favorably function as a supply source which supplies oxygen to the oxide semiconductor stacked layer 403.

The insulating film 409 may be formed using a material and a method similar to those of the insulating film 407.

Figure 10A:
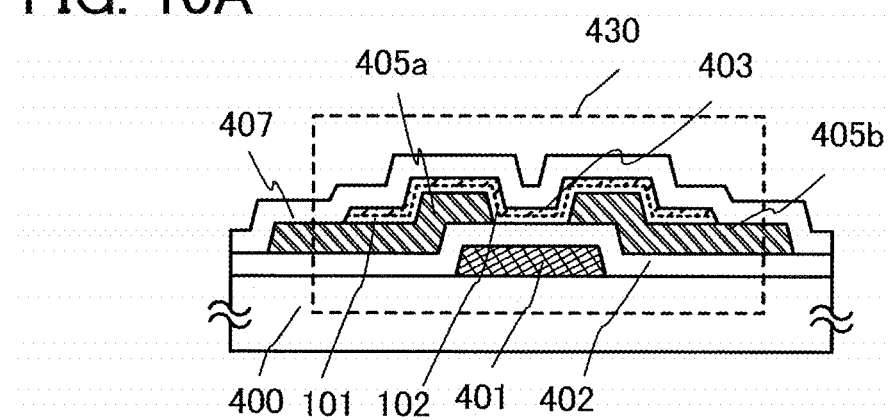
FIGS. 10A to 10C each illustrate one embodiment of a semiconductor device.

Further, a bottom-gate transistor 430 is shown in FIG. 10A as another embodiment of a semiconductor device.

As shown in FIG. 10A, the transistor 430 includes the gate electrode layer 401, the gate insulating film 402, the source electrode layer 405a, the drain electrode layer 405b, and the oxide semiconductor stacked layer 403 including the first oxide semiconductor layer 101 and the second oxide semiconductor layer 102 whose energy gaps are different from each other, which are provided in this order over the substrate 400 having an insulating surface. The insulating film 407 is formed over the transistor 430.

In the transistor 430, the oxide semiconductor stacked layer 403 including the first oxide semiconductor layer 101 and the second oxide semiconductor layer 102 whose energy gaps are different from each other is provided over the source electrode layer 405a and the drain electrode layer 405b.

It is preferable that indium (In) or zinc (Zn) be contained in an oxide semiconductor used for the oxide semiconductor stacked layer 403 (the first oxide semiconductor layer 101, the second oxide semiconductor layer 102, the third oxide semiconductor layer 103). In particular, In and Zn are preferably contained. In addition, as a stabilizer for reducing the variation in electrical characteristics of a transistor using the oxide, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, the In—Ga—Zn-based oxide means an oxide containing In, Ga, and Zn as its main components and there is no limitation on the ratio of In:Ga:Zn. The In—Ga—Zn-based oxide may further include a metal element other than In, Ga, and Zn.

Alternatively, a material represented by $InMO_3(ZnO)_m$ (m>0, in is not an integer) may be used as the oxide semiconductor. Here, M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3) or 2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), 2:1:3 (=1/3:1/6:1/2), or 2:1:5 (=1/4:1/8:5/8), or any of oxides whose composition is in the neighborhood of the above compositions can be used.

However, without limitation to the materials given above, any material with an appropriate composition may be used depending on requisite semiconductor characteristics (e.g., mobility, threshold voltage, and variation). To realize requisite semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, mobility can be increased by reducing the defect density in the bulk also with an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease; thus, interface scattering of a transistor including the amorphous oxide semiconductor can be reduced, so that relatively high mobility can be obtained with relative ease.

In an oxide semiconductor having crystallinity, defects in the bulk can be more reduced, and mobility higher than that of the amorphous oxide semiconductor can be obtained by improving the surface flatness. To improve the surface flatness, the oxide semiconductor is preferably formed on a flat surface. Specifically, the oxide semiconductor may be formed on a surface with an average surface roughness (Ra) of less than or equal to 1 nm, preferably less than or equal to 0.3 nm, further preferably less than or equal to 0.1 nm.

The average surface roughness Ra is obtained by three-dimension expansion of the center line average roughness that is defined by JIS B 0601 so as to be applied to a plane, and can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents the area of a measurement surface (a quadrangle region which is defined by four points represented by $(x_1, y_1)$, $(x_1, y_2)$, $(x_2, y_1)$, and $(x_2, y_2)$), and $Z_0$ represents the average height of the measurement surface. The average surface roughness Ra can be measured with an atomic force microscope (AFM).

As the oxide semiconductor stacked layer 403 (the first oxide semiconductor layer 101, the second oxide semiconductor layer 102, the third oxide semiconductor layer 103), an oxide semiconductor layer including a crystal and having crystallinity (crystalline oxide semiconductor layer) can be used. In the crystal state in the crystalline oxide semiconductor stacked layer, crystal axes are arranged either chaotically or with orientation.

For example, an oxide semiconductor layer including a crystal having a c-axis which is substantially perpendicular to a surface of the oxide semiconductor layer can be used as the crystalline oxide semiconductor layer.

The oxide semiconductor layer including a crystal having a c-axis which is substantially perpendicular to the surface of the oxide semiconductor layer has neither a single crystal structure nor an amorphous structure, but is a film of a crystalline oxide semiconductor with c-axis alignment (also referred to as a c-axis aligned crystalline oxide semiconductor (CAAC)).

The CAAC-OS film is neither a complete single crystal nor complete amorphous. The CAAC-OS film is an oxide semiconductor film with a crystal-amorphous mixed phase structure where crystal parts are included in an amorphous phase. In most cases, the crystal part fits inside a cube whose one side is less than 100 nm. From an observation image with a transmission electron microscope (TEM), the boundary between an amorphous part and a crystal part in the CAAC-OS film is not clear. Further, with the TEM, a grain boundary in the CAAC-OS film is not found, either. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Among crystal parts, the directions of the a-axis and the b-axis of one crystal part may be different from those of another crystal part. In this specification, the term "perpendicular" encompasses a range from 85° to 95° both inclusive. In addition, the term "parallel" encompasses a range from −5° to 5° both inclusive.

In the CAAC-OS film, distribution of crystal parts is not necessarily uniform. For example, in the formation process of the CAAC-OS film, in the case where crystal growth occurs from the top surface side of the oxide semiconductor film, the proportion of crystal parts in the vicinity of the top surface of the oxide semiconductor film is higher than that in the vicinity of the surface where the oxide semiconductor film is formed, in some cases. Further, when an impurity is added to the CAAC-OS film, the crystal part in a region to which the impurity is added is turned into amorphous in some cases.

Since the c-axes of the crystal parts included in the CAAC-OS film are aligned in the direction parallel to a normal vector of a surface where the CAAC-OS film is formed or a normal vector of a top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). The direction of c-axis of the crystal part is parallel to a normal vector of the surface where the CAAC-OS film is formed or a normal vector of the surface of the CAAC-OS film upon deposition. The crystal part is formed by deposition or by performing crystallization treatment such as heat treatment after film deposition.

With use of the CAAC-OS film in a transistor, change in electrical characteristics of the transistor due to irradiation with visible light or ultraviolet light can be reduced. Thus, the transistor has high reliability.

There are three methods for obtaining a crystalline oxide semiconductor layer having c-axis alignment. The first is a method in which an oxide semiconductor layer is deposited at a temperature(s) higher than or equal to 200° C. and lower than or equal to 500° C. such that the c-axis is substantially perpendicular to its top surface. The second is a method in which an oxide semiconductor film is deposited thin, and is subjected to heat treatment at a temperature(s) higher than or equal to 200° C. and lower than or equal to 700° C., so that the c-axis is substantially perpendicular to its top surface. The third is a method in which a first-layer oxide semiconductor film is deposited thin, and is subjected to heat treatment at a temperature(s) higher than or equal to 200° C. and lower than or equal to 700° C., and a second-layer oxide semiconductor film is deposited thereover, so that the c-axis is substantially perpendicular to its top surface.

The first oxide semiconductor layer 101, the second oxide semiconductor layer 102, and the third oxide semiconductor layer 103 have thicknesses greater than or equal to 1 nm and less than or equal to 10 nm (preferably greater than or equal to 5 nm and less than or equal to 30 nm) and can be formed by a sputtering method, a molecular beam epitaxy (MBE) method, a CVD method, a pulse laser deposition method, an atomic layer deposition (ALD) method, or the like as appropriate. The first oxide semiconductor layer 101, the second oxide semiconductor layer 102, and the third oxide semiconductor layer 103 may be formed using a sputtering apparatus which performs film formation with top surfaces of a plurality of substrates set substantially perpendicular to a top surface of a sputtering target.

Electrical properties of a transistor using an oxide semiconductor layer are affected by the energy gap of the oxide semiconductor layer. For example, the on-state properties (e.g., on-state current and field-effect mobility) of the transistor using an oxide semiconductor layer can increase as the energy gap of the oxide semiconductor layer gets small, whereas the off-state current of the transistor can decrease as the energy gap of the oxide semiconductor layer gets large.

By using the oxide semiconductor stacked layer 403 using a plurality of oxide semiconductor layers whose energy gaps are different from each other, the electrical characteristics of the transistor 440*a*, 440*b*, 480 can be adjusted with higher accuracy, providing the transistor 440*a*, 440*b*, 480 with appropriate electrical characteristics.

For example, in the oxide semiconductor stacked layer 403 of the transistor 480 shown in FIG. 4A, the energy gap of the second oxide semiconductor layer 102 is smaller than those of the first oxide semiconductor layer 101 and the third oxide semiconductor layer 103. In that case, the energy gaps of the first oxide semiconductor layer 101 and the third oxide semiconductor layer 103 can be substantially the same as each other.

An energy band diagram of FIG. 4A in the thickness direction (E1-E2 direction) is shown in FIG. 4C. It is preferable in the transistor 480 that respective materials of the first oxide semiconductor layer 101, the second oxide semiconductor layer 102, and the third oxide semiconductor layer 103 be selected so as to be compatible with the energy band diagram shown in FIG. 4C. However, a sufficient effect can be provided by forming a buried channel in the conduction band; thus, the energy band diagram is not limited to the energy band diagram having steps on its conduction band side and its valence band side as shown in FIG. 4C, and may be an energy band diagram having a step only on its conduction band side, for example.

For example, an In—Ga—Zn-based oxide film (with an energy gap of 3.2 eV), an In—Sn—Zn-based oxide film (with an energy gap of 2.8 eV), and an In—Ga—Zn-based oxide film (with an energy gap of 3.2 eV) are used as the first oxide semiconductor layer 101, the second oxide semiconductor layer 102, and the third oxide semiconductor layer 103 in the transistor 480, respectively.

Further, as the oxide semiconductor stacked layer 403 consisting of three stacked layers as in the transistor 480, a stack of an In—Ga—Zn-based oxide film serving as the first oxide semiconductor layer 101, an In—Zn-based oxide film serving as the second oxide semiconductor layer 102, and an In—Ga—Zn-based oxide film serving as the third oxide semiconductor layer 103; a stack of a Ga—Zn-based oxide film serving as the first oxide semiconductor layer 101, an In—Sn—Zn-based oxide film serving as the second oxide semiconductor layer 102, and a Ga—Zn-based oxide film serving as the third oxide semiconductor layer 103; a stack of a Ga—Zn-based oxide film serving as the first oxide semiconductor layer 101, an In—Zn-based oxide film serving as the second oxide semiconductor layer 102, and a Ga—Zn-based oxide film serving as the third oxide semiconductor layer 103; a stack of an In—Ga-based oxide film serving as the first oxide semiconductor layer 101, an In—Ga—Zn-based oxide film serving as the second oxide semiconductor layer 102, and an In—Ga-based oxide film serving as the third oxide semiconductor layer 103; or a stack of an In—Ga—Zn-based oxide film serving as the first oxide semiconductor layer 101, an indium oxide (In-based oxide) film serving as the second oxide semiconductor layer 102, and an In—Ga—Zn-based oxide film serving as the third oxide semiconductor layer 103 can be used, for example.

The stacked structure in which the second oxide semiconductor layer 102 whose energy gap is smaller is sandwiched by the first oxide semiconductor layer 101 and the third oxide semiconductor layer 103 whose energy gaps are larger enables the off-state current (leakage current) of the transistor 480 to be reduced.

FIGS. 2A to 2E illustrate an example of a method for manufacturing the transistor 440a.

First, a conductive film is formed over the substrate 400 having an insulating surface, and then, the gate electrode layer 401 is formed by a first photolithography process. A resist mask may be formed by an inkjet method. Formation of the resist mask by an inkjet method involves no photomask; thus, manufacturing cost can be reduced.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or such a substrate with a semiconductor element provided thereover can be used as the substrate 400.

The semiconductor device may be manufactured using a flexible substrate as the substrate 400. To manufacture a flexible semiconductor device, the transistor 440a including the oxide semiconductor stacked layer 403 may be directly formed over a flexible substrate; or the transistor 440a including the oxide semiconductor stacked layer 403 may be formed over a substrate, and then separated and transferred to a flexible substrate. To separate the transistor 440a from the substrate and transfer to the flexible substrate, a separation layer may be provided between the substrate and the transistor 440a including the oxide semiconductor film.

An insulating film serving as a base film may be provided between the substrate 400 and the gate electrode layer 401. The base film has a function of preventing diffusion of an impurity element from the substrate 400, and can be formed of a single-layer structure or a stacked-layer structure using one or more of a silicon nitride film, a silicon oxide film, a silicon nitride oxide film, and a silicon oxynitride film. The base film can be formed by using aluminum oxide, aluminum oxynitride, hafnium oxide, gallium oxide, or a mixed material thereof. The base film can be formed by a plasma-enhanced CVD method, a sputtering method, or the like.

The gate electrode layer 401 can be formed of a single-layer structure or a stacked-layer structure using a metal material such as molybdenum, titanium, tantalum, tungsten, aluminum, copper, neodymium, or scandium, and/or an alloy material which contains any of these materials as a main component by a plasma-enhanced CVD method, a sputtering method, or the like. Alternatively, a semiconductor film typified by a polycrystalline silicon film doped with an impurity element such as phosphorus, or a silicide film such as a nickel silicide film may be used as the gate electrode layer 401. The gate electrode layer 401 has either a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked-layer structure of the above conductive material and the above metal material.

The gate electrode layer 401 may have a stacked-layer structure one layer of which is formed using an In—Sn-based metal oxide, an In—Sn—Zn-based metal oxide, an In—Al—Zn-based metal oxide, a Sn—Ga—Zn-based metal oxide, an Al—Ga—Zn-based metal oxide, a Sn—Al—Zn-based metal oxide, an In—Zn-based metal oxide, a Sn—Zn-based metal oxide, an Al—Zn-based metal oxide, an In-based metal oxide, a Sn-based metal oxide, or a Zn-based metal oxide.

As one layer of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to take a positive value when used as the gate electrode layer, so that a switching element of co-called normally-off type can be realized.

For example, it is preferable that the gate electrode layer 401 have a stacked-layer structure and, as one layer in the stacked-layer structure, an oxynitride film containing indium, gallium, and zinc which are materials having a high work function be used. The oxynitride film containing indium, gallium, and zinc is formed in a mixed gas atmosphere containing argon and nitrogen.

For example, the gate electrode layer 401 can have a stacked-layer structure in which a copper film, a tungsten film, and an oxynitride film containing indium, gallium, and zinc are stacked in this order from the substrate 400 side or a stacked-layer structure in which a tungsten film, a tungsten nitride film, a copper film, and a titanium film are stacked in this order from the substrate 400 side.

Figure 2A:
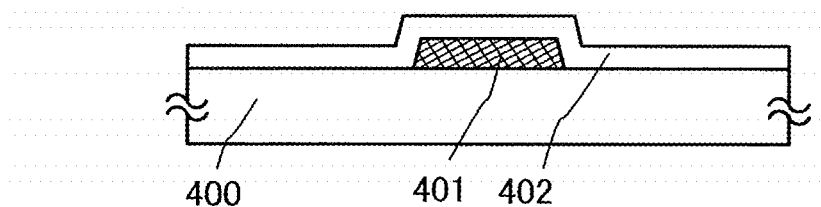
FIGS. 2A to 2E illustrate one embodiment of a semiconductor device and a manufacturing method of the semiconductor device.

Next, the gate insulating film 402 is formed over the gate electrode layer 401 (see FIG. 2A). It is preferable that the gate insulating film 402 be formed in consideration of the size of the transistor and the step coverage with the gate insulating film 402.

The gate insulating film 402 can have a thickness greater than or equal to 1 nm and less than or equal to 20 nm and can be formed by a sputtering method, an MBE method, a CVD method, a pulse laser deposition method, an ALD method, or the like as appropriate. The gate insulating film 402 may be formed using a sputtering apparatus which performs film deposition with top surfaces of a plurality of substrates set substantially perpendicular to a top surface of a sputtering target.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

The gate insulating film 402 can also be formed using a high-k material such as hafnium oxide, yttrium oxide, hafnium silicate ($HfSi_xO_y$, (x>0, y>0)), hafnium silicate to which nitrogen is added ($HfSiO_xN_y$, (x>0, y>0)), hafnium aluminate ($HfAl_xO_y$, (x>0, y>0)), or lanthanum oxide, whereby gate leakage current can be reduced.

The gate insulating film 402 has either a single-layer structure or a stacked-layer structure; however, an oxide insulating film is preferably used as the film to be in contact with the oxide semiconductor stacked layer 403. In this embodiment, a silicon oxide film is used as the gate insulating film 402.

In the case where the gate insulating film 402 has a stacked-layer structure, for example, a silicon oxide film, an In—Hf—Zn-based oxide film, and the oxide semiconductor stacked layer 403 may be sequentially stacked over the gate electrode layer 401; a silicon oxide film, an In—Zr—Zn-based oxide film having an atomic ratio of In:Zr:Zn=1:1:1, and the oxide semiconductor stacked layer 403 may be sequentially stacked over the gate electrode layer 401; or a silicon oxide film, an In—Gd—Zn-based oxide film having an atomic ratio of In:Gd:Zn=1:1:1, and the oxide semiconductor stacked layer 403 may be sequentially stacked over the gate electrode layer 401.

Figure 2B:
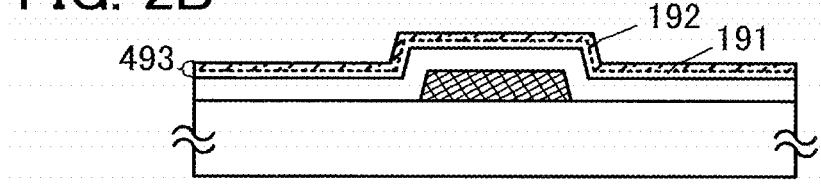

Next, a stacked layer 493 of oxide semiconductor films including a first oxide semiconductor film 191 and a second oxide semiconductor film 192 is formed over the gate insulating film 402 (see FIG. 2B).

The gate insulating film 402, which is in contact with the stacked layer 493 of the oxide semiconductor films (the oxide semiconductor stacked layer 403), preferably contains oxygen which exceeds at least the stoichiometric composition ratio in the film (the bulk). For example, in the case where a silicon oxide film is used as the gate insulating film 402, the composition formula is $SiO_{2+\alpha}$ ($\alpha$>0). With such a film as the gate insulating film 402, oxygen can be supplied to the stacked layer 493 of the oxide semiconductor films (the oxide semiconductor stacked layer 403), leading to favorable characteristics. By supply of oxygen to the stacked layer 493 of the oxide semiconductor films (the oxide semiconductor stacked layer 403), oxygen vacancies in the film can be compensated.

For example, an insulating film containing a large amount of (an excess of) oxygen, which is a supply source of oxygen, may be provided as the gate insulating film 402 so as to be in contact with the stacked layer 493 of the oxide semiconductor films (the oxide semiconductor stacked layer 403), whereby oxygen can be supplied from the gate insulating film 402 to the stacked layer 493 of the oxide semiconductor films (the oxide semiconductor stacked layer 403). Heat treatment may be performed in the state where the stacked layer 493 of the oxide semiconductor films (the oxide semiconductor stacked layer 403) and the gate insulating film 402 are at least partly in contact with each other to supply oxygen to the stacked layer 493 of the oxide semiconductor films (the oxide semiconductor stacked layer 403).

In order that hydrogen or water will be not contained in the stacked layer 493 of the oxide semiconductor films (the first oxide semiconductor film 191 and the second oxide semiconductor film 192) as much as possible in the formation step of the stacked layer 493 of the oxide semiconductor films (the first oxide semiconductor film 191 and the second oxide semiconductor film 192), it is preferable to heat the substrate provided with the gate insulating film 402 in a preheating chamber in a sputtering apparatus as a pretreatment for formation of the stacked layer 493 of the oxide semiconductor films (the first oxide semiconductor film 191 and the second oxide semiconductor film 192) so that impurities such as hydrogen and water adsorbed to the substrate and/or the gate insulating film 402 are eliminated and evacuated. As an exhaustion unit provided in the preheating chamber, a cryopump is preferable.

Planarizing treatment may be performed on the region of the gate insulating film 402 which is in contact with the stacked layer 493 of the oxide semiconductor films (the oxide semiconductor stacked layer 403). As the planarizing treatment, polishing treatment (e.g., chemical mechanical polishing (CMP)), dry-etching treatment, or plasma treatment can be used, though there is no particular limitation on the planarizing treatment.

As the plasma treatment, a reverse sputtering in which an argon gas is introduced and plasma is produced can be performed, for example. The reverse sputtering is a method in which voltage is applied to a substrate side with use of an RF power source in an argon atmosphere and plasma is generated in the vicinity of the substrate so that a substrate surface is modified. Instead of the argon atmosphere, a nitrogen atmosphere, a helium atmosphere, an oxygen atmosphere, or the like may be used. The reverse sputtering can remove particle substances (also referred to as particles or dust) attached to the top surface of the gate insulating film 402.

As the planarizing treatment, polishing treatment, dry-etching treatment, or plasma treatment may be performed plural times and/or in combination. Further, the order of process steps of such a combination is not particularly limited and may be set as appropriate in accordance with roughness of the top surface of the gate insulating film 402.

The first oxide semiconductor film 191 and the second oxide semiconductor film 192 each are preferably deposited under a condition such that much oxygen is contained (for example, by a sputtering method in an atmosphere of 100% oxygen) so as to be a film containing much oxygen (preferably having a region containing an excess of oxygen as compared to the stoichiometric composition ratio of the oxide semiconductor in a crystalline state).

As a target used for forming the first oxide semiconductor film 191 by a sputtering method in this embodiment, for example, an oxide target having a composition ratio of In:Sn:Zn=1:2:2, 2:1:3, 1:1:1, or 20:45:35 [molar ratio] is used to form an In—Sn—Zn—O film.

Further, in this embodiment, as a target used for forming the second oxide semiconductor film 192 by a sputtering method, for example, an oxide target having a composition ratio of $In_2O_3$:$Ga_2O_3$:ZnO=1:1:2 [molar ratio] is used to form an In—Ga—Zn-based oxide film. Without limitation to the materials and the composition described above, for example, a metal oxide target having a composition ratio of In$_2$O$_3$:Ga$_2$O$_3$:ZnO=1:1:1 [molar ratio] may be used.

The filling factor of the metal oxide target is greater than or equal to 90% and less than or equal to 100%, preferably greater than or equal to 95% and less than or equal to 99.9%. Such a metal oxide target with high filling factor enables deposition of a dense oxide semiconductor film.

It is preferable that a high-purity gas from which an impurity such as hydrogen, water, a hydroxyl group, or hydride is removed be used as a sputtering gas for the deposition of each of the first oxide semiconductor film 191 and the second oxide semiconductor film 192.

The substrate is held in a deposition chamber kept under reduced pressure. Then, a sputtering gas in which hydrogen and water are removed is introduced into the deposition chamber from which remaining water is being removed, so that the stacked layer 493 of the oxide semiconductor films (the first oxide semiconductor film 191 and the second oxide semiconductor film 192) is formed over the substrate 400 with the use of the target. To remove water remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water (H$_2$O), (further preferably, also a compound containing a carbon atom), and the like are removed, whereby the concentration of impurities in the stacked layer 493 of the oxide semiconductor films (the first oxide semiconductor film 191 and the second oxide semiconductor film 192) can be reduced.

The gate insulating film 402 and the stacked layer 493 of the oxide semiconductor films (the first oxide semiconductor film 191 and the second oxide semiconductor film 192) are preferably formed in succession without exposure to the air. According to successive formation of the gate insulating film 402 and the stacked layer 493 of the oxide semiconductor films (the first oxide semiconductor film 191 and the second oxide semiconductor film 192) without exposure to the air, impurities such as hydrogen and water can be prevented from being adsorbed onto a top surface of the gate insulating film 402.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Figure 2C:
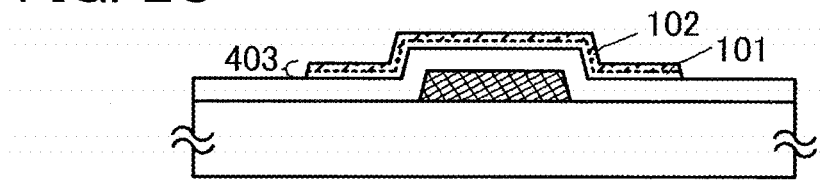

The stacked layer 493 of the oxide semiconductor films (the first oxide semiconductor film 191 and the second oxide semiconductor film 192) is processed into the island-shaped oxide semiconductor stacked layer 403 (the first oxide semiconductor layer 101 and the second oxide semiconductor layer 102) by a photolithography process (see FIG. 2C).

A resist mask used for forming the island-shaped oxide semiconductor stacked layer 403 may be formed by an inkjet method. Formation of the resist mask by an inkjet method involves no photomask; thus, manufacturing cost can be reduced.

The etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Further, ITO07N (produced by KANTO CHEMICAL CO., INC.) may be used as well.

In this embodiment, the first oxide semiconductor film 191 and the second oxide semiconductor film 192 are etched with the same mask, whereby the first oxide semiconductor layer 101 and the second oxide semiconductor layer 102 are formed such that respective edges of their side surfaces are aligned with each other. The side surfaces (edges) of the first oxide semiconductor layer 101 and the second oxide semiconductor layer 102 are exposed in the oxide semiconductor stacked layer 403.

In any embodiment of the present invention, the oxide semiconductor stacked layer is either processed or not processed into an island shape.

In the case where a contact hole(s) is/are formed in the gate insulating film 402, the step of forming the contact hole(s) can be performed in processing the first oxide semiconductor film 191 and the second oxide semiconductor film 192.

As shown in the transistor 449 shown in FIG. 3C, heat treatment may be performed on the oxide semiconductor stacked layer 403, so that the mixed region 105 may be formed between the first oxide semiconductor layer 101 and the second oxide semiconductor layer 102. The heat treatment may performed at a temperature at which the elements in the first oxide semiconductor layer 101 and the second oxide semiconductor layer 102 can be dispersed by heat under such a condition that the first oxide semiconductor layer 101 and the second oxide semiconductor layer 102 do not form a mixed region whose composition is uniform all over the entire region of the oxide semiconductor stack 403.

The heat treatment can be performed under reduced pressure, a nitrogen atmosphere, an oxygen atmosphere, the air (ultra-dry air), a rare gas atmosphere, or the like. The heat treatment may be performed plural times at different conditions (temperatures, atmospheres, times, or the like). For example, the heat treatment may be performed at 650° C. under a nitrogen atmosphere for 1 hour and then under an oxygen atmosphere for 1 hour.

The step of performing the heat treatment for forming the mixed region 105 is not particularly limited as long as it is after the formation of the first oxide semiconductor film 191 and the second oxide semiconductor film 192; it may be performed on the first oxide semiconductor film 191 and the second oxide semiconductor film 192 in their film state or on the island-shaped first oxide semiconductor layer 101 and second oxide semiconductor layer 102 as in this embodiment. In addition, the heat treatment can also serve as other heat treatment performed in the manufacturing process of the transistor, for example, heat treatment for dehydration or dehydrogenation or heat treatment for crystallization.

Further, heat treatment may be performed on the oxide semiconductor stacked layer 403 (the stacked layer 493 of the oxide semiconductor films) in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of a substrate. The heat treatment can be performed under reduced pressure, a nitrogen atmosphere, or the like. For example, the substrate is put in an electric furnace which is a kind of heat treatment apparatus, and the oxide semiconductor stacked layer 403 (the stacked layer 493 of the oxide semiconductor films) is subjected to heat treatment at 450° C. for one hour in a nitrogen atmosphere.

Further, the heat treatment apparatus is not limited to the electric furnace, and any device for heating an object by heat conduction or heat radiation from a heating element such as a resistance heating element may also be used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment with a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated to high temperature of 650° C. to 700° C., heated for several minutes, and taken out of the inert gas.

In the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or more, further preferably 7N (99.99999%) or more (that is, the impurity concentration is preferably 1 ppm or less, further preferably 0.1 ppm or less).

In addition, after the oxide semiconductor stacked layer 403 (the stacked layer 493 of the oxide semiconductor films) is heated by the heat treatment, a high-purity oxygen gas, a high-purity $N_2O$ gas, or ultra dry air (the water amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not included in the oxygen gas or the $N_2O$ gas. The purity of the oxygen gas or the $N_2O$ gas which is introduced into the heat treatment apparatus is preferably 6N or more, further preferably 7N or more (i.e., the impurity concentration in the oxygen gas or the $N_2O$ gas is preferably 1 ppm or less, further preferably 0.1 ppm or less). The oxygen gas or the $N_2O$ gas acts to supply oxygen that is a main constituent material of the oxide semiconductor and that is reduced by the step for removing an impurity for dehydration or dehydrogenation, so that the oxide semiconductor stacked layer 403 (the stacked layer 493 of the oxide semiconductor films) can be a high-purified, i-type (intrinsic) oxide semiconductor stacked layer.

The heat treatment for dehydration or dehydrogenation can be performed anytime in the manufacturing process of the transistor 440a after formation of the stacked layer 493 of the oxide semiconductor films (the first oxide semiconductor film 191 and the second oxide semiconductor film 192) before formation of the insulating film 407. For example, the heat treatment can be performed after formation of the stacked layer 493 of the oxide semiconductor films (the first oxide semiconductor film 191 and the second oxide semiconductor film 192) or after formation of the island-shaped oxide semiconductor stacked layer 403 (the first oxide semiconductor layer 101 and the second oxide semiconductor layer 102).

The heat treatment for dehydration or dehydrogenation may be performed plural times, and may also serve as another heat treatment. For example, the heat treatment may be performed twice; after formation of the first oxide semiconductor film 191 and after formation of the second oxide semiconductor film 192.

The heat treatment for dehydration or dehydrogenation is preferably performed before the oxide semiconductor stacked layer is processed into an island shape to be the oxide semiconductor stacked layer 403 (the first oxide semiconductor layer 101 and the second oxide semiconductor layer 102) while the stacked layer 493 of the oxide semiconductor films (the first oxide semiconductor film 191 and the second oxide semiconductor film 192) covers the gate insulating film 402 because oxygen included in the gate insulating film 402 can be prevented from being released by the heat treatment.

Next, a conductive film for forming a source electrode layer and a drain electrode layer (including a wiring formed of the same layer as the source electrode layer and the drain electrode layer) is formed over the gate insulating film 402 and the oxide semiconductor stacked layer 403. The conductive film is formed of a material that can withstand heat treatment performed later. As the conductive film used for the source electrode layer and the drain electrode layer, for example, a metal film containing an element selected from Al, Cr, Cu, Ta, Ti, Mo, and W, a metal nitride film containing any of the above elements as its component (a titanium nitride film, a molybdenum nitride film, or a tungsten nitride film), or the like can be used. A metal film having a high melting point made of Ti, Mo, W, or the like or a metal nitride film made of any of these elements (a titanium nitride film, a molybdenum nitride film, or a tungsten nitride film) may be stacked on one of or both of a lower side and an upper side of a metal film made of Al, Cu, or the like. Alternatively, the conductive film used for the source electrode layer and the drain electrode layer may be formed of a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

A resist mask is formed over the conductive film by a photolithography process, and is selectively etched, so that the source electrode layer 405a and the drain electrode layer 405b are formed. Then, the resist mask is removed.

Since the side surfaces (edges) of the first oxide semiconductor layer 101 and the second oxide semiconductor layer 102 are exposed in the oxide semiconductor stacked layer 403, the source electrode layer 405a and the drain electrode layer 405b are formed in contact with respective parts of the side surfaces of the first oxide semiconductor layer 101 and the second oxide semiconductor layer 102.

In order to reduce the number of photomasks used in a photolithography process and reduce the number of photolithography processes, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, one multi-tone mask enables formation of a resist mask corresponding to at least two kinds of different patterns. Thus, the number of light-exposure masks can be reduced and the number of photolithography processes can be reduced accordingly, leading to simplification of a manufacturing process.

It is desired that the etching conditions of the conductive film be optimized so as not to etch and cut the oxide semiconductor stacked layer 403. However, it is difficult to obtain etching conditions in which only the conductive film is etched and the oxide semiconductor stacked layer 403 is not etched at all; in some cases, part of the oxide semiconductor stacked layer 403 is etched off through the etching of the conductive film, so that a groove (depressed portion) is formed in the oxide semiconductor stacked layer 403.

In this embodiment, a Ti film is used as the conductive film and an In—Ga—Zn-based oxide semiconductor is used for the oxide semiconductor stacked layer 403, an ammonium hydrogen peroxide mixture (a mixture of ammonia, water, and hydrogen peroxide) is used as the etchant.

Figure 2D:
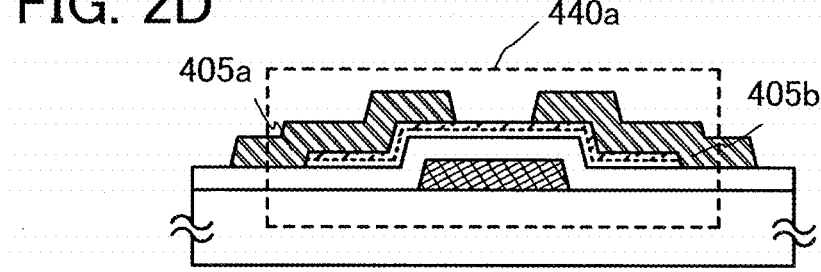

Through the above-described process, the transistor 440a of this embodiment can be manufactured (see FIG. 2D). By using the oxide semiconductor stacked layer 403 using the plurality of oxide semiconductor layers whose energy gaps are different from each other (the first oxide semiconductor layer 101 and the second oxide semiconductor layer 102), electrical characteristics of the transistor 440a, 440b can be adjusted with high accuracy, providing the transistor 440a, 440b with appropriate electrical characteristics.

Figure 2E:
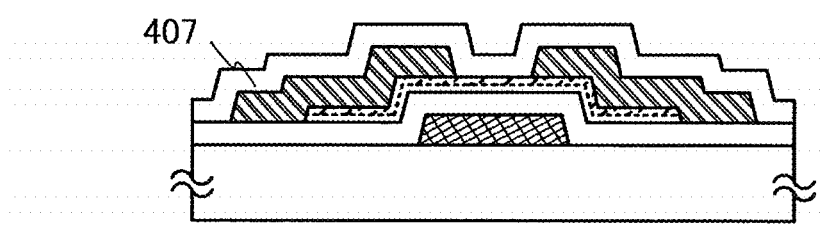

Next, the insulating film 407 is formed in contact with part of the oxide semiconductor stacked layer 403 (see FIG. 2E).

The insulating film 407 can be formed by a plasma-enhanced CVD method, a sputtering method, an evaporation method, or the like. As the insulating film 407, an inorganic insulating film such as a silicon oxide film, a silicon oxynitride film, an aluminum oxynitride film, or a gallium oxide film can be used as a typical example.

Alternatively, as the insulating film 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

The insulating film 407 has either a single-layer structure or a stacked-layer structure; for example, a stacked layer of a silicon oxide film and an aluminum oxide film can be used.

The aluminum oxide film which can be used as the insulating film 407 provided over the oxide semiconductor stacked layer 403 has a high blocking effect by which both of oxygen and impurities such as hydrogen or water is prevented from being passed through the film.

Therefore, in and after the manufacturing process, the aluminum oxide film functions as a protective film for preventing entry of an impurity such as hydrogen or water, which causes a change, into the oxide semiconductor stacked layer 403 and release of oxygen, which is a main constituent material of the oxide semiconductor, from the oxide semiconductor stacked layer 403.

The insulating film 407 is preferably formed by a method such as a sputtering method, in which an impurity such as water or hydrogen does not enter the insulating film 407. It is preferable that an insulating film in the insulating film 407 which is in contact with the oxide semiconductor stacked layer 403 include an excess of oxygen because it serves as a supply source of oxygen to the oxide semiconductor stacked layer 403.

In this embodiment, a silicon oxide film with a thickness of 100 nm is formed as the insulating film 407 by a sputtering method. The silicon oxide film can be formed by a sputtering method under a rare gas (a typical example thereof is argon) atmosphere, an oxygen atmosphere, or a mixed atmosphere of a rare gas and oxygen.

Alternatively, in the case where the insulating film 407 has a stacked-layer structure, for example, an In—Hf—Zn-based oxide film and a silicon oxide film may be stacked in this order over the oxide semiconductor stacked layer 403; an In—Zr—Zn-based oxide film whose atomic ratio is In:Zr:Zn=1:1:1 and a silicon oxide film may be stacked in this order over the oxide semiconductor stacked layer 403; or an In—Gd—Zn-based oxide film whose atomic ratio is In:Gd:Zn=1:1:1 and a silicon oxide film may be stacked in this order over the oxide semiconductor stacked layer 403.

Similarly to the formation of the oxide semiconductor film, to remove residual water from the deposition chamber for the insulating film 407, an entrapment vacuum pump (such as a cryopump) is preferably used. By depositing the insulating film 407 in the deposition chamber evacuated using a cryopump, the impurity concentration of the insulating film 407 can be reduced. As the evacuation unit for removing water remaining in the deposition chamber for the insulating film 407, a turbo molecular pump provided with a cold trap may be used as well.

A high-purity gas from which impurities such as hydrogen, water, a hydroxyl group, and hydride are removed is preferably used as a sputtering gas for the formation of the insulating film 407.

Further, as shown in FIGS. 3A and 3B, a planarization insulating film 416 may be formed over a transistor 440c, 440d in order to reduce surface roughness due to the transistor. As the planarization insulating film 416, an organic material such as polyimide, an acrylic resin, or a benzocyclobutene-based resin can be used. Other than such organic materials, it is also possible to use a low-dielectric constant material (a low-k material) or the like. The planarization insulating film 416 may be formed by stacking a plurality of insulating films formed using these materials.

Further, respective openings reaching the source electrode layer 405a and the drain electrode layer 405b may be formed in the insulating film 407 and the planarization insulating film 416, and a wiring layer electrically connected to the source electrode layer 405a and/or the drain electrode layer 405b may be formed in the opening(s). The wiring layer enables connection to another transistor, whereby a variety of circuits can be configured.

Parts of the source electrode layer 405a and the drain electrode layer 405b may be over-etched at the etching step for forming the openings reaching the source electrode layer 405a and the drain electrode layer 405b. The source electrode layer 405a and the drain electrode layer 405b may have a stacked-layer structure in which a conductive film also functioning as an etching stopper in forming the openings is included.

As shown in FIG. 3A, the transistor 440c is an example in which a source electrode layer and a drain electrode layer have a stacked-layer structure, in which a source electrode layer 404a and a source electrode layer 405a are stacked as the source electrode layer and a drain electrode layer 404b and a drain electrode layer 405b are stacked as the drain electrode layer. As shown in the transistor 440c, respective openings reaching the source electrode layer 404a and the drain electrode layer 404b may be formed in the insulating film 416, the insulating film 407, and the source electrode layer 405a or the drain electrode layer 405b, and a wiring layer 465a and a wiring layer 465b electrically connecting the source electrode layer 404a and the drain electrode layer 404b, respectively, may be formed in their respective openings.

In the transistor 440c, the source electrode layer 404a and drain electrode layer 404b each also function as an etching stopper in forming the openings. A tungsten film, a tantalum nitride film, or the like can be used as any of the source electrode layer 404a and the drain electrode layer 404b, and a copper film, an aluminum film, or the like can be used as any of the source electrode layer 405a and the drain electrode layer 405b.

As shown in the transistor 440d in FIG. 3B, the source electrode layer 405a and the drain electrode layer 405b may be provided only directly above the oxide semiconductor stacked layer 403 so as not to be in contact with the side surface of the oxide semiconductor stacked layer 403. An etching step with a resist mask formed using a multi-tone mask enables the structure shown in the transistor 440d to be formed. Such a structure leads to further reduction in leakage current (parasitic channel) of the source electrode layer 405a and the drain electrode layer 405b of the transistor 440d.

The wiring layer 465a and the wiring layer 465b each can be formed using a material(s) and a method similar to those of the gate electrode layer 401, the source electrode layer 405a, or the drain electrode layer 405b. For example, as any of the wiring layers 465a and 465b, a stacked layer of a tantalum nitride film and a copper film, a stacked layer of a tantalum nitride film and a tungsten film, or the like can be used.

In the oxide semiconductor stacked layer 403 which is highly purified and whose oxygen vacancies are repaired, impurities such as hydrogen and water are sufficiently removed; the hydrogen concentration in the oxide semiconductor stacked layer 403 is less than or equal to $5 \times 10^{19}$ atoms/cm$^3$, preferably less than or equal to $5 \times 10^{18}$ atoms/cm$^3$. The hydrogen concentration in the oxide semiconductor stacked layer 403 is measured by secondary ion mass spectrometry (SIMS).

The current value in the off state (off-state current value) of the transistor 440a using the highly purified oxide semiconductor stacked layer 403 containing an excess of oxygen that repairs an oxygen vacancy according to this embodiment is less than or equal to 100 zA per micrometer of channel width at room temperature (1 zA (zeptoampere)=1×$10^{-21}$A), preferably less than or equal to 10 zA/μm, further preferably less than or equal to 1 zA/μm, still further preferably less than or equal to 100 yA/μm.

Accordingly, semiconductor devices for a variety of purposes such as high functionality, high reliability, and low power consumption can be provided.

Embodiment 2

In this embodiment, another embodiment of a semiconductor device and a method for manufacturing the semiconductor device is described with reference to FIGS. 7A to 7D, FIGS. 8A to 8D, and FIGS. 11A and 11B. The above embodiment can be applied to the same portion as, a portion having a function similar to, or a step similar to that in the above embodiment; thus, repetitive description is omitted. In addition, detailed description of the same portions is also omitted.

Described in this embodiment is an example in which an upper oxide semiconductor layer covers the side surface of a lower oxide semiconductor layer in the oxide semiconductor stacked layer.

Figure 7A:
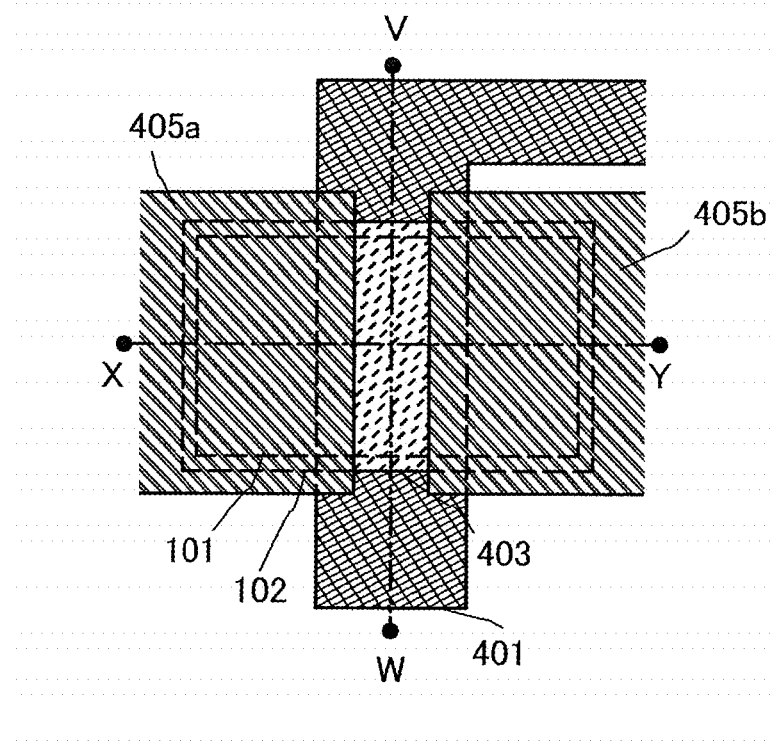
FIGS. 7A to 7D each illustrate one embodiment of a semiconductor device.
Figure 7C:
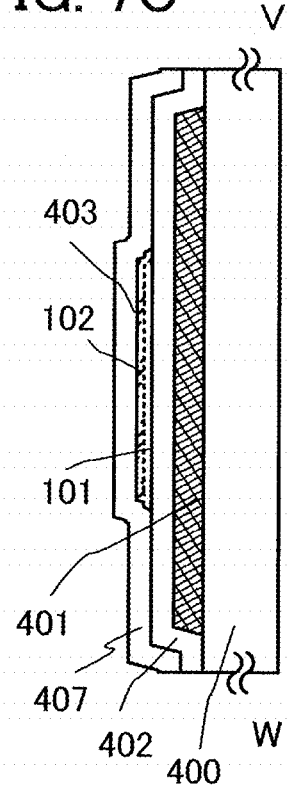
Figure 7B:
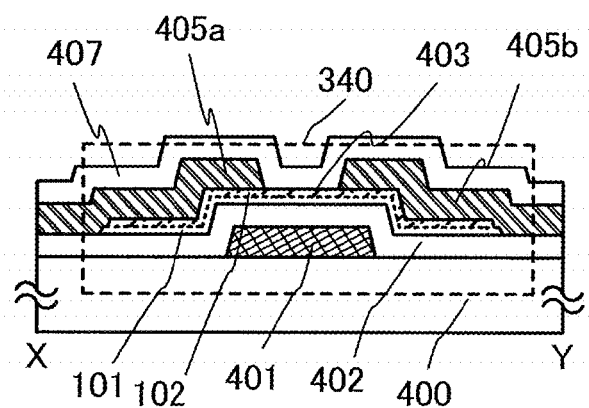

A transistor 340 shown in FIGS. 7A to 7C is an example of an inverted staggered, bottom-gate transistor. FIG. 7A is a plane view; FIG. 7B is a cross-sectional diagram along dashed line X-Y in FIG. 7A; FIG. 7C is a cross-sectional diagram along dashed line V-W in FIG. 7A.

As shown in FIG. 7B, which is the cross-sectional diagram in the channel length direction, the transistor 340 includes the gate electrode layer 401, the gate insulating film 402, the oxide semiconductor stacked layer 403 including the first oxide semiconductor layer 101 and the second oxide semiconductor layer 102 whose energy gaps are different from each other, the source electrode layer 405a, and the drain electrode layer 405b, which are provided in this order over the substrate 400 having an insulating surface. The insulating film 407 is formed over the transistor 340.

The first oxide semiconductor layer 101 is provided on and in contact with the gate insulating film 402. The second oxide semiconductor layer 102 covers a top and side surfaces of the first oxide semiconductor layer 101, and the peripheral edge of the second oxide semiconductor layer 102 is in contact with the gate insulating film 402. The structure in which the first oxide semiconductor layer 101 is in contact with neither the source electrode layer 405a nor the drain electrode layer 405b leads to reduction in occurrence of leakage current (parasitic channel) of the source electrode layer 405a and the drain electrode layer 405b of the transistor 340.

FIG. 7C is the cross-sectional diagram in the channel width direction, in which like FIG. 7B, the peripheral edge (side surface) of the first oxide semiconductor layer 101 is covered with the peripheral edge of the second oxide semiconductor layer 102 and the first oxide semiconductor layer 101 is not in contact with the insulating film 407.

Respective energy gaps of the first oxide semiconductor layer 101 and the second oxide semiconductor layer 102 are different from each other. In the example described in this embodiment, respective compositions of the first oxide semiconductor layer 101 and the second oxide semiconductor layer 102 are different from each other and the energy gap of the second oxide semiconductor layer 102 is larger than that of the first oxide semiconductor layer 101.

FIGS. 8A to 8C illustrates a transistor 380a in which a stacked layer consisting of the first oxide semiconductor layer 101, the second oxide semiconductor layer 102, and the third oxide semiconductor layer 103 is used to form the oxide semiconductor stacked layer 403.

The transistor 380a shown in FIGS. 8A to 8C is an example of an inverted staggered, bottom-gate transistor. FIG. 8A is a plane view; FIG. 8B is a cross-sectional diagram along dashed line X-Y in FIG. 8A; FIG. 8C is a cross-sectional diagram along dashed line V-W in FIG. 8A.

As shown in FIG. 8B, which is the cross-sectional diagram in the channel length direction, the transistor 380a includes the gate electrode layer 401, the gate insulating film 402, the oxide semiconductor stacked layer 403 including the first oxide semiconductor layer 101, the second oxide semiconductor layer 102, and the third oxide semiconductor layer 103, the source electrode layer 405a, and the drain electrode layer 405b, which are provided in this order over the substrate 400 having an insulating surface. The insulating film 407 is formed over the transistor 380a.

The first oxide semiconductor layer 101 is provided on and in contact with the gate insulating film 402. The second oxide semiconductor layer 102 is stacked over the first oxide semiconductor layer 101. The third oxide semiconductor layer 103 covers the side surface of the first oxide semiconductor layer 101 and a top and side surfaces of the second oxide semiconductor layer 102, and the peripheral edge of the third oxide semiconductor layer 103 is in contact with the gate insulating film 402. The structure in which each of the first oxide semiconductor layer 101 and the second oxide semiconductor layer 102 is in contact with neither the source electrode layer 405a nor the drain electrode layer 405b leads to reduction in occurrence of leakage current (parasitic channel) of the source electrode layer 405a and the drain electrode layer 405b of the transistor 380a.

FIG. 8C is the cross-sectional diagram in the channel width direction, in which like FIG. 8B, the peripheral edges (side surfaces) of the first oxide semiconductor layer 101 and the second oxide semiconductor layer 102 are covered with the peripheral edge of the third oxide semiconductor layer 103 and neither the first oxide semiconductor layer 101 nor the second oxide semiconductor layer 102 is in contact with the insulating film 407.

Respective energy gaps of the first oxide semiconductor layer 101 and the second oxide semiconductor layer 102 are different from each other. In the example described in this embodiment, the energy gap of the second oxide semiconductor layer 102 is smaller than that of the first oxide semiconductor layer 101.

Respective energy gaps of the second oxide semiconductor layer 102 and the third oxide semiconductor layer 103 are different from each other. In the example described in this embodiment, the energy gap of the third oxide semiconductor layer 103 is larger than that of the second oxide semiconductor layer 102.

In this embodiment, the energy gap of the third oxide semiconductor layer 103 is substantially the same as that of the first oxide semiconductor layer 101.

For example, an In—Ga—Zn-based oxide film (with an energy gap of 3.2 eV), an In—Sn—Zn-based oxide film (with an energy gap of 2.8 eV), and an In—Ga—Zn-based oxide film (with an energy gap of 3.2 eV) are used as the first oxide semiconductor layer 101, the second oxide semiconductor layer 102, and the third oxide semiconductor layer 103 in the transistor 380a, respectively.

Further, as the oxide semiconductor stacked layer 403 consisting of three stacked layers as in the transistor 380a, a stack of an In—Ga—Zn-based oxide film serving as the first oxide semiconductor layer 101, an In—Zn-based oxide film serving as the second oxide semiconductor layer 102, and an In—Ga—Zn-based oxide film serving as the third oxide semiconductor layer 103; a stack of a Ga—Zn-based oxide film serving as the first oxide semiconductor layer 101, an In—Sn—Zn-based oxide film serving as the second oxide semiconductor layer 102, and a Ga—Zn-based oxide film serving as the third oxide semiconductor layer 103; a stack of a Ga—Zn-based oxide film serving as the first oxide semiconductor layer 101, an In—Zn-based oxide film serving as the second oxide semiconductor layer 102, and a Ga—Zn-based oxide film serving as the third oxide semiconductor layer 103; a stack of an In—Ga-based oxide film serving as the first oxide semiconductor layer 101, an In—Ga—Zn-based oxide film serving as the second oxide semiconductor layer 102, and an In—Ga-based oxide film serving as the third oxide semiconductor layer 103; or a stack of an In—Ga—Zn-based oxide film serving as the first oxide semiconductor layer 101, an indium oxide (In-based oxide) film serving as the second oxide semiconductor layer 102, and an In—Ga—Zn-based oxide film serving as the third oxide semiconductor layer 103 can be used, for example.

Further, the periphery of the second oxide semiconductor layer 102 may be covered with the first oxide semiconductor layer 101 and the third oxide semiconductor layer 103, whereby an increase in oxygen vacancies in the second oxide semiconductor layer 102 can be suppressed, resulting in a structure of the transistor 380a in which the threshold voltage is close to zero. Also in that case, since the second oxide semiconductor layer 102 functions as a buried channel, the channel formation region can be distanced from the interface of any insulating film, whereby interface scattering of carriers is reduced, leading to a high field-effect mobility.

Figure 11A:
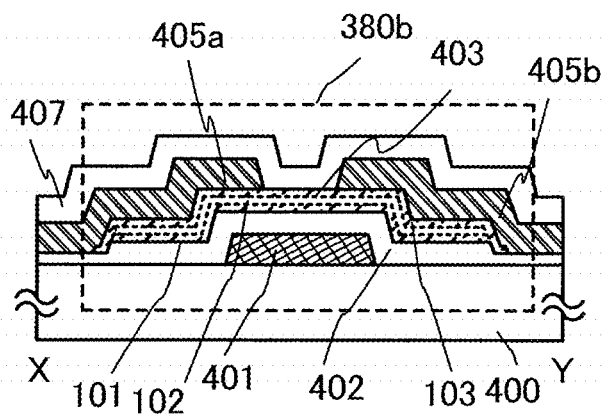
FIGS. 11A and 11B each illustrate one embodiment of a semiconductor device.

In the transistor 380b shown in FIG. 11A, part of the gate insulating film 402 is etched to be thin with the same mask as a mask used for processing the first oxide semiconductor layer 101 and the second oxide semiconductor layer 102 into an island shape (or with the first oxide semiconductor layer 101 and the second oxide semiconductor layer 102 after being processed into an island shape, as a mask). In the transistor 380b, the gate insulating film 402 is thicker in its region which overlaps with either the island-shaped first oxide semiconductor layer 101 or the island-shaped second oxide semiconductor layer 102 than in its other region (region which overlaps with neither of them). Through the etching of part of the gate insulating film 402 in processing the first oxide semiconductor layer 101 and the second oxide semiconductor layer 102 into the island shape, an etching residue such as a residue of the first oxide semiconductor layer 101 can be removed, reducing occurrence of leakage current.

Figure 11B:
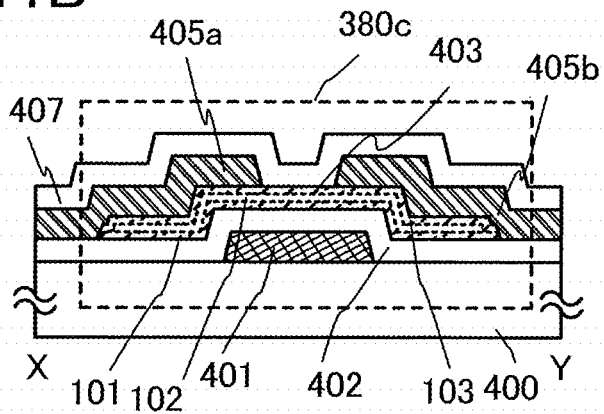

In a transistor 380c shown in FIG. 11B, the oxide semiconductor stacked layer 403 is formed using 3 photolithography processes. The oxide semiconductor stacked layer 403 included in the transistor 380c is formed as follows: a first oxide semiconductor film is deposited and processed using a first mask to form the island-shaped first oxide semiconductor layer 101; a second oxide semiconductor film is deposited over the island-shaped first oxide semiconductor layer 101 and processed using a second mask to form the island-shaped second oxide semiconductor layer 102; and a third oxide semiconductor film is deposited over the island-shaped first oxide semiconductor layer 101 and the island-shaped second oxide semiconductor layer 102 and processed using a third mask to form the island-shaped third oxide semiconductor layer 103.

The transistor 380c has a structure in which the side surface of the first oxide semiconductor layer 101 is protruded beyond the side surface of the second oxide semiconductor layer 102 and is an example in which the third oxide semiconductor layer 103 is in contact with part of the top surface of the first oxide semiconductor layer 101.

Figure 9B:
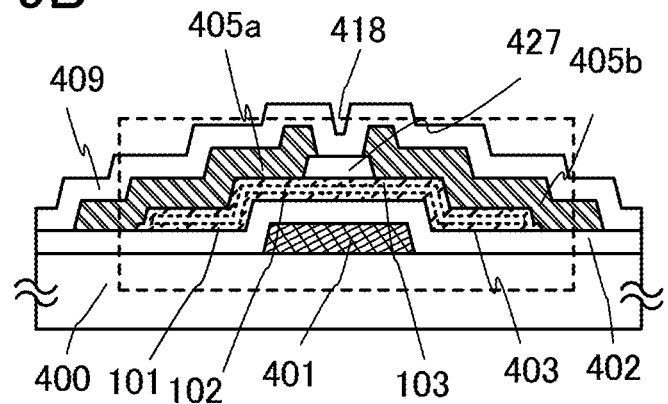

Further, a transistor 418 which has a bottom-gate structure of a channel-protective type is shown in FIG. 9B as another embodiment of a semiconductor device.

As shown in FIG. 9B, which is a cross-sectional diagram in the channel length direction, the transistor 418 includes the gate electrode layer 401, the gate insulating film 402, the oxide semiconductor stacked layer 403 including the first oxide semiconductor layer 101, the second oxide semiconductor layer 102, and the third oxide semiconductor layer 103, the insulating film 427 functioning as a channel protective film, the source electrode layer 405a, and the drain electrode layer 405b, which are provided in this order over the substrate 400 having an insulating surface. The insulating film 409 is formed over the transistor 418.

The first oxide semiconductor layer 101 is provided on and in contact with the gate insulating film 402. The second oxide semiconductor layer 102 is stacked over the first oxide semiconductor layer 101. The third oxide semiconductor layer 103 covers the side surface of the first oxide semiconductor layer 101 and the top and side surfaces of the second oxide semiconductor layer 102, and the peripheral edge of the third oxide semiconductor layer 103 is in contact with the gate insulating film 402. The structure in which each of the first oxide semiconductor layer 101 and the second oxide semiconductor layer 102 is in contact with neither the source electrode layer 405a nor the drain electrode layer 405b leads to reduction in occurrence of leakage current (parasitic channel) of the source electrode layer 405a and the drain electrode layer 405b of the transistor 418.

Figure 10B:
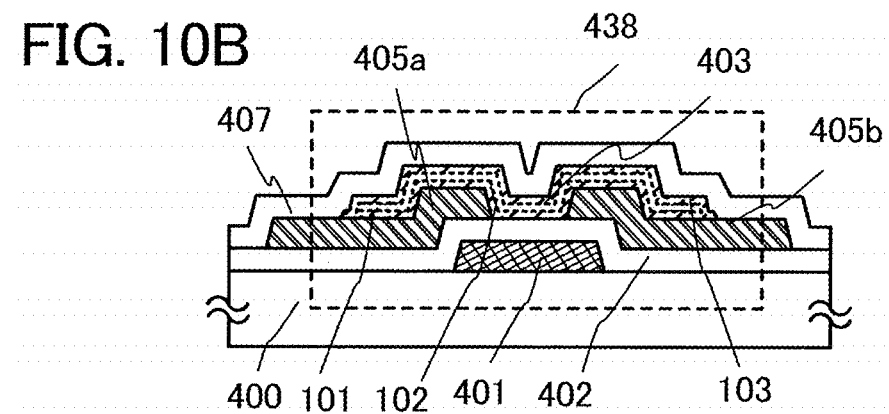

Further, a transistor 438 which has a bottom-gate structure is shown in FIG. 10B as another embodiment of a semiconductor device.

As shown in FIG. 10B, the transistor 438 includes the gate electrode layer 401, the gate insulating film 402, the source electrode layer 405a, the drain electrode layer 405b, and the oxide semiconductor stacked layer 403 including the first oxide semiconductor layer 101, the second oxide semiconductor layer 102, and the third oxide semiconductor layer 103, which are provided in this order over the substrate 400 having an insulating surface. The insulating film 407 is formed over the transistor 438.

The transistor 438 has the structure in which the oxide semiconductor stacked layer 403 including the first oxide semiconductor layer 101, the second oxide semiconductor layer 102, and the third oxide semiconductor layer 103 is provided over the source electrode layer 405a and the drain electrode layer 405b. At least one of their respective energy gaps of the first oxide semiconductor layer 101, the second oxide semiconductor layer 102, and the third oxide semiconductor layer 103 is different from the other.

The first oxide semiconductor layer 101 is provided on and in contact with the source electrode layer 405a and the drain electrode layer 405b. The second oxide semiconductor layer 102 is stacked over the first oxide semiconductor layer 101. The third oxide semiconductor layer 103 covers the side surface of the first oxide semiconductor layer 101 and the top and side surfaces of the second oxide semiconductor layer 102, and the peripheral edge of the third oxide semiconductor layer 103 is in contact with the source electrode layer 405a and the drain electrode layer 405b.

As described above, the shape of each stacked oxide semiconductor layer may differ depending on the oxide semiconductor layer, and the oxide semiconductor stacked layer can have a variety of shapes and a variety of structures.

Accordingly, semiconductor devices for a variety of purposes such as high functionality, high reliability, and low power consumption can be provided.

This embodiment can be implemented combining with another embodiment as appropriate.

Embodiment 3

In this embodiment, another embodiment of a semiconductor device and a method for manufacturing the semiconductor device is described with reference to FIGS. 5A to 5D. The above embodiment can be applied to the same portion as, a portion having a function similar to, or a step similar to that in the above embodiment; thus, repetitive description is omitted. In addition, detailed description of the same portions is also omitted.

Described in this embodiment is an example in which in a method for manufacturing a semiconductor device according to one embodiment of the present invention, oxygen (which includes at least one of an oxygen radical, an oxygen atom, and an oxygen ion) is added to the oxide semiconductor stacked layer to supply oxygen to the film after the oxide semiconductor stacked layer is dehydrated or dehydrogenated.

The dehydration or dehydrogenation treatment may accompany elimination of oxygen which is a main constituent material of an oxide semiconductor to lead to a reduction in oxygen. An oxygen vacancy exists in a portion where oxygen is eliminated in the oxide semiconductor stacked layer, and a donor level which leads to a change in the electric characteristics of a transistor is formed owing to the oxygen vacancy.

Thus, oxygen is preferably supplied to the oxide semiconductor stacked layer after being subjected to the dehydration or dehydrogenation treatment. By supply of oxygen to the oxide semiconductor stacked layer, oxygen vacancies in the film can be repaired. Accordingly, the use of the oxide semiconductor stacked layer for the transistor can lead to a reduction in a variation in the threshold voltage $V_{th}$ of the transistor and a shift of the threshold voltage $\Delta V_{th}$ due to an oxygen vacancy. Further, the threshold voltage of the transistor can be shifted in the positive direction to make the transistor a normally-off transistor.

Figure 5A:
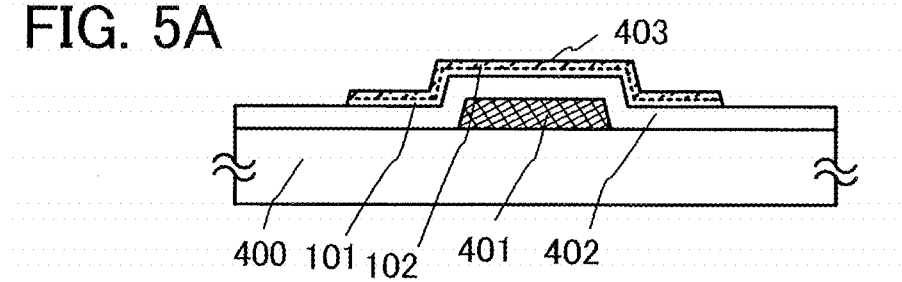
FIGS. 5A to 5D illustrate one embodiment of a semiconductor device and a manufacturing method of the semiconductor device.

FIG. 5A corresponds to FIG. 2C, in which the gate electrode layer 401, the gate insulating film 402, and the oxide semiconductor stacked layer 403 including the first oxide semiconductor layer 101 and the second oxide semiconductor layer 102 whose energy gaps are different from each other are formed over the substrate 400 having an insulating surface.

Figure 5B:
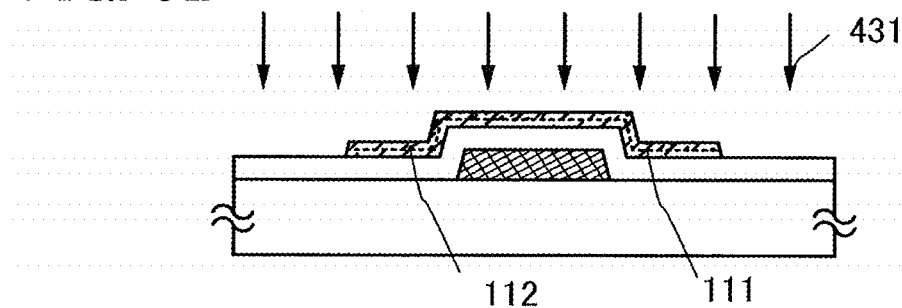
Figure 5C:
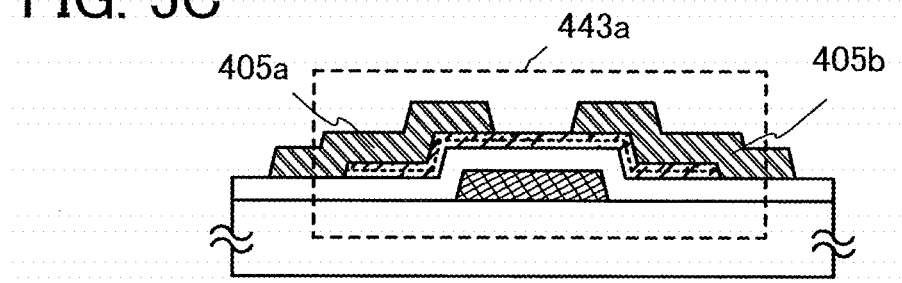

Next, oxygen 431 (which includes at least one of an oxygen radical, an oxygen atom, and an oxygen ion) is added to the oxide semiconductor stacked layer 403 to supply oxygen, whereby an oxygen excess region 111, 112 is formed in the oxide semiconductor stacked layer 403 including the first oxide semiconductor layer 101 and the second oxide semiconductor layer 102 (see FIG. 5B).

The oxygen excess region 111, 112 includes at least partly a region where the oxygen content is higher than that in the stoichiometric composition ratio of the oxide semiconductor in a crystalline state. The oxygen 431 supplied to the oxygen excess region 111, 112 can repair an oxygen vacancy in the oxide semiconductor stacked layer 403 including the first oxide semiconductor layer 101 and the second oxide semiconductor layer 102.

The source electrode layer 405a and the drain electrode layer 405b are formed over the gate insulating film 402 and the oxide semiconductor stacked layer 403 including the oxygen excess regions 111 and 112. In this manner, a transistor 443a is manufactured (see FIG. 5C).

Figure 5D:
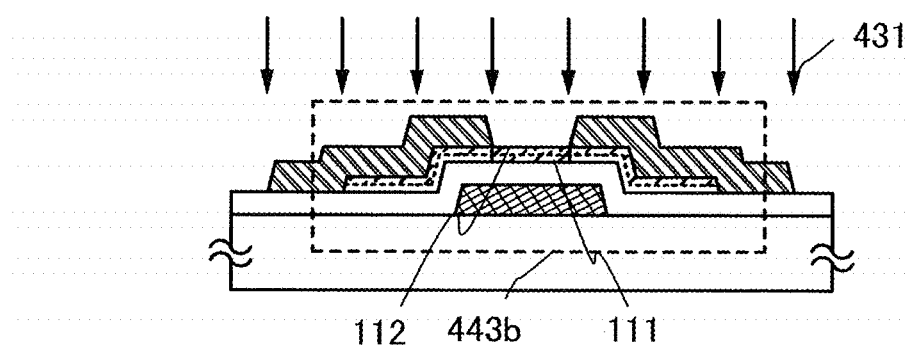

The addition of the oxygen 431 can be performed as well after the source electrode layer 405a and the drain electrode layer 405b are formed. FIG. 5D illustrates a transistor 443b as an example in which oxygen is added to the oxide semiconductor stacked layer 403 including the first oxide semiconductor layer 101 and the second oxide semiconductor layer 102 after formation of the source electrode layer 405a and the drain electrode layer 405b.

As shown in FIG. 5D, the oxygen 431 is selectively added to a channel formation region in the oxide semiconductor stacked layer 403 including the first oxide semiconductor layer 101 and the second oxide semiconductor layer 102 with the source electrode layer 405a and the drain electrode layer 405b functioned as a mask. In the oxide semiconductor stacked layer 403 of the transistor 443b, a region which overlaps with neither the source electrode layer 405a nor the drain electrode layer 405b has a higher oxygen concentration than a region which overlaps with either the source electrode layer 405a or the drain electrode layer 405b.

Further, a transistor 483 which has a bottom-gate structure in which oxygen is added to the oxide semiconductor stacked layer 403 is shown in FIG. 4B as another embodiment of a semiconductor device. FIG. 4A illustrates the transistor 480 in which a stacked layer consisting of the first oxide semiconductor layer 101, the second oxide semiconductor layer 102, and the third oxide semiconductor layer 103 is used to form the oxide semiconductor stacked layer 403.

The transistor 483 includes the gate electrode layer 401, the gate insulating film 402, the oxide semiconductor stacked layer 403 including the first oxide semiconductor layer 101 including the oxygen excess region 111, the second oxide semiconductor layer 102 including the oxygen excess region 112, and the third oxide semiconductor layer 103 including an oxygen excess region 113, the source electrode layer 405a, and the drain electrode layer 405b, which are provided in this order over the substrate 400 having an insulating surface. The insulating film 407 is formed over the transistor 483.

Respective energy gaps of the first oxide semiconductor layer 101, the second oxide semiconductor layer 102, and the third oxide semiconductor layer 103 in the oxide semiconductor stacked layer 403 of the transistor 483 are not the same as each other but take at least two different values.

The transistor 483 is an example in which oxygen is added to all over the oxide semiconductor stacked layer 403; the oxygen excess region 111, the oxygen excess region 112, and the oxygen excess region 113 are formed in all over the first oxide semiconductor layer 101, the second oxide semiconductor layer 102, and the third oxide semiconductor layer 103, respectively.

Figure 9C:
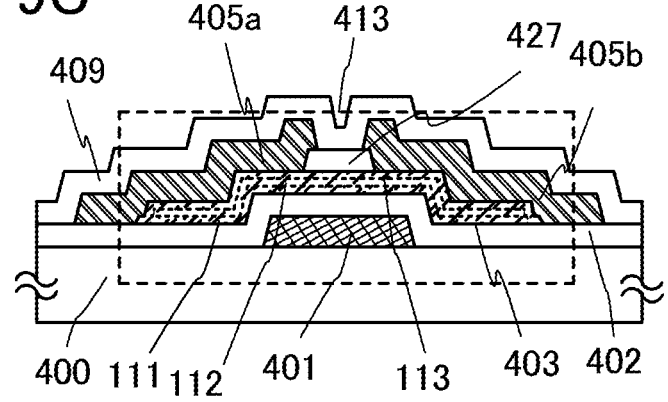

Further, a transistor 413 which has a bottom-gate structure of a channel-protective type is shown in FIG. 9C as another embodiment of a semiconductor device.

The transistor 413 includes the gate electrode layer 401, the gate insulating film 402, the oxide semiconductor stacked layer 403 including the first oxide semiconductor layer 101 including the oxygen excess region 111, the second oxide semiconductor layer 102 including the oxygen excess region 112, and the third oxide semiconductor layer 103 including the oxygen excess region 113, the insulating film 427 functioning as a channel protective film, the source electrode layer 405a, and the drain electrode layer 405b, which are provided in this order over the substrate 400 having an insulating surface. The insulating film 409 is formed over the transistor 413.

At least one of their respective energy gaps of the first oxide semiconductor layer 101, the second oxide semiconductor layer 102, and the third oxide semiconductor layer 103 is different from the other. In the example described as the transistor 413, the energy gap of the second oxide semiconductor layer 102 is smaller than those of the first oxide semiconductor layer 101 and the third oxide semiconductor layer 103.

The transistor 413 is an example in which oxygen is added to all over the oxide semiconductor stacked layer 403; the oxygen excess region 111, the oxygen excess region 112, and the oxygen excess region 113 are formed in all over the first oxide semiconductor layer 101, the second oxide semiconductor layer 102, and the third oxide semiconductor layer 103, respectively.

In the transistor 413, the first oxide semiconductor layer 101 is provided on and in contact with the gate insulating film 402. The second oxide semiconductor layer 102 is stacked over the first oxide semiconductor layer 101. The third oxide semiconductor layer 103 covers the side surface of the first oxide semiconductor layer 101 and the top and side surfaces of the second oxide semiconductor layer 102, and the peripheral edge of the third oxide semiconductor layer 103 is in contact with the gate insulating film 402. The structure in which each of the first oxide semiconductor layer 101 and the second oxide semiconductor layer 102 is in contact with neither the source electrode layer 405a nor the drain electrode layer 405b leads to reduction in occurrence of leakage current (parasitic channel) of the source electrode layer 405a and the drain electrode layer 405b of the transistor 413.

Figure 10C:
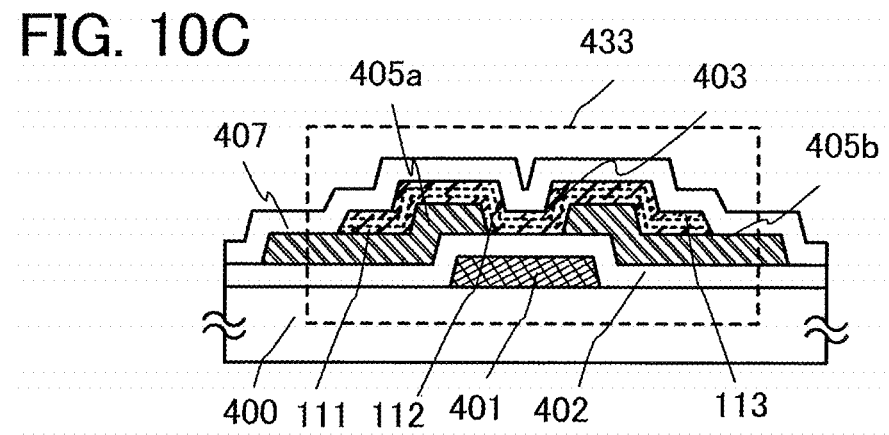

Further, a transistor 433 which has a bottom-gate structure in which oxygen is added to the oxide semiconductor stacked layer 403 is shown in FIG. 10C as another embodiment of a semiconductor device.

As shown in FIG. 10C, the transistor 433 includes the gate electrode layer 401, the gate insulating film 402, the source electrode layer 405a, the drain electrode layer 405b, and the oxide semiconductor stacked layer 403 including the first oxide semiconductor layer 101 including the oxygen excess region 111, the second oxide semiconductor layer 102 including the oxygen excess region 112, and the third oxide semiconductor layer 103 including the oxygen excess region 113, which are provided in this order over the substrate 400 having an insulating surface. The insulating film 407 is formed over the transistor 433.

The transistor 433 has the structure in which the oxide semiconductor stacked layer 403 including the first oxide semiconductor layer 101, the second oxide semiconductor layer 102, and the third oxide semiconductor layer 103 is provided over the source electrode layer 405a and the drain electrode layer 405b. At least one of their respective energy gaps of the first oxide semiconductor layer 101, the second oxide semiconductor layer 102, and the third oxide semiconductor layer 103 is different from the other. In the example described as the transistor 433, the energy gap of the second oxide semiconductor layer 102 is smaller than those of the first oxide semiconductor layer 101 and the third oxide semiconductor layer 103.

The transistor 433 is an example in which oxygen is added to all over the oxide semiconductor stacked layer 403; the oxygen excess region 111, the oxygen excess region 112, and the oxygen excess region 113 are formed in all over the first oxide semiconductor layer 101, the second oxide semiconductor layer 102, and the third oxide semiconductor layer 103, respectively.

The oxygen is added either directly to the oxide semiconductor stacked layer 403 in the state where the oxide semiconductor stacked layer 403 is exposed or added through the insulating film 407 in the transistor 433.

Figure 7D:
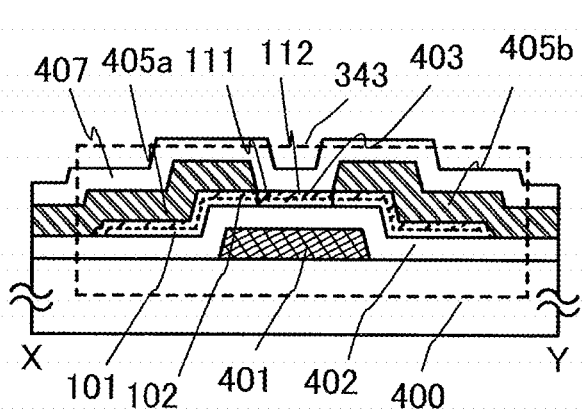

Examples in which oxygen is added to the oxide semiconductor stacked layer 403 in the transistor 340, 380a described in Embodiment 2, in which an upper oxide semiconductor layer covers the side surface of a lower oxide semiconductor layer, so that an oxygen excess region is formed are shown in FIGS. 7D and 8D.

A transistor 343 shown in FIG. 7D includes the gate electrode layer 401, the gate insulating film 402, the oxide semiconductor stacked layer 403 including the first oxide semiconductor layer 101 and the second oxide semiconductor layer 102 whose energy gaps are different from each other, the source electrode layer 405a, and the drain electrode layer 405b, which are provided in this order over the substrate 400 having an insulating surface. The insulating film 407 is formed over the transistor 343. The oxide semiconductor stacked layer 403 includes the first oxide semiconductor layer 101 including the oxygen excess region 111 and the second oxide semiconductor layer 102 including the oxygen excess region 112 in the transistor 343.

A transistor 383 shown in FIG. 8D includes the gate electrode layer 401, the gate insulating film 402, the oxide semiconductor stacked layer 403 including the first oxide semiconductor layer 101, the second oxide semiconductor layer 102, and the third oxide semiconductor layer 103 whose energy gaps are different from each other, the source electrode layer 405a, and the drain electrode layer 405b, which are provided in this order over the substrate 400 having an insulating surface. The insulating film 407 is formed over the transistor 383. The oxide semiconductor stacked layer 403 includes the first oxide semiconductor layer 101 including the oxygen excess region 111, the second oxide semiconductor layer 102 including the oxygen excess region 112, and the third oxide semiconductor layer 103 including the oxygen excess region 113 in the transistor 383.

The structure as shown in the transistors 343 and 383 in which the upper oxide semiconductor layer, which has an energy gap larger than that of the lower oxide semiconductor layer, covers the side surface of the lower oxide semiconductor layer in the oxide semiconductor stacked layer leads to reduction in occurrence of leakage current (parasitic channel) of the source electrode layer and the drain electrode layer of the transistor.

Oxygen which is added to the dehydrated or dehydrogenated oxide semiconductor stacked layer 403 to supply oxygen to the film can highly purify the oxide semiconductor stacked layer 403 and make the film an electrically i-type (intrinsic). Change in the electric characteristics of the transistor 443a, 443b, 413, 433, 343, 383 including the highly purified, electrically i-type (intrinsic) oxide semiconductor stacked layer 403 is suppressed and the transistor is thus electrically stable.

As the method for addition of oxygen, an ion implantation method, an ion doping method, a plasma immersion ion implantation method, plasma treatment, or the like can be used.

In the step of addition of oxygen, oxygen may be directly added to the oxide semiconductor stacked layer 403 or added to the oxide semiconductor stacked layer 403 through another film such as the insulating film 407. An ion implantation method, an ion doping method, a plasma immersion ion implantation method, or the like may be employed for the addition of oxygen through another film, whereas plasma treatment or the like can also be employed for the addition of oxygen directly to the oxide semiconductor stacked layer 403 in the state where the oxide semiconductor stacked layer 403 is exposed.

The addition of oxygen to the oxide semiconductor stacked layer 403 can be performed anytime after dehydration or dehydrogenation treatment is performed thereon. Further, oxygen may be added plural times to the dehydrated or dehydrogenated oxide semiconductor stacked layer 403.

For example, in Embodiment 1, the addition of oxygen to the oxide semiconductor stacked layer 403 can be performed on the exposed oxide semiconductor stacked layer 493 or the oxide semiconductor stacked layer 403 after formation of the source electrode layer 405a and the drain electrode layer 405b, after formation of the gate insulating film 402, after formation of the gate electrode layer 401, or after formation of the insulating film 407.

Further, it is preferable that the concentration of oxygen, which is added by the step of oxygen addition, in the oxygen excess region 111, 112 in the oxide semiconductor stacked layer 403 be greater than or equal to $1 \times 10^{18}$ atoms/cm$^3$ and less than or equal to $5 \times 10^{21}$ atoms/cm$^3$.

In the oxide semiconductor, oxygen is one of its main constituent materials. Thus, it is difficult to accurately estimate the oxygen concentration in the oxide semiconductor stacked layer 403 by a method such as secondary ion mass spectrometry (SIMS). In other words, it can be said that it is difficult to determine whether oxygen is intentionally added to the oxide semiconductor stacked layer 403.

It is known that there exist isotopes of oxygen, such as $^{17}$O and $^{18}$O, and $^{17}$O and $^{18}$O account for about 0.037% and about 0.204% of all of the oxygen atoms in nature, respectively. That is to say, it is possible to measure the concentrations of these isotopes which are intentionally added to the oxide semiconductor stacked layer 403 by a method such as SIMS; therefore, the oxygen concentration in the oxide semiconductor stacked layer 403 can be estimated more accurately in some cases by measuring the concentrations of these isotopes. Thus, the concentrations of these isotopes may be measured to determine whether oxygen is intentionally added to the oxide semiconductor stacked layer 403.

Heat treatment is preferably performed after oxygen is added to the oxide semiconductor film.

In the case where oxygen is directly added to the oxide semiconductor stacked layer 403 as in the transistors 443a and 443b in this embodiment, the gate insulating film 402 and the insulating film 407 which are in contact with the oxide semiconductor stacked layer 403 do not necessarily contain much oxygen. It is preferable that a film having a high shielding effect (blocking effect) against oxygen and impurities such as hydrogen and water be provided as the insulating film 407 so that oxygen added to the oxide semiconductor stacked layer 403 is not eliminated from the oxide semiconductor stacked layer 403 and impurities such as hydrogen and water do not enter the oxide semiconductor stacked layer 403. For example, an aluminum oxide film or the like having a high shielding effect (blocking effect) against both of oxygen and impurities such as hydrogen and water may be used.

Needless to say, oxygen may be supplied by a plurality of methods: for example, oxygen may be supplied both from a film containing much oxygen provided as the gate insulating film 402 or the insulating film 407 in contact with the oxide semiconductor film, and by direct addition of oxygen to the oxide semiconductor stacked layer 403.

Although an example in which oxygen is added to the oxide semiconductor stacked layer 403 is described in this embodiment, oxygen may be added to the gate insulating film 402, the insulating film 407, or the like which is in contact with the oxide semiconductor stacked layer 403. The addition of oxygen to the gate insulating film 402 or the insulating film 407 which is in contact with the oxide semiconductor stacked layer 403 to make the film an oxygen excess film enables oxygen to be supplied to the oxide semiconductor stacked layer 403.

In this manner, a semiconductor device using an oxide semiconductor stacked layer whose electric characteristics are stable can be provided. Accordingly, a highly reliable semiconductor device can be provided.

This embodiment can be implemented combining with another embodiment as appropriate.

Embodiment 4

In this embodiment, another embodiment of a semiconductor device and a method for manufacturing the semiconductor device is described with reference to FIGS. 6A to 6C. The above embodiment can be applied to the same portion as, a portion having a function similar to, or a step similar to that in the above embodiment; thus, repetitive description is omitted. In addition, detailed description of the same portions is also omitted.

Described in this embodiment is an example in which in a method for manufacturing a semiconductor device according to one embodiment of the present invention, a low-resistance region is formed in the oxide semiconductor stacked layer. The low-resistance region can be formed by adding an impurity (also called dopant) for changing the electrical conductivity to the oxide semiconductor stacked layer.

In this embodiment, a transistor 420 which has a bottom-gate structure of a channel-protective type is described as an example. FIGS. 6A to 6C illustrates an example of a method for manufacturing the transistor 420.

First, the gate electrode layer 401 is formed over the substrate 400 having an insulating surface. The gate insulating film 402 is formed over the gate electrode layer 401.

Then, the oxide semiconductor stacked layer 403 including the first oxide semiconductor layer 101 and the second oxide semiconductor layer 102 whose energy gaps are different from each other is formed over the gate insulating film 402.

Oxygen may be added to the oxide semiconductor stacked layer 403 as described in Embodiment 2, so that the oxide semiconductor stacked layer 403 includes an oxygen excess region. The oxide semiconductor stacked layer 403 may have a three-layer structure and have a structure in which an upper oxide semiconductor layer covers the side surface of a lower oxide semiconductor layer.

Figure 6A:
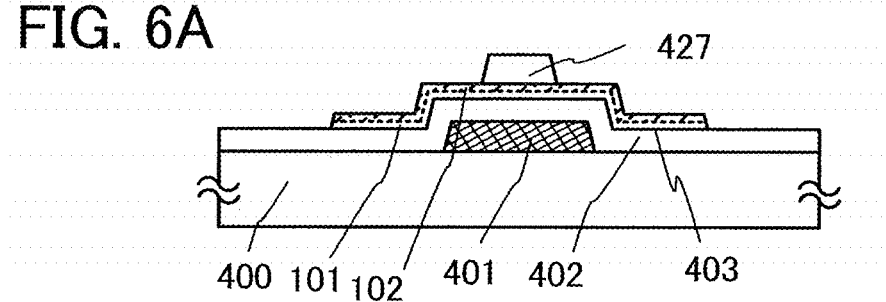
FIGS. 6A to 6C illustrate one embodiment of a semiconductor device and a manufacturing method of the semiconductor device.

The insulating film 427 functioning as a channel protective film is formed over the oxide semiconductor stacked layer 403 to overlap with the gate electrode layer 401 (see FIG. 6A).

Figure 6B:
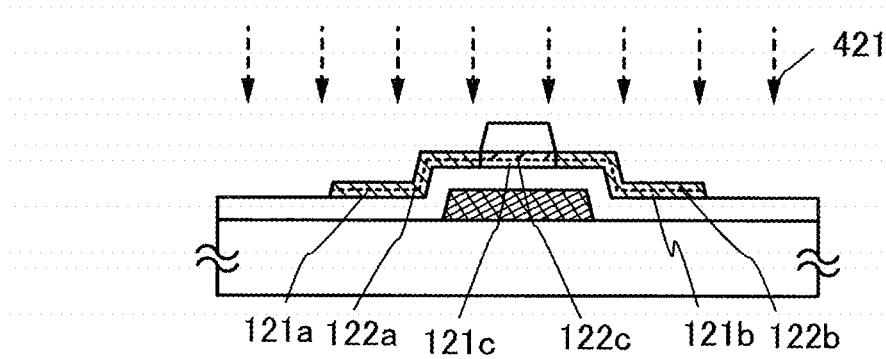

Next, a dopant 421 is selectively added to the oxide semiconductor stacked layer 403 with the insulating film 427 as a mask, so that low-resistance regions 121a, 121b, 122a, and 122b are formed (see FIG. 6B).

Although the insulating film 427 functioning as the channel protective film is used as a mask for the addition of the dopant 421 in this embodiment, a resist mask may be formed for selective addition of the dopant 421. Also in the transistor 440a, 430, or the like, in which a channel protective film is not provided, a resist mask may be formed for selective addition of a dopant.

Depending on addition conditions of the dopant 421, the dopant 421 may be added only either the first oxide semiconductor layer 101 or the second oxide semiconductor layer 102, so that a low-resistance region is formed, in the case of which the dopant concentration may be ununiformly distributed in the first oxide semiconductor layer 101 and the second oxide semiconductor layer 102.

The dopant 421 is an impurity by which the electrical conductivity of the oxide semiconductor stacked layer 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 421 is added to the oxide semiconductor stacked layer 403 by an implantation method. As the method for adding the dopant 421, an ion implantation method, an ion doping method, a plasma immersion ion implantation method, or the like can be used. In that case, it is preferable to use a single ion of the dopant 421 or a hydride ion, a fluoride ion, or a chloride ion thereof.

The addition of the dopant 421 may be controlled by setting the addition conditions such as the accelerated voltage and the dosage, or the thickness of the insulating film 427 serving as a mask as appropriate. In this embodiment, boron is used as the dopant 421, whose ion is added by an ion implantation method. The dosage of the dopant 421 is preferably set to be greater than or equal to $1 \times 10^{13}$ ions/cm$^2$ and less than or equal to $5 \times 10^{16}$ ions/cm$^2$.

The concentration of the dopant 421 in the low-resistance region is preferably greater than or equal to $5 \times 10^{18}$ atoms/cm$^3$ and less than or equal to $1 \times 10^{22}$ atoms/cm$^3$.

The substrate 400 may be heated in adding the dopant 421.

The addition of the dopant 421 to the oxide semiconductor stacked layer 403 may be performed plural times, and the number of kinds of dopant may be plural.

Further, heat treatment may be performed thereon after the addition of the dopant 421. The heat treatment is preferably performed at a temperature(s) higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

In the case where the oxide semiconductor stacked layer 403 is a crystalline oxide semiconductor film, the oxide semiconductor stacked layer 403 may be partly amorphized by the addition of the dopant 421. In that case, the crystallinity of the oxide semiconductor stacked layer 403 can be recovered by performing heat treatment thereon after the addition of the dopant 421.

In this manner, in the oxide semiconductor stacked layer 403, the first oxide semiconductor layer 101 in which the low-resistance regions 121a and 121b are provided to sandwich a channel formation region 121c and the second oxide semiconductor layer 102 in which the low-resistance regions 122a and 122b are provided to sandwich a channel formation region 122c are formed.

Next, the source electrode layer 405a and the drain electrode layer 405b are formed in contact with the low-resistance regions 121a, 121b, 122a, and 122b.

Figure 6C:
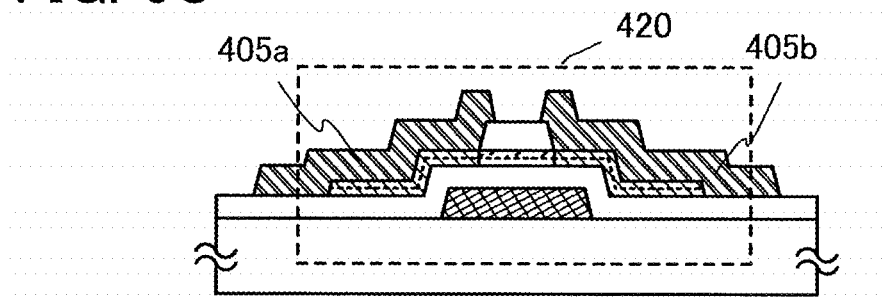

Through the above process, the transistor 420 of this embodiment is manufactured (see FIG. 6C).

With the oxide semiconductor stacked layer 403 including the first oxide semiconductor layer 101 in which the low-resistance regions 121a and 121b are provided to sandwich the channel formation region 121c in the channel length direction and the second oxide semiconductor layer 102 in which the low-resistance regions 122a and 122b are provided to sandwich the channel formation region 122c in the channel length direction, on-state characteristics (e.g., on-state current and field-effect mobility) of the transistor 420 are increased, which enables high-speed operation and high-speed response of the transistor.

The low-resistance regions 121a, 121b, 122a, and 122b each can be functioned as a source region or a drain region in the transistor 420. With the low-resistance regions 121a and 121b, 122a and 122b, the electrical field applied to the channel formation region 121c, 122c formed between the low-resistance regions 121a and 121b, 122a and 122b can be relaxed. Further, electrical connection between the oxide semiconductor stacked layer 403 and each of the source electrode layer 405a and the drain electrode layer 405b in the low-resistance regions 121a, 121b, 122a, and 122b can reduce the contact resistance between the oxide semiconductor stacked layer 403 and each of the source electrode layer 405a and the drain electrode layer 405b. Consequently, the electrical characteristics of the transistor can be increased.

This embodiment can be implemented combining with another embodiment as appropriate.

Embodiment 5

A semiconductor device (also referred to as a display device) having a display function can be manufactured using the transistor an example of which is described in any of Embodiments 1 to 4. Moreover, part or all of the driver circuitry which includes the transistor can be formed over a substrate where a pixel portion is formed, whereby a system-on-panel can be formed.

Figure 12A:
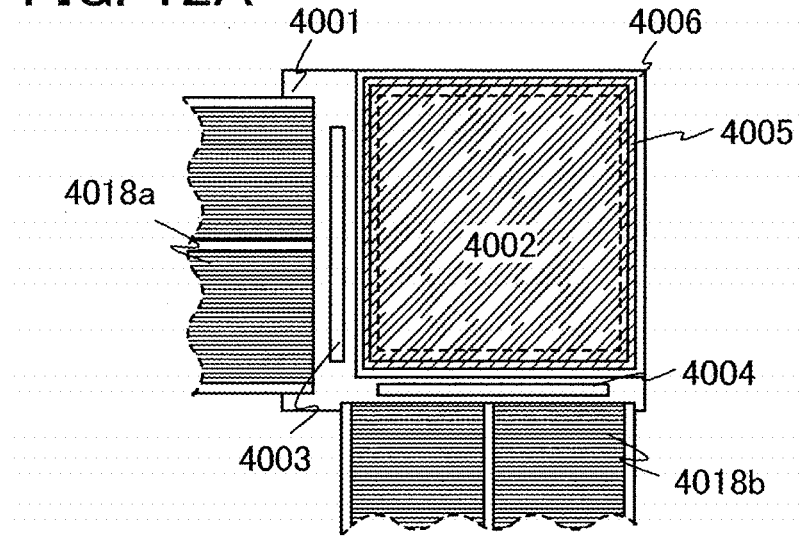
FIGS. 12A to 12C each illustrate one embodiment of a semiconductor device.

In FIG. 12A, a sealant 4005 is provided so as to surround a pixel portion 4002 provided over a first substrate 4001, and the pixel portion 4002 is sealed with a second substrate 4006. In FIG. 12A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003, the scan line driver circuit 4004, and the pixel portion 4002 from flexible printed circuits (FPCs) 4018a and 4018b.

Figure 12B:
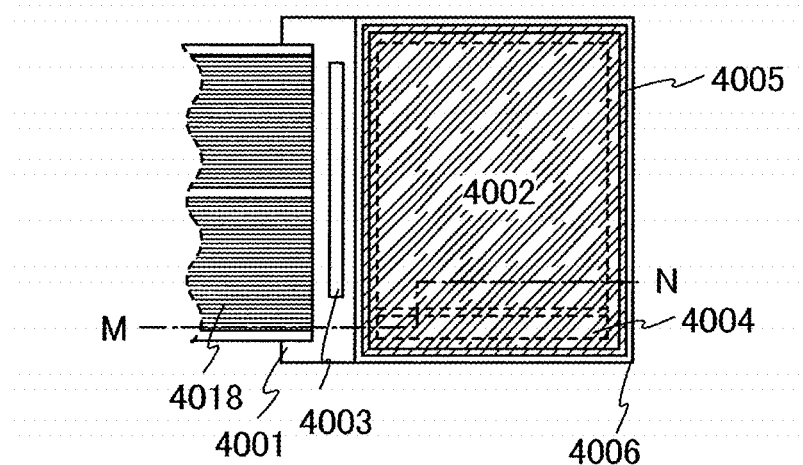
Figure 12C:
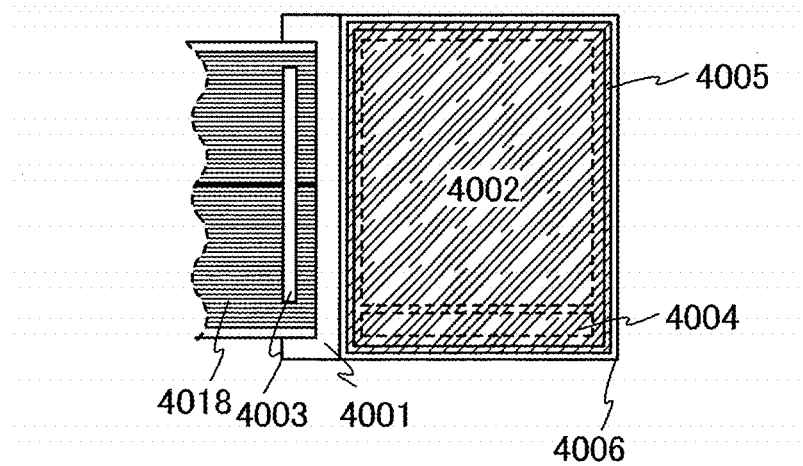

In FIGS. 12B and 12C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 12B and 12C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 12B and 12C, a variety of signals and potentials are supplied to the signal line driver circuit 4003, the scan line driver circuit 4004, and the pixel portion 4002 from an FPC 4018.

Although FIGS. 12B and 12C each illustrate an example in which the signal line driver circuit 4003 is formed separately and mounted over the first substrate 4001, embodiments of the present invention are not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used. FIG. 12A illustrates an example in which the signal line driver circuit 4003 and the scan line driver circuit 4004 are mounted by a COG method; FIG. 12B illustrates an example in which the signal line driver circuit 4003 is mounted by a COG method; and FIG. 12C illustrates an example in which the signal line driver circuit 4003 is mounted by a TAB method.

The display device includes in its category a panel in which a display element is sealed, and a module in which an IC such as a controller or the like is mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, to which any of the transistors which are described in Embodiments 1 to 4 can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

An embodiment of a semiconductor device is described with reference to FIGS. 12A to 12C and FIGS. 13A and 13B. FIGS. 13A and 13B are cross-sectional diagrams along line M-N of FIG. 12B.

As shown in FIGS. 13A and 13B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

The pixel portion 4002 and the scan line driver circuit 4004 which are provided over the first substrate 4001 each include a plurality of transistors. In FIGS. 13A and 13B, the transistor 4010 included in the pixel portion 4002 and the transistor 4011 included in the scan line driver circuit 4004 are illustrated as an example. An insulating film 4020 is provided over the transistors 4010 and 4011 in FIG. 13A, and an insulating film 4021 is further provided in FIG. 13B. An insulating film 4023 is an insulating film serving as a base film.

Any of the transistors described in Embodiments 1 to 4 can be applied to the transistors 4010 and 4011. In this embodiment, an example in which a transistor having a structure similar to that of the transistor 440a described in Embodiment 1 is used is described.

The transistors 4010 and 4011 each include an oxide semiconductor stacked layer including at least two oxide semiconductor layers whose energy gaps are different from each other. By using the oxide semiconductor stacked layer using a plurality of oxide semiconductor layers whose energy gaps are different from each other, the electrical characteristics of the transistor can be adjusted with higher accuracy, providing the transistor 4010, 4011 with appropriate electrical characteristics.

Accordingly, semiconductor devices for a variety of purposes such as high functionality, high reliability, and low power consumption can be provided as the semiconductor device of this embodiment shown in FIGS. 12A to 12C and FIGS. 13A and 13C.

The transistor 4010 included in the pixel portion 4002 is electrically connected to a display element to constitute a part of a display panel. There is no particular limitation on the kind of the display element as long as display can be performed; various kinds of display elements can be used.

An example of a liquid crystal display device using a liquid crystal element as a display element is illustrated in FIG. 13A. In FIG. 13A, a liquid crystal element 4013 which is a display element includes a first electrode layer 4030, a second electrode layer 4031, and a liquid crystal layer 4008. Insulating films 4032 and 4033 serving as orientation films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A columnar spacer denoted by reference numeral 4035 is obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not involved may be used for the liquid crystal layer 4008. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, so that the alignment process is not requisite and the viewing angle dependence is small. In addition, since an alignment film does not need to be provided and thus rubbing treatment is not requisite, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor using an oxide semiconductor film.

The specific resistivity of the liquid crystal material is greater than or equal to $1\times10^9$ $\Omega\cdot cm$, preferably greater than or equal to $1\times10^{11}$ $\Omega\cdot cm$, further preferably greater than or equal to $1\times10^{12}$ $\Omega\cdot cm$. The specific resistivity in this specification is measured at 20° C.

The magnitude of a storage capacitor in the liquid crystal display device is set considering the leakage current of the transistor in the pixel portion or the like so that charge can be held for a predetermined period. The magnitude of the storage capacitor may be set considering the off-state current of the transistor or the like. By using the/a transistor including an oxide semiconductor film disclosed in this specification, a capacitance that is ⅓ or less, preferably ⅕ or less of liquid crystal capacitance of each pixel is enough as the magnitude of the storage capacitor.

In the transistor using an oxide semiconductor film disclosed in this specification, the current in an off state (off-state current) can be suppressed to be small. Accordingly, an electric signal such as an image signal can be held for a longer period, and a writing interval can be set longer in an on state. The frequency of refresh operation can be accordingly reduced, which leads to an effect of suppressing power consumption.

Further, the transistor using an oxide semiconductor film disclosed in this specification can exhibit a high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided. Accordingly, reliability of the semiconductor device can also be improved.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Embodiments of the disclosed invention are not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether the light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. This light-emitting element is called a current-excitation light-emitting element after such a mechanism.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of the pair of electrodes has a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side; a light-emitting element having any of these emission structures can be used.

An example of a light-emitting device in which a light-emitting element is used as a display element is illustrated in FIG. 13B. A light-emitting element 4513 which is the display element is electrically connected to the transistor 4010 provided in the pixel portion 4002. A structure of the light-emitting element 4513 is not limited to the shown stacked-layer structure, which is the stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 is formed using an organic insulating material or an inorganic insulating material. It is preferable that the partition wall 4510 be formed using a photosensitive resin material and have an opening over the first electrode layer 4030 so that a sidewall of the opening is formed as a tilted surface with continuous curvature.

The electroluminescent layer 4511 consists of either a single layer or a plurality of layers stacked.

A protective film may be formed over the second electrode layer 4031 and the partition wall 4510 in order to prevent entry of oxygen, hydrogen, water, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

Further, electronic paper in which electronic ink is driven can be provided as the display device. The electronic paper is also called electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Further, with a color filter or particles that have a pigment, color display can also be performed.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 12A to 12C and FIGS. 13A and 13B, a flexible substrate as well as a glass substrate can be used as any of the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where the light-transmitting property is not requisite, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020.

The aluminum oxide film which is provided as the insulating film 4020 over the oxide semiconductor film has a high blocking effect by which both of oxygen and impurities such as hydrogen or water is prevented from being passed through the film.

Therefore, in and after the manufacturing process, the aluminum oxide film functions as a protective film for preventing entry of an impurity such as hydrogen or water, which causes a change, into the oxide semiconductor film and release of oxygen, which is a main constituent material of the oxide semiconductor, from the oxide semiconductor film.

The insulating film 4021 serving as a planarization insulating film can be formed using an organic material having heat resistance, such as an acrylic resin, polyimide, benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of these materials.

There is no particular limitation on the method of forming the insulating film 4021, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element have either light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called conductive polymer) can be used for the first electrode layer 4030 and the second electrode layer 4031. As the conductive high molecule, a so-called 7c-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken by static electricity or the like, a protection circuit for protecting the driver circuit is preferably provided. The protection circuit is preferably formed using a nonlinear element.

Any of the transistors described in Embodiments 1 to 4 enables semiconductor devices having a variety of functions to be provided as described above.

Embodiment 6

Any of the transistors described in Embodiments 1 to 4 enables a semiconductor device having an image sensor function of reading data on an object to be manufactured.

FIG. 14A illustrates an example of a semiconductor device having an image sensor function. FIG. 14A is an equivalent circuit diagram of a photosensor, and FIG. 14B is a cross-sectional diagram of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

In the circuit diagrams in this specification, symbol "OS" is written under the mark of a transistor using an oxide semiconductor film so that it can be clearly identified as a transistor using an oxide semiconductor film. In FIG. 14A, the transistor 640 and the transistor 656 are transistors each using an oxide semiconductor layer, to which any of the transistors described in Embodiments 1 to 4 can be applied. Described in this embodiment is an example in which a transistor having a structure similar to that of the transistor 440a described in Embodiment 1 is used.

FIG. 14B is a cross-sectional diagram of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an insulating film 362, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma-enhanced CVD method with the use of a semiconductor source gas containing an impurity element belonging to Group 13 (e.g., boron (B)) in the periodic table. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like may be performed after the impurity element is added by an ion implantation method or the like to diffuse the impurity element. In that case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma-enhanced CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma-enhanced CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like may be performed after the impurity element is added by an ion implantation method or the like to diffuse the impurity element. In that case, as the method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that the stability is increased and thus a favorable microcrystalline semiconductor film can be obtained.

This microcrystalline semiconductor film can be formed by a radio-frequency plasma-enhanced CVD method with a frequency of greater than or equal to several tens of megahertz and less than or equal to several hundreds of megahertz, or a microwave plasma-enhanced CVD apparatus with a frequency of greater than or equal to 1 GHz.

As a typical example, the microcrystalline semiconductor can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive film. A surface on the n-type semiconductor film side can alternatively be used as the light-receiving plane.

With the use of an insulating material, the insulating film 632, the interlayer insulating film 633 and the interlayer insulating film 634 can be formed, depending on the material, by a method or a tool (equipment) such as a sputtering method, a plasma-enhanced CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma-enhanced CVD method.

The aluminum oxide film which is provided as the insulating film 631 over the oxide semiconductor film has a high blocking effect by which both of oxygen and impurities such as hydrogen or water is prevented from being passed through the film.

Therefore, in and after the manufacturing process, the aluminum oxide film functions as a protective film for preventing entry of an impurity such as hydrogen or water, which causes a change, into the oxide semiconductor film and release of oxygen, which is a main constituent material of the oxide semiconductor, from the oxide semiconductor film.

The insulating film 632 can be formed using an inorganic insulating material to have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

To reduce surface roughness, an insulating film functioning as a planarization insulating film is preferably used as each of the interlayer insulating films 633 and 634. For the interlayer insulating films 633 and 634, for example, an organic insulating material having heat resistance, such as polyimide, an acrylic resin, a benzocyclobutene-based resin, polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light that enters the photodiode 602, data on an object to be detected can be read. A light source such as a backlight can be used at the time of reading data on the object.

By using as a semiconductor layer the oxide semiconductor stacked layer including a plurality of oxide semiconductor layers having different energy gaps as described above, the electrical characteristics of the transistor can be adjusted with higher accuracy, providing the transistor with appropriate electrical characteristics. Accordingly, the transistor enables semiconductor devices for a variety of purposes such as high functionality, high reliability, and low power consumption to be provided.

This embodiment can be implemented combining with another embodiment as appropriate.

Embodiment 7

The transistor an example of which is described in any of Embodiments 1 to 4 can be favorably used for a semiconductor device including an integrated circuit in which a plurality of transistors is stacked. In this embodiment, as an example of the semiconductor device, a memory medium (memory element) is described.

Manufactured in this embodiment is a semiconductor device which includes a transistor 140 which is a first transistor formed using a single crystal semiconductor substrate and a transistor 162 which is a second transistor formed using a semiconductor film and provided above the transistor 140 with an insulating film provided therebetween. The transistor an example of which is described in any of Embodiments 1 to 3 can be favorably used as the transistor 162. Described in this embodiment is an example in which a transistor having a structure similar to that of the transistor 440*a* described in Embodiment 1 is used as the transistor 162.

Semiconductor materials and structures of the transistor 140 and the transistor 162, which are stacked, may be the same as or different from each other. In this embodiment, an example is described in which materials and structures which are appropriate for the circuit of the memory medium (memory element) are employed for the transistors.

Figure 15A:
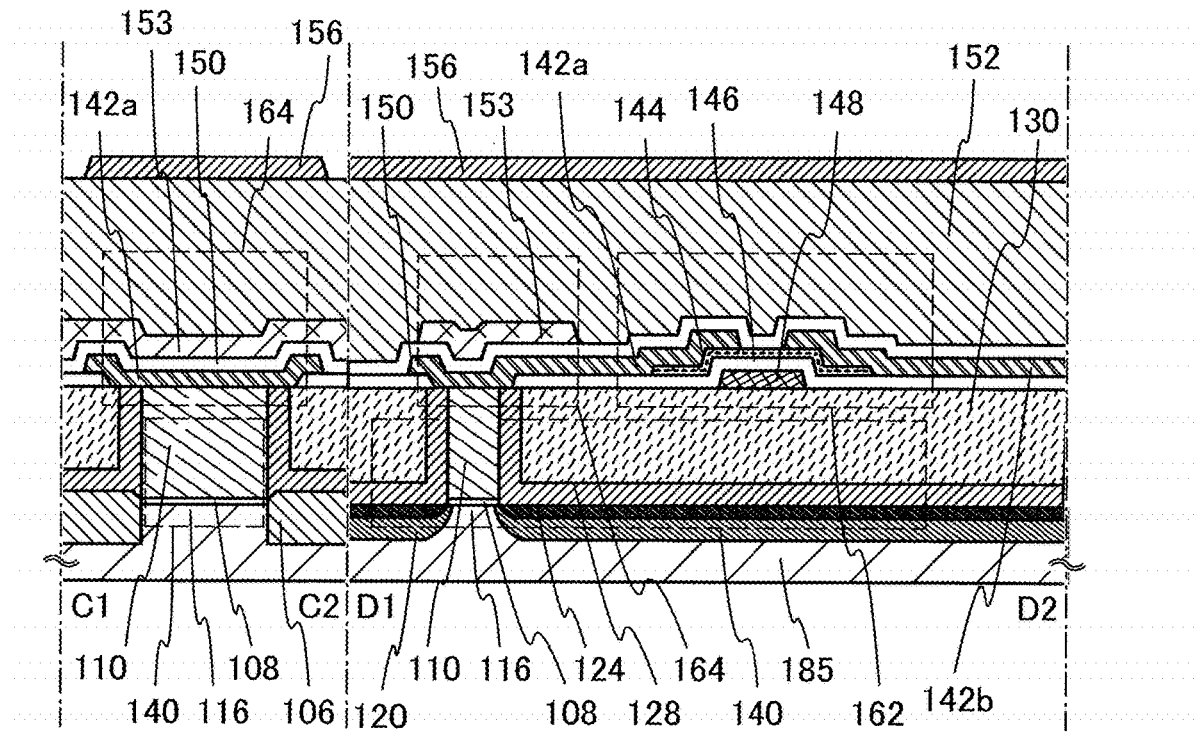
FIGS. 15A to 15C illustrate one embodiment of a semiconductor device.
Figure 15B:
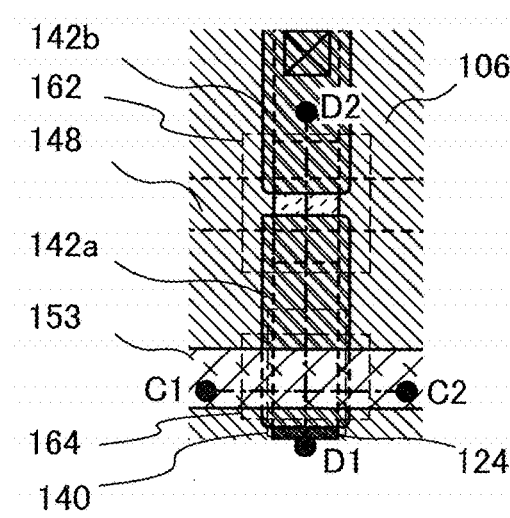
Figure 15C:
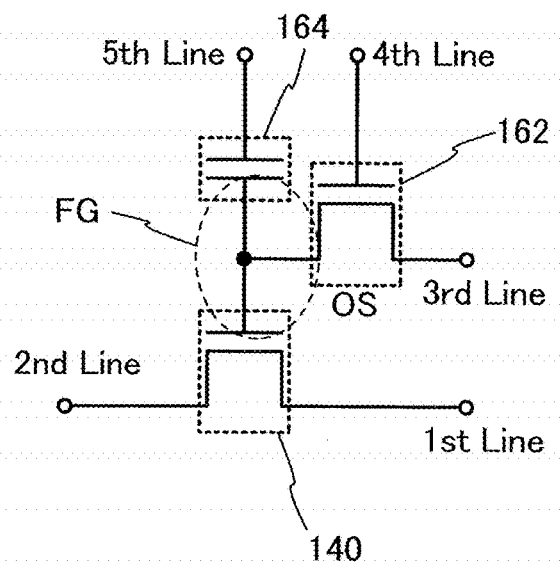

In FIGS. 15A to 15C, an example of the structure of the semiconductor device is illustrated. FIG. 15A illustrates a cross section of the semiconductor device, and FIG. 15B is a plane view of the semiconductor device. Here, FIG. 15A corresponds to a cross section along line C1-C2 and line D1-D2 in FIG. 15B. In addition, FIG. 15C is an example of a diagram of a circuit using the semiconductor device as a memory element. The semiconductor device illustrated in FIGS. 15A and 15B includes the transistor 140 using a first semiconductor material in its lower portion, and the transistor 162 using a second semiconductor material in its upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, or gallium arsenide can be used; a single crystal semiconductor is preferably used. Alternatively, an organic semiconductor material or the like may be used. A transistor using such a semiconductor material can operate at high speed easily. On the other hand, a transistor using an oxide semiconductor enables charge to be held for a long time owing to its characteristics.

The semiconductor device shown in FIGS. 15A to 15C is described with reference to FIGS. 15A to 15C.

The transistor 140 includes a channel formation region 116 provided in a substrate 185 containing a semiconductor material (e.g., silicon), impurity regions 120 provided so that the channel formation region 116 is positioned therebetween, metal compound regions 124 in contact with the impurity regions 120, a gate insulating film 108 provided over the channel formation region 116, and a gate electrode 110 provided over the gate insulating film 108.

As the substrate 185 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Although the "SOI substrate" generally means a substrate in which a silicon semiconductor film is provided on an insulating surface, the "SOI substrate" in this specification and the like also includes in its category a substrate in which a semiconductor film formed using a material other than silicon is provided on an insulating surface. That is, a semiconductor film included in the "SOI substrate" is not limited to a silicon semiconductor film. Moreover, the SOI substrate can have a structure in which a semiconductor film is provided over an insulating substrate such as a glass substrate with an insulating film provided therebetween.

As a method of forming the SOI substrate, any of the following methods can be used: a method in which oxygen ions are added to a mirror-polished wafer and then heating is performed thereon at a high temperature, whereby an oxide layer is formed at a certain depth from a top surface of the wafer and a defect caused in the surface layer is eliminated; a method in which a semiconductor substrate is separated by utilizing growth of microvoids formed by hydrogen ion irradiation, by heat treatment; a method in which a single crystal semiconductor film is formed over an insulating surface by crystal growth; and the like.

For example, ions are added through one surface of a single crystal semiconductor substrate, so that an embrittlement layer is formed at a certain depth from a surface of the single crystal semiconductor substrate, and an insulating film is formed over one of the surface of the single crystal semiconductor substrate and an element substrate. Heat treatment is performed in a state where the single crystal semiconductor substrate and the element substrate are bonded to each other with the insulating film provided therebetween, so that a crack is generated in the embrittlement layer and the single crystal semiconductor substrate is separated along the embrittlement layer. Accordingly, a single crystal semiconductor layer, which is separated from the single crystal semiconductor substrate, is formed as a semiconductor layer over the element substrate. An SOI substrate formed by the above method can also be favorably used.

An element isolation insulating layer 106 is provided over the substrate 185 so as to surround the transistor 140. For high integration, it is preferable that, as in FIGS. 15A to 15C, the transistor 140 do not have a sidewall insulating layer. On the other hand, in the case where the characteristics of the transistor 140 have priority, a sidewall insulating layer may be provided on a side surface of the gate electrode 110, and the impurity region 120 including a region having a different impurity concentration may be provided.

The transistor 140 formed using a single crystal semiconductor substrate can operate at high speed. Thus, the use of the transistor as a reading transistor enables data to be read at high speed. Two insulating films are formed so as to cover the transistor 140. As treatment prior to formation of the transistor 162 and a capacitor 164, CMP treatment is performed on the two insulating films, so that an insulating film 128 and an insulating film 130 are formed to be planarized and an upper surface of the gate electrode 110 is exposed.

As each of the insulating film 128 and the insulating film 130, as a typical example, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 128 and the insulating film 130 can be formed by a plasma-enhanced CVD method, a sputtering method, or the like.

Alternatively, an organic material such as a polyimide, an acrylic resin, or benzocyclobutene-based resin can be used. Other than such organic materials, it is also possible to use a low dielectric constant material (low-k material) or the like. In the case of using an organic material, the insulating film 128 and the insulating film 130 may be formed by a wet method such as a spin coating method or a printing method.

In the insulating film 130, a silicon oxide film is used as the film to be in contact with the semiconductor film.

In this embodiment, a 50-nm-thick silicon oxynitride film is formed as the insulating film 128 by a sputtering method, and a 550-nm-thick silicon oxide film is formed as the insulating film 130 by a sputtering method.

A gate electrode layer 148 is formed over the insulating film 130 which is sufficiently planarized by the CMP. The gate electrode layer 148 can be formed by forming a conductive layer and selectively etching the conductive layer.

A gate insulating film 146 is formed over the gate electrode layer 148.

For the gate insulating film 146, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a gallium oxide film can be formed by a plasma-enhanced CVD method, a sputtering method, or the like.

Oxide semiconductor films whose energy gaps are different from each other are stacked over the gate insulating film 146. In this embodiment, an In—Sn—Zn-based oxide layer and an In—Ga—Zn-based oxide layer are stacked in this order over the gate insulating film 146.

Next, the stacked layer of the oxide semiconductor films is selectively etched to form an island-shaped oxide semiconductor stacked layer 144.

Over the oxide semiconductor film stacked layer 144, a source and drain electrodes 142a and 142b are formed.

The conductive layers which can be used for the gate electrode layer 148 and the source and drain electrodes 142a and 142b can be formed by a PVD method such as a sputtering method or a CVD method such as a plasma-enhanced CVD method. Further, as a material of the conductive layers, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used.

The conductive layer has either a single-layer structure or a stacked-layer structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. A conductive layer having a single-layer structure of a titanium film or a titanium nitride film has an advantage in that it can be easily processed into the source and drain electrodes 142a and 142b having a tapered shape.

Next, an insulating film 150 is formed over the gate electrode layer 148, the gate insulating film 146, and the oxide semiconductor film stacked layer 144. An aluminum oxide film is formed as the insulating film 150 in this embodiment.

The aluminum oxide film which is provided as the film 150 over the oxide semiconductor stacked layer 144 has a high blocking effect by which both of oxygen and impurities such as hydrogen or water is prevented from being passed through the film.

Therefore, in and after the manufacturing process, the aluminum oxide film functions as a protective film for preventing entry of an impurity such as hydrogen or water, which causes a change, into the oxide semiconductor stacked layer 144 and release of oxygen, which is a main constituent material of the oxide semiconductor, from the oxide semiconductor stacked layer 144.

An insulating film may be further stacked over the insulating film 150.

As the insulating film, a silicon oxide film, a silicon nitride film, a silicon oxynitride film, a silicon nitride oxide film, an aluminum nitride film, an aluminum oxide film, an aluminum oxynitride film, an aluminum nitride oxide film, a hafnium oxide film, and a gallium oxide film formed by a plasma-enhanced CVD method, a sputtering method, or the like.

Over the insulating film 150, an electrode layer 153 is formed in a region which overlaps with the source or drain electrode 142a.

Next, an insulating film 152 is formed over the transistor 162 and the electrode layer 153. The insulating film 152 can be formed by a sputtering method, a CVD method, or the like. The insulating film 152 can be formed using a material including an inorganic insulating material such as silicon oxide, silicon oxynitride, silicon nitride, hafnium oxide, or aluminum oxide. Alternatively, an organic material such as polyimide, an acrylic resin, or a benzocyclobutene-based resin can be used, to which a wet process such as a coating method, a printing method, or an ink-jet method can be applied.

Next, an opening reaching the source or drain electrode 142b is formed in the gate insulating film 146, the insulating film 150, and the insulating film 152. The opening is formed by selective etching with the use of a mask or the like.

After that, a wiring 156 is formed in the opening to be in contact with the source or drain electrode 142b. A connection point of the source or drain electrode 142b and the wiring 156 is not illustrated in FIGS. 15A to 15C.

The wiring 156 is formed in such a manner that a conductive layer is formed by a PVD method such as a sputtering method or a CVD method such as a plasma-enhanced CVD method and then the conductive layer is etched. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used. The details are the same as the details of the source electrode or drain electrode 142a.

Through the above process, the transistor 162 and the capacitor 164 are completed. In this embodiment, the transistor 162 includes the oxide semiconductor stacked layer 144 including at least two oxide semiconductor layers whose energy gaps are different from each other. By using the oxide semiconductor stacked layer 144 using the plurality of oxide semiconductor layers whose energy gaps are different from each other, electrical characteristics of the transistor 162 can be adjusted with high accuracy, providing the transistor 162 with appropriate electrical characteristics. Further, in this embodiment, the oxide semiconductor stacked layer 144 is highly purified and contains excess oxygen that repairs an oxygen vacancy. Therefore, the transistor 162 has less off-state current and less change in electric characteristics and is thus electrically stable. The capacitor 164 includes the source or drain electrode 142a, the insulating film 150, and the electrode layer 153.

Further alternatively, the capacitor 164 may be omitted in the case where a capacitor is not requisite.

FIG. 15C is an example of a diagram of a circuit using the semiconductor device as a memory element. In FIG. 15C, one of a source electrode and a drain electrode of the transistor 162, one electrode of the capacitor 164, and a gate electrode of the transistor 140 are electrically connected to one another. A first wiring (1st Line, also referred to as a source line) is electrically connected to a source electrode of the transistor 140. A second wiring (2nd Line, also referred to as a bit line) is electrically connected to a drain electrode of the transistor 140. A third wiring (3rd Line, also referred to as a first signal line) is electrically connected to the other of the source electrode and the drain electrode of the transistor 162. A fourth wiring (4th Line, also referred to as a second signal line) is electrically connected to a gate electrode of the transistor 162. A fifth wiring (5th Line, also referred to as a word line) and the other electrode of the capacitor 164 are electrically connected to each other.

The transistor 162 using an oxide semiconductor has extremely small off-state current; therefore, by turning the transistor 162 off, the potential of a node (hereinafter, a node FG) where the one of the source electrode and the drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

To store data in the semiconductor device (in writing of data), the potential of the fourth wiring is set to a potential at which the transistor 162 is turned on, whereby the transistor 162 is turned on. Thus, the potential of the third wiring is supplied to the node FG, so that a predetermined amount of charge is accumulated in the node FG. Here, charge for supplying either of two different potential levels (hereinafter referred to as low-level charge and high-level charge) is given to the node FG. After that, the potential of the fourth wiring is set to a potential at which the transistor 162 is turned off, whereby the transistor 162 is turned off. This makes the node FG floating and the predetermined amount of charge is kept being held in the node FG. The predetermined amount of charge is thus accumulated and held in the node FG, whereby the memory cell can store data.

Since the off-state current of the transistor 162 is extremely small, the charge supplied to the node FG is kept being held for a long period. Thus, the refresh operation is not requisite or the frequency of the refresh operation can be extremely reduced, which leads to a sufficient reduction in power consumption. Further, stored data can be kept being held for a long time even while power is not supplied.

To read out stored data (in reading of data), while a predetermined potential (a fixed potential) is supplied to the first wiring, an appropriate potential (a read-out potential) is supplied to the fifth wiring, whereby the transistor 140 changes its state depending on the amount of charge held in the node FG. This is because in general, when the transistor 140 is an n-channel transistor, a threshold value $V_{th\_H}$ of the transistor 140 in the case where the high-level charge is held in the node FG is smaller than a threshold value $V_{th\_L}$ of the transistor 140 in the case where the low-level charge is held in the node FG. Here, each threshold voltage refers to the potential of the fifth wiring, which is requisite to turn on the transistor 140. Thus, by setting the potential of the fifth wiring to a potential $V_0$ which is between $V_{th\_H}$ and $V_{th\_L}$, charge held in the node FG can be determined. For example, in the case where the high-level electric charge is given in data writing, when the potential of the fifth wiring is $V_0$ ($>V_{th\_H}$), the transistor 140 is turned on. In the case where the low-level electric charge is given in writing, even when the potential of the fifth wiring is $V_0$ ($<V_{th\_L}$), the transistor 140 remains in its off state. Therefore, by controlling the potential of the fifth wiring and determining whether the transistor 140 is in an on state or off state (reading out the potential of the second wiring), stored data can be read out.

Further, in order to rewrite stored data, the next potential is supplied to the node FG that is holding the predetermined amount of charge given in the above data writing, so that the charge of the next data is held in the node FG. Specifically, the potential of the fourth wiring is set to a potential at which the transistor 162 is turned on, whereby the transistor 162 is turned on. The potential of the third wiring (potential of the next data) is supplied to the node FG, and the predetermined amount of charge is accumulated in the node FG. After that, the potential of the fourth wiring is set to a potential at which the transistor 162 is turned off, whereby the transistor 162 is turned off, whereby the charge of the next data is kept being held in the node FG. In other words, while the predetermined amount of charge given in the first writing is kept being held in the node FG, an operation (second writing) is performed in the same manner as the first writing, whereby data can be overwritten to be stored.

The off-state current of the transistor 162 described in this embodiment can be sufficiently reduced by using the oxide semiconductor stacked layer including at least two oxide semiconductor layers whose energy gaps are different from each other. Thus, by using such a transistor, a semiconductor device in which stored data can be kept being held for an extremely long time can be provided.

As described above, by using the oxide semiconductor stacked layer including a plurality of oxide semiconductor layers having different energy gaps, the electrical characteristics of the transistor can be adjusted with higher accuracy, providing the transistor with appropriate electrical characteristics. Accordingly, semiconductor devices for a variety of purposes such as high functionality, high reliability, and low power consumption can be provided.

The structures, methods, and the like described in this embodiment can be combined as appropriate with any of the structures, methods, and the like described in the other embodiments.

Embodiment 8

Any semiconductor device disclosed in this specification can be applied to a variety of electronic equipment (including game machines). Examples of electronic equipment are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic equipment each including the semiconductor device described in the above embodiment are described. The semiconductor device described above enables electronic equipment with quality for a variety of purposes such as high functionality, high reliability, and low power consumption to be provided.

Figure 16A:
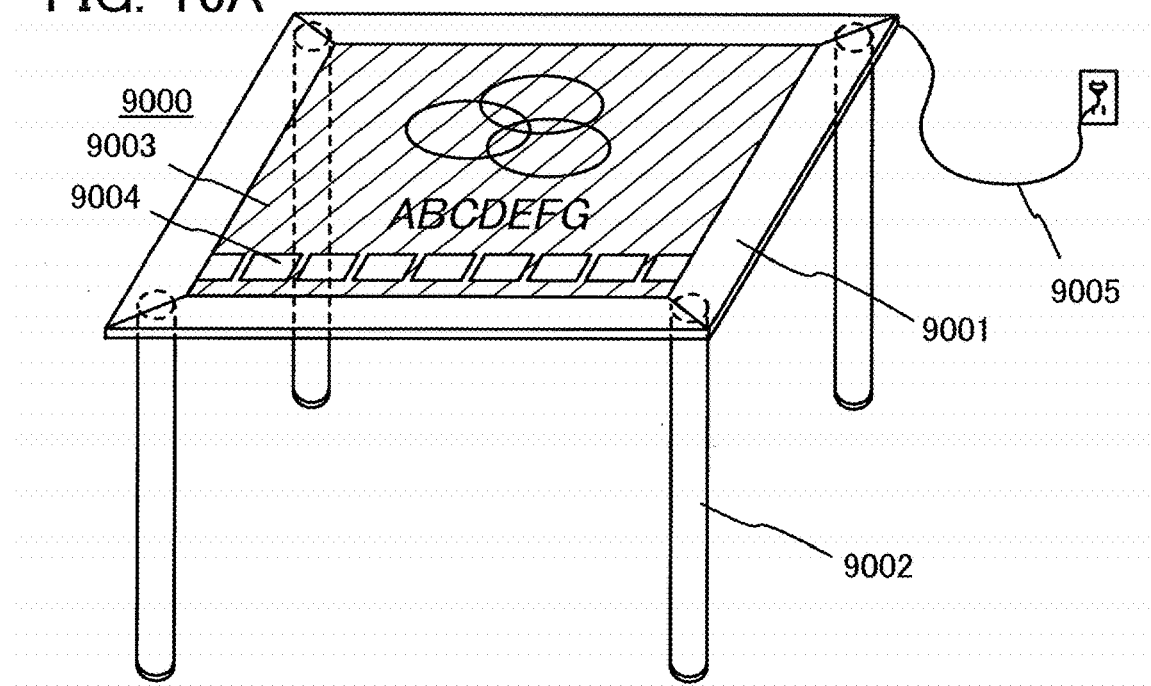
FIGS. 16A to 16D each illustrate electronic equipment.

FIG. 16A illustrates a table 9000 having a display portion. In the table 9000, a display portion 9003 is incorporated into a housing 9001. The semiconductor device manufactured according to one embodiment of the present invention can be used for the display portion 9003, and an image can be displayed on the display portion 9003. The housing 9001 is supported by 4 leg portions 9002 here. Further, a power cord 9005 for supplying power is provided for the housing 9001.

The display portion 9003 has a touch input function, so that users can operate the screen or input data by touching a display button 9004 displayed on the display portion 9003 of the table 9000 with their fingers or the like; this enables communication with or control of another home appliance, whereby the display portion 9003 can serves as a control device for controlling another home appliance by screen operation. For example, the display portion 9003 can be provided with a touch input function by using the semiconductor device having an image sensor function described in Embodiment 6.

Further, the screen of the display portion 9003 can be placed perpendicular to a floor with a hinge provided for the housing 9001; thus, the table 9000 can also be used as a television device. A television device having a large screen reduces an open space in a small room; by contrast, a display portion incorporated in a table leads to efficient use of the room space.

Figure 16B:
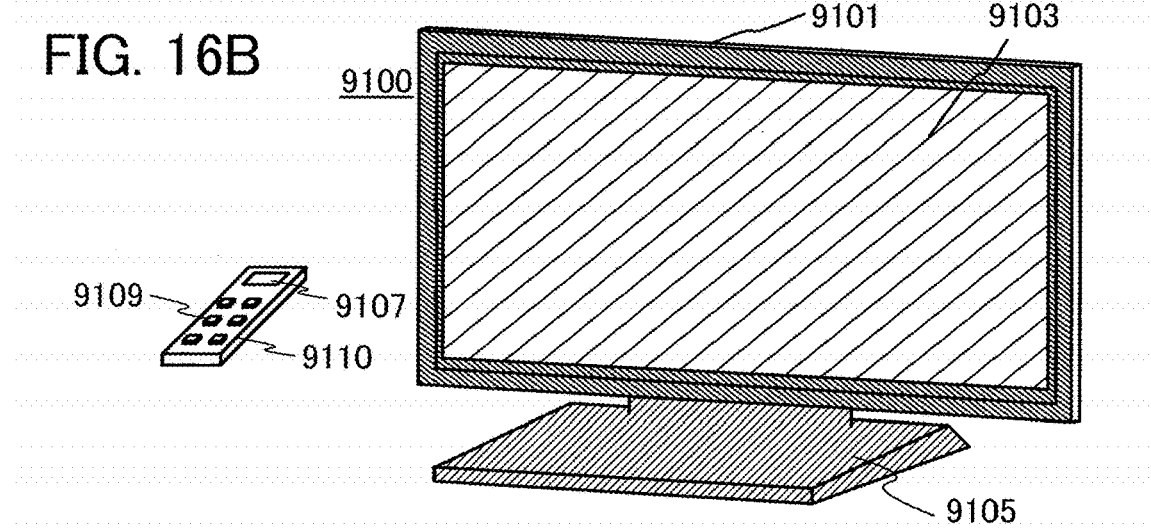

FIG. 16B illustrates a television set 9100. In the television set 9100, a display portion 9103 is incorporated in a housing 9101. The semiconductor device manufactured according to one embodiment of the present invention can be used in the display portion 9103, so that an image can be displayed on the display portion 9103. The housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 16B is provided with a receiver, a modem, and the like. With the receiver, the television set 9100 can receive a general television broadcast. Further, the television set 9100 can be connected to a communication network by wired or wireless connection via the modem, so that one-way (from sender to receiver) or two-way (between sender and receiver or between receivers) data communication can be performed.

The semiconductor device described in any of Embodiments 1 to 7 can be applied to the display portion 9103, whereby a higher-performance, highly reliable television set can be provided.

Figure 16C:
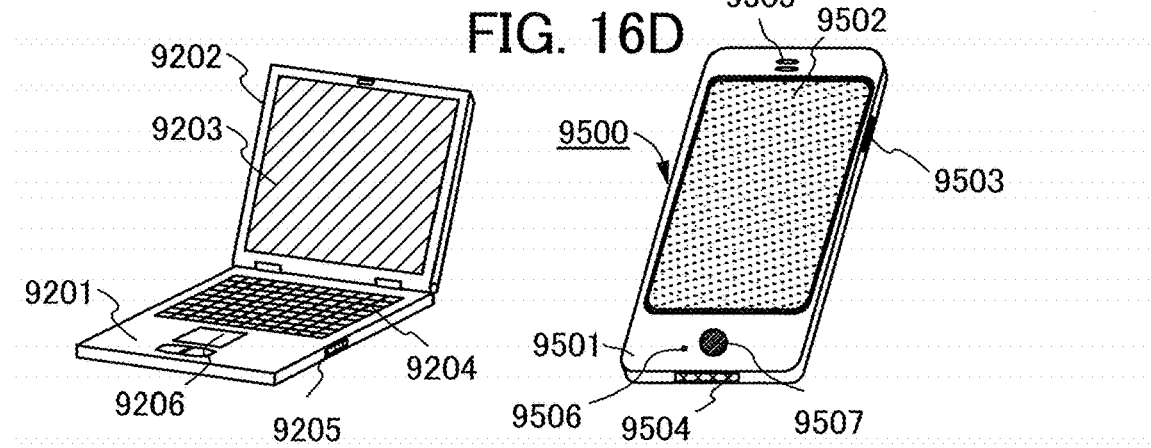

FIG. 16C illustrates a computer which includes a main body 9201, a housing 9202, a display portion 9203, a keyboard 9204, an external connection port 9205, a pointing device 9206, and the like. The computer is manufactured using the semiconductor device manufactured according to one embodiment of the present invention for the display portion 9203.

The semiconductor device described in any of Embodiments 1 to 7 can be applied to the display portion 9203, whereby a higher-performance, highly reliable computer can be provided.

Figure 16D:
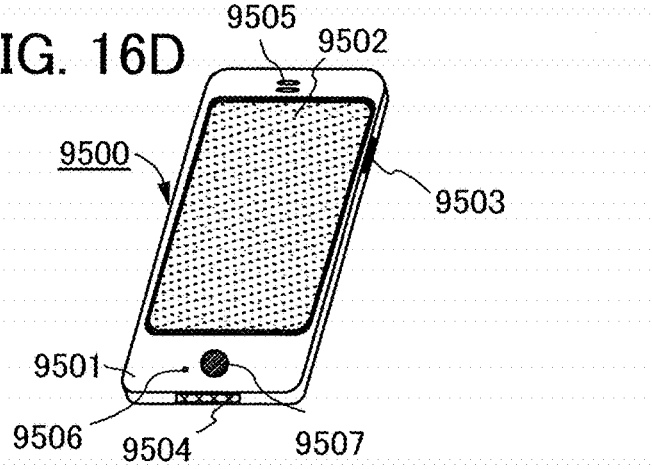

FIG. 16D illustrates an example of a mobile phone. A mobile phone 9500 is provided with a display portion 9502 incorporated in a housing 9501, an operation button 9503, an external connection port 9504, a speaker 9505, a microphone 9506, and the like. The semiconductor device described in any of Embodiments 1 to 7 can be applied to the display portion 9502, whereby a higher-performance, highly reliable mobile phone can be provided.

Users can input data, make a call, or text a message by touching the display portion 9502 of the mobile phone 9500 illustrated in FIG. 16D with their fingers or the like.

There are mainly three screen modes for the display portion 9502. The first mode is a display mode mainly for displaying images. The second mode is an input mode mainly for inputting data such as text. The third mode is a display-and-input mode in which two modes of the display mode and the input mode are combined.

For example, in the case of making a call or text messaging, a text input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation buttons 9503 of the housing 9501. Alternatively, the screen modes can be switched depending on kinds of images displayed on the display portion 9502. For example, when a signal of an image displayed on the display portion is a signal of moving image data, the screen mode is switched to the display mode; when the signal is a signal of text data, the screen mode is switched to the input mode.

Moreover, in the input mode, a signal detected by an optical sensor in the display portion 9502 may be detected, so that the screen mode may be controlled so as to be switched from the input mode to the display mode when input by touching the display portion 9502 is not performed within a specified period of time.

The display portion 9502 can also function as an image sensor. For example, an image of a palm print, a fingerprint, or the like is taken by touching the display portion 9502 with the palm or the finger, whereby personal authentication can be performed. Further, a backlight or a sensing light source which emits a near-infrared light may be provided for the display portion, by which an image of a finger vein, a palm vein, or the like can be taken.

The structures, methods, and the like described in this embodiment can be combined as appropriate with any of the structures, methods, and the like described in the other embodiments.

Example 1

In this example, Samples (Sample 1A, Sample 1B, Sample 2A, and Sample 2B) were manufactured in which a second oxide semiconductor layer whose energy gap is smaller than that of a first oxide semiconductor layer is formed over the first oxide semiconductor layer and a third oxide semiconductor layer is formed over the second oxide semiconductor layer, and cross-sectional structures of Sample 1A, Sample 1B, Sample 2A, and Sample 2B were observed. Further, ionization potentials of Samples 1A and 2A were measured, based on which the energy band diagrams were obtained by calculation. In this specification, the ionization potential is the sum of a band gap and an electron affinity, and the band gap is measured by ellipsometry on a single film formed of its material.

A 5-nm-thick In—Ga—Zn-based oxide film, a 5-nm-thick In—Sn—Zn-based oxide film, and a 5-nm-thick In—Ga—Zn-based oxide film were stacked over a quartz substrate, which is a substrate 1000, as a first oxide semiconductor layer 1001, a second oxide semiconductor layer 1002, and a third oxide semiconductor layer 1003, respectively, to form Sample 1A. Each layer was deposited by a sputtering method at a substrate temperature of 300° C. under an oxygen atmosphere (100% oxygen). An oxide target of In:Ga:Zn=1:1:1 (atomic ratio) was used for deposition of each In—Ga—Zn-based oxide film; an oxide target of In:Sn:Zn=2:1:3 (atomic ratio) was used for deposition of the In—Sn—Zn-based oxide film.

An oxide semiconductor stacked layer formed in a manner similar to that of Sample 1A was subjected to heat treatment, so that an oxide semiconductor stacked layer including a mixed region was formed to form Sample 1B. The heat treatment was performed at 650° C. under nitrogen atmosphere for one hour, and then performed at 650° C. under oxygen atmosphere for one hour.

A 5-nm-thick In—Ga—Zn-based oxide film, a 5-nm-thick In—Zn-based oxide film, and a 5-nm-thick In—Ga—Zn-based oxide film were stacked over a quartz substrate, which is a substrate 1000, as a first oxide semiconductor layer 1001, a second oxide semiconductor layer 1002, and a third oxide semiconductor layer 1003, respectively, to form Sample 2A. Each layer was deposited by a sputtering method at a substrate temperature of 300° C. under an oxygen atmosphere (100% oxygen). An oxide target of In:Ga:Zn=1:1:1 (atomic ratio) was used for deposition of each In—Ga—Zn-based oxide film; an oxide target of In:Zn=2:1 (atomic ratio) was used for deposition of the In—Zn-based oxide film.

An oxide semiconductor stacked layer formed in a manner similar to that of Sample 2A was subjected to heat treatment, so that an oxide semiconductor stacked layer including a mixed region was formed to form Sample 2B. The heat treatment was performed at 650° C. under nitrogen atmosphere for one hour, and then performed at 650° C. under oxygen atmosphere for one hour.

Figure 17A:
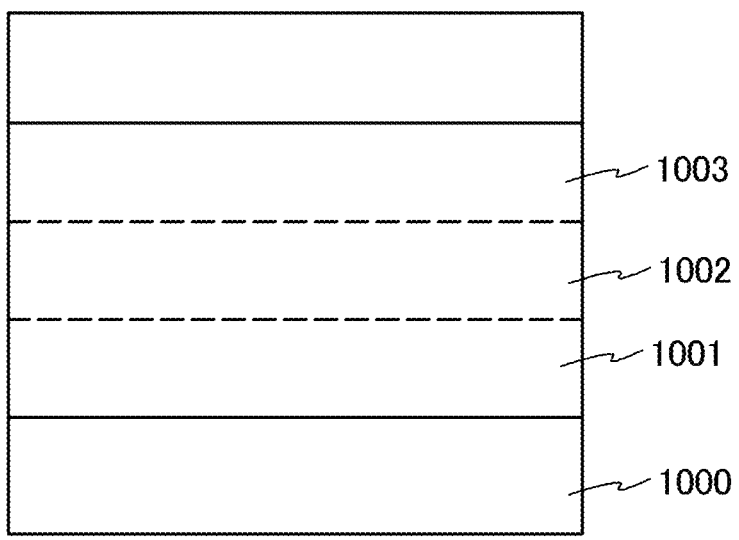
FIG. 17A is a schematic diagram and FIGS. 17B and 17C are TEM images of Samples in Example 1.
Figure 17B:
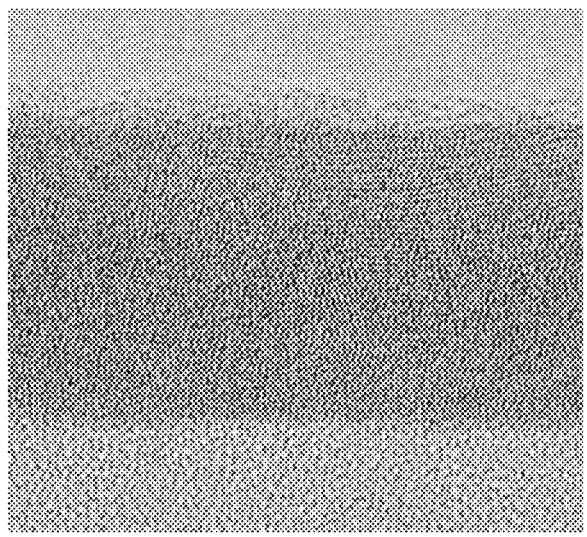
Figure 17C:
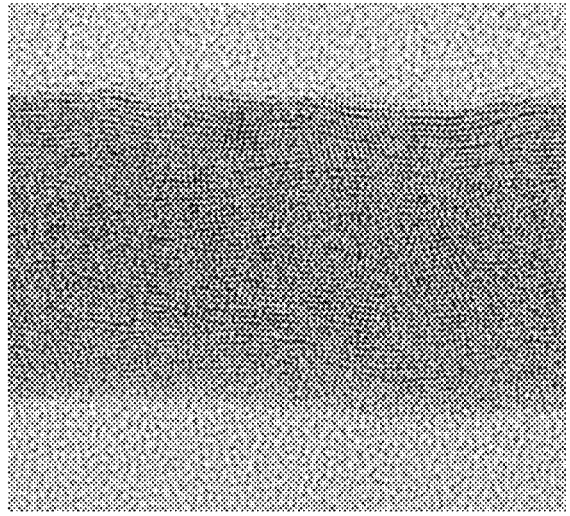
Figure 18A:
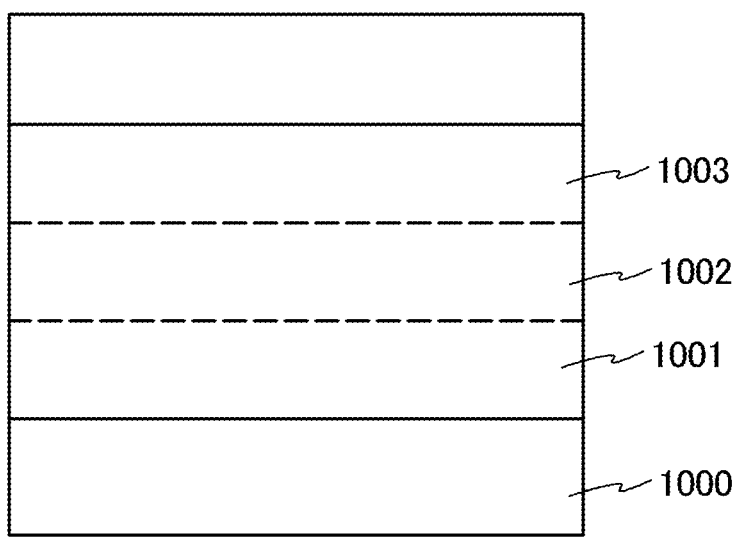
FIG. 18A is a schematic diagram and FIGS. 18B and 18C are TEM images of Samples in Example 1.
Figure 18B:
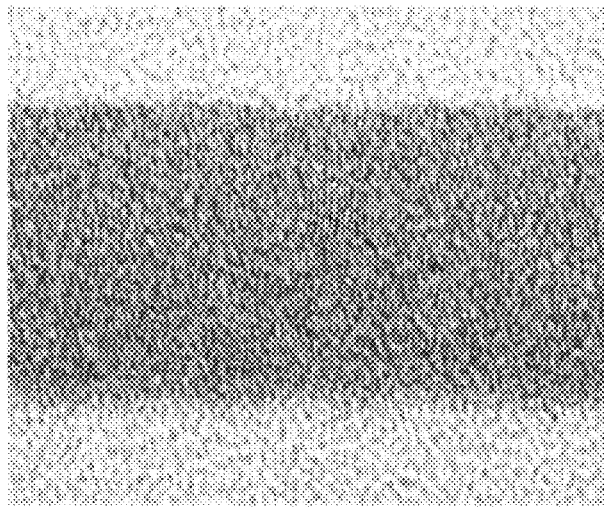
Figure 18C:
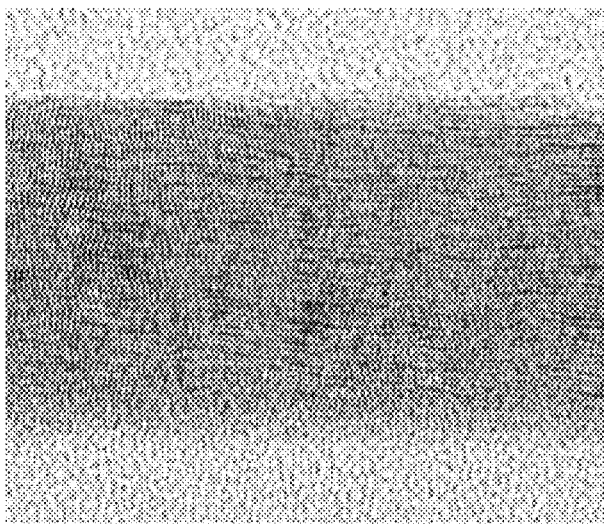

Respective edge sections were cut out of Samples 1A, 1B, 2A, and 2B, and cross sections thereof were observed with a high-resolution transmission electron microscopy ("H9000-NAR": TEM manufactured by Hitachi High-Technologies Corporation) at an accelerating voltage of 300 kV. FIG. 17B is a TEM image of Sample 1A; FIG. 17C is a TEM image of Sample 1B; FIG. 18B is a TEM image of Sample 2A; FIG. 18C is a TEM image of Sample 2B. A schematic diagram of Sample 1A and a schematic diagram of Sample 2A are FIG. 17A and FIG. 18A, respectively. Each interface between stacked oxide semiconductor layers is shown by a dotted line in FIGS. 17A and 18A, which is illustrated schematically.

The TEM images of Samples 1A and 1B in FIGS. 17B and 17C are of the oxide semiconductor stacked layer in which the first 5-nm-thick In—Ga—Zn-based oxide film, the 5-nm-thick In—Sn—Zn-based oxide film, and the second 5-nm-thick In—Ga—Zn-based oxide film were stacked over the substrate 1000 as the first oxide semiconductor layer 1001, the second oxide semiconductor layer 1002, and the third oxide semiconductor layer 1003, respectively. Each interface between the stacked oxide semiconductor layers can be recognized in the TEM image of Sample 1A in FIG. 17B. On the other hand, in the TEM image of Sample 1B in which the heat treatment was performed on the oxide semiconductor stacked layer, a clear interface is not recognized between the stacked oxide semiconductor layers as shown in FIG. 17C, and a mixed region is formed.

The TEM images of Samples 2A and 2B in FIGS. 18B and 18C are of the oxide semiconductor stacked layer in which the first 5-nm-thick In—Ga—Zn-based oxide film, the 5-nm-thick In—Zn-based oxide film, and the second 5-nm-thick In—Ga—Zn-based oxide film were stacked over the substrate 1000 as the first oxide semiconductor layer 1001, the second oxide semiconductor layer 1002, and the third oxide semiconductor layer 1003, respectively. Each interface between the stacked oxide semiconductor layers can be recognized in the TEM image of Sample 2A in FIG. 18B. On the other hand, in the TEM image of Sample 2B in which the heat treatment was performed on the oxide semiconductor stacked layer, a clear interface is not recognized between the stacked oxide semiconductor layers as shown in FIG. 18C, and a mixed region is formed.

As shown in FIGS. 17B, 17C, 18B, and 18C, it can be recognized that in Samples 1A, 1B, 2A, and 2B, the first In—Ga—Zn-based oxide film which is the first oxide semiconductor layer 1001, the In—Sn—Zn-based oxide film and the In—Zn-based oxide film each of which is the second oxide semiconductor layer 1002, and the second In—Ga—Zn-based oxide film which is the third oxide semiconductor layer 1003 each include a crystal and are a crystalline oxide semiconductor (CAAC-OS) film having c-axis alignment. The first In—Ga—Zn-based oxide film which is the first oxide semiconductor layer 1001 also includes an amorphous structure.

The crystal state of each oxide semiconductor layer in the oxide semiconductor stacked layer is not particularly limited; each and every oxide semiconductor layer may have a crystal structure or may have an amorphous structure, or both an oxide semiconductor layer having a crystal structure and an oxide semiconductor layer having an amorphous structure may be included in the oxide semiconductor stacked layer.

Figure 19:
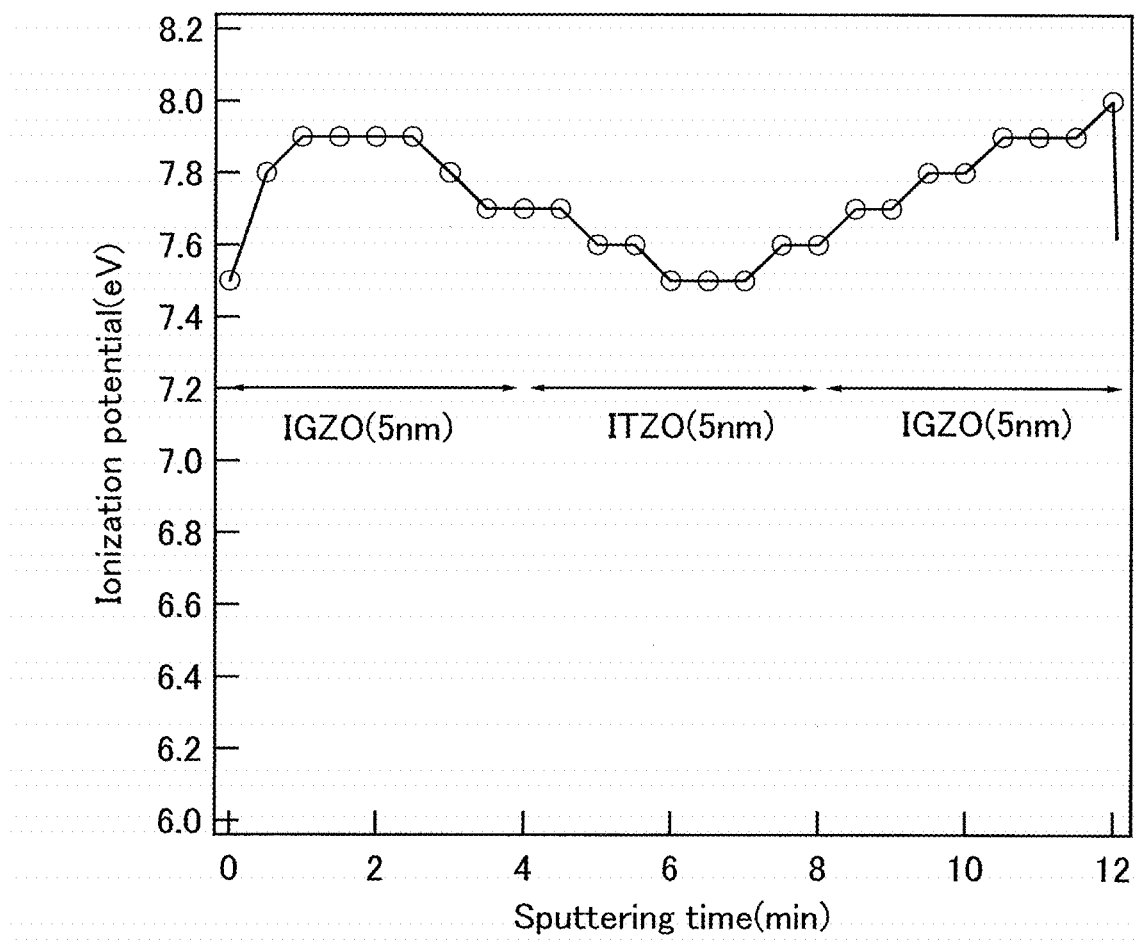
FIG. 19 is a graph showing an ionization potential.
Figure 21:
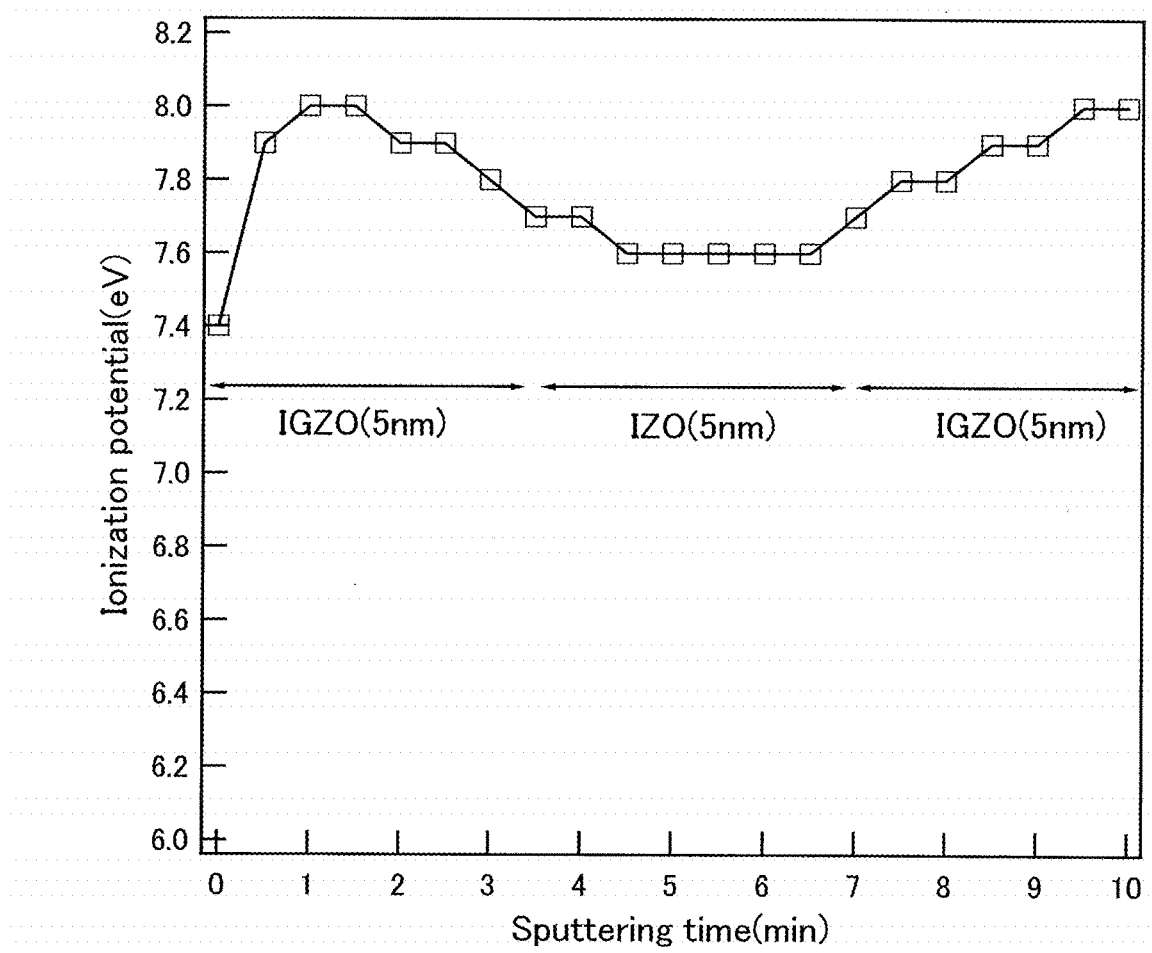
FIG. 21 is a graph showing an ionization potential.

Respective stacked layers were formed under deposition conditions which are the same as respective those of Sample 1A and Sample 2A except a single crystal silicon substrate being used as a substrate, and ionization potentials thereof were measured by ultraviolet photoelectron spectroscopy (UPS) while sputtering top surfaces thereof, results of which are shown in FIGS. 19 and 21.

In FIGS. 19 and 21, the horizontal axis indicates the sputtering time taken from the top surface of the sample, and the vertical axis indicates the ionization potential. Each interface is indicated on the assumption that the sputtering rate is equal to each other between the In—Ga—Zn-based oxide film and the In—Sn—Zn-based oxide film and the sputtering rate is equal to each other between the In—Ga—Zn-based oxide film and the In—Zn-based oxide film.

It can be seen from FIG. 19 that the ionization potential lowers in the In—Sn—Zn-based oxide film provided between the In—Ga—Zn-based oxide films. The ionization potential means the energy difference from the vacuum level to the valence band.

Figure 20:
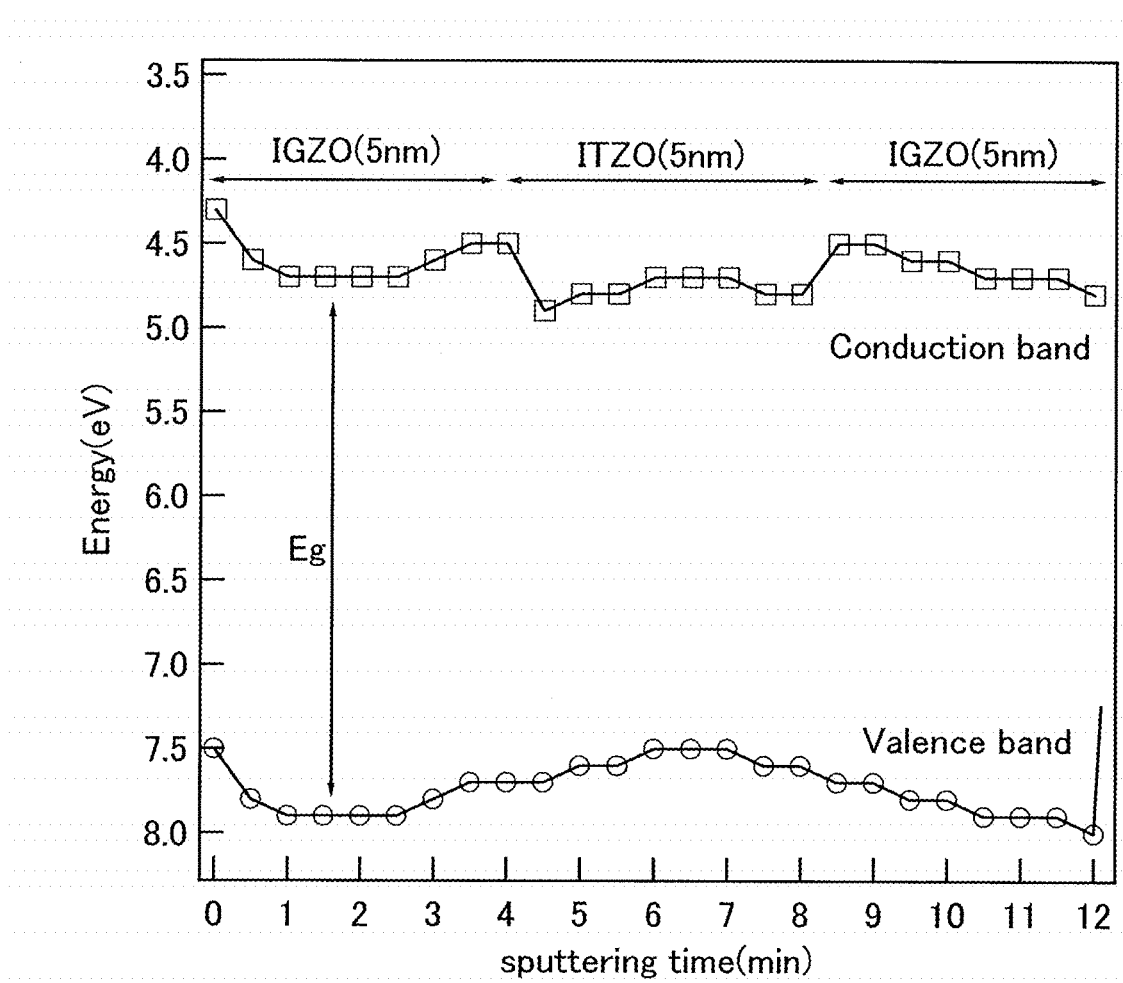
FIG. 20 is a graph showing an energy band diagram.

The band gap according to the ellipsometry measurement was subtracted from the ionization potential, so that the energy of the conduction band was obtained, drawing a band structure of the stacked layer. The band gap of the In—Ga—Zn-based oxide film and the band gap of the In—Sn—Zn-based oxide film were set at 3.2 eV and 2.8 eV, respectively. In this manner, FIG. 20 is obtained. It is found that a buried channel is formed in FIG. 20 as shown in an energy band diagram shown in FIG. 4C.

It can be seen from FIG. 21 that the ionization potential lowers in the In—Zn-based oxide film provided between the In—Ga—Zn-based oxide films. The ionization potential means the energy difference from the vacuum level to the valence band.

Figure 22:
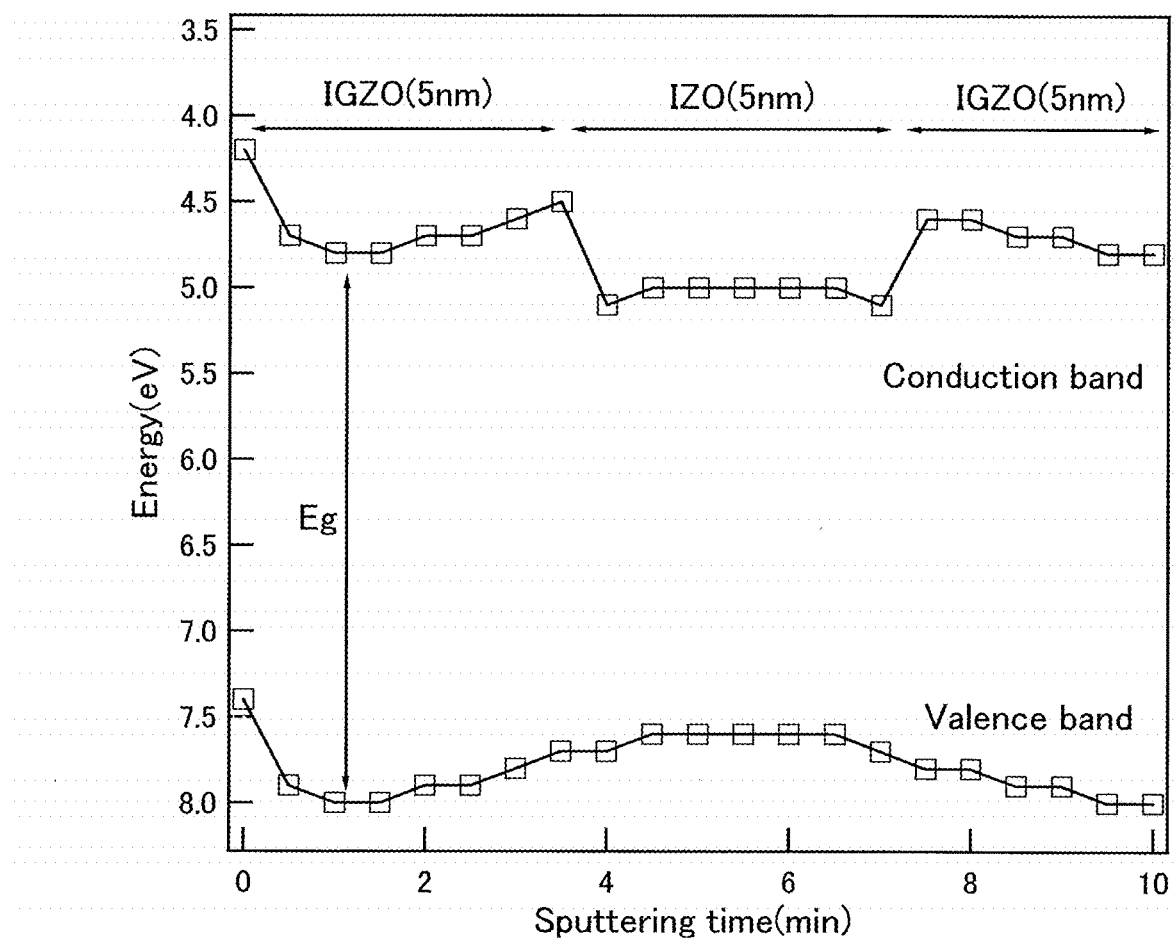
FIG. 22 is a graph showing an energy band diagram.

The band gap according to the ellipsometry measurement was subtracted from the ionization potential, so that the energy of the conduction band was obtained, drawing a band structure of the stacked layer. The band gap of the In—Ga—Zn-based oxide film and the band gap of the In—Zn-based oxide film were set at 3.2 eV and 2.6 eV, respectively. In this manner, FIG. 22 is obtained. It is found that a buried channel is formed in FIG. 22 as shown in the energy band diagram shown in FIG. 4C.

In this example, the stacked layer in which the In—Ga—Zn-based oxide film was used as each of the first oxide semiconductor layer and the third oxide semiconductor layer and the In—Sn—Zn-based oxide film or the In—Zn-based oxide film was used as the second oxide semiconductor layer whose ionization potential and energy gap are smaller than those of any of the first oxide semiconductor layer and the third oxide semiconductor layer was surely described by FIG. 20, FIG. 22, or the energy band diagram shown in FIG. 4C. The combination of materials of the first oxide semiconductor layer, the second oxide semiconductor layer, and the third oxide semiconductor layer is not particularly limited; materials may be used as appropriate to FIG. 20, FIG. 22, or the energy band diagram shown in FIG. 4C, considering their energy gaps.

Example 2

In this example, characteristics of transistors (Example Transistors 1 to 4 and Comparison Transistors 1 to 4) each including an oxide semiconductor stacked layer which consists of a stack of a first oxide semiconductor layer and a second oxide semiconductor layer, which are described as the transistors 440a, 440b, and 430 in Embodiment 1, were calculated.

For the calculation in this example, simulation software Technology Computer-Aided Design (TCAD) manufactured by Synopsys, Inc. was used.

As Example Transistors 1 and 2 and Comparison Transistors 1 and 2, bottom-gate (channel-etched type) transistors were used in each of which an oxide semiconductor stacked layer in which a first oxide semiconductor layer and a second oxide semiconductor layer are stacked in this order is provided over a 100-nm-thick gate insulating film provided over a gate electrode layer, and a source and drain electrode layers are provided over the oxide semiconductor stacked layer as described for the transistors 440a and 440b in Embodiment 1.

As Example Transistors 3 and 4 and Comparison Transistors 3 and 4, bottom-gate transistors were used in each of which a source and drain electrode layers are provided over a 100-nm-thick gate insulating film provided over a gate electrode layer, and an oxide semiconductor stacked layer in which a first oxide semiconductor layer and a second oxide semiconductor layer are stacked in this order is provided over the source and drain electrode layers as described for the transistor 430 in Embodiment 1.

The calculation was performed by setting both of the channel length (L) and the channel width (W) at 10 µm and setting the drain voltage (Vd) at 1 V in Example Transistors 1 to 4 and Comparison Transistors 1 to 4.

Each oxide semiconductor stacked layer of Example Transistors 1 to 4 includes the first oxide semiconductor layer and the second oxide semiconductor layer which have different energy gaps from each other. A 5-nm-thick In—Sn—Zn-based oxide film and a 5-nm-thick In—Ga—Zn-based oxide film were included as the first oxide semiconductor layer and the second oxide semiconductor layer, respectively, in Example Transistors 1 and 3; a 5-nm-thick In—Ga—Zn-based oxide film and a 5-nm-thick In—Sn—Zn-based oxide film were included as the first oxide semiconductor layer and the second oxide semiconductor layer, respectively, in Example Transistors 2 and 4.

On the other hand, each oxide semiconductor stacked layer of Comparison Transistors 1 to 4, which are comparison examples, includes the first oxide semiconductor layer and the second oxide semiconductor layer which have the same energy gap. A 5-nm-thick In—Ga—Zn-based oxide film and a 5-nm-thick In—Ga—Zn-based oxide film were included as the first oxide semiconductor layer and the second oxide semiconductor layer, respectively, (i.e., the oxide semiconductor stacked layer consists of In—Ga—Zn-based oxide films) in Comparison Transistors 1 and 3; a 5-nm-thick In—Sn—Zn-based oxide film and a 5-nm-thick In—Sn—Zn-based oxide film were included as the first oxide semiconductor layer and the second oxide semiconductor layer, respectively, (i.e., the oxide semiconductor stacked layer consists of ITGO films) in Comparison Transistors 2 and 4.

For the calculation, in Example Transistors 1 to 4 and Comparison Transistors 1 to 4, the band gap, carrier life time, bulk mobility, and electron affinity of the In—Ga—Zn-based oxide film were set at 3.15 eV, 1 nsec, 10 cm$^2$/Vs, and 4.6 eV, respectively; the band gap, carrier life time, bulk mobility, and electron affinity of the In—Sn—Zn-based oxide film were set at 2.8 eV, 1 nsec, 35 cm$^2$/Vs, and 4.6 eV, respectively.

Figure 23A:
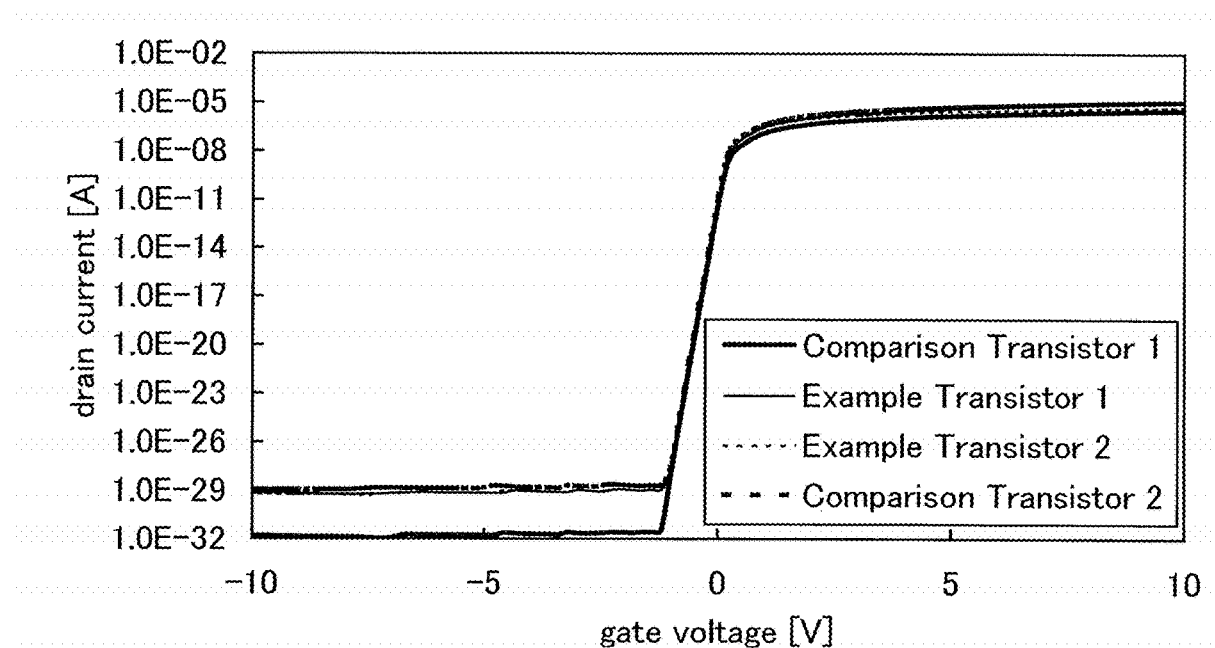
FIGS. 23A and 23B are graphs showing off-state current of transistors.
Figure 23B:
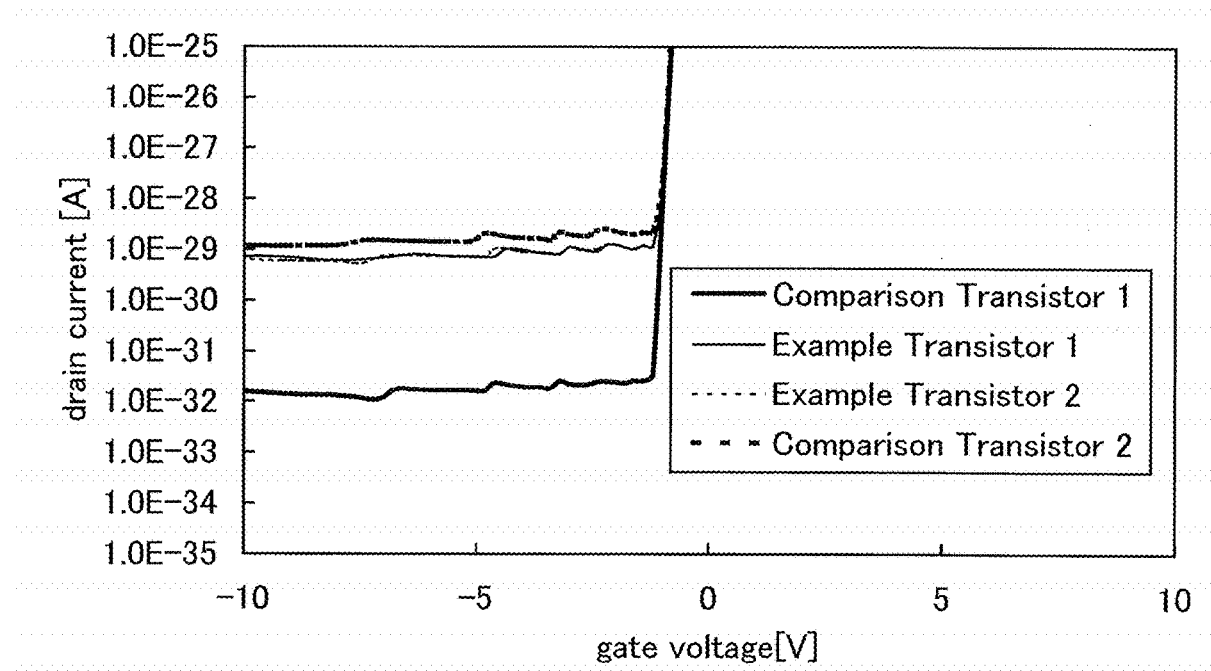
Figure 25A:
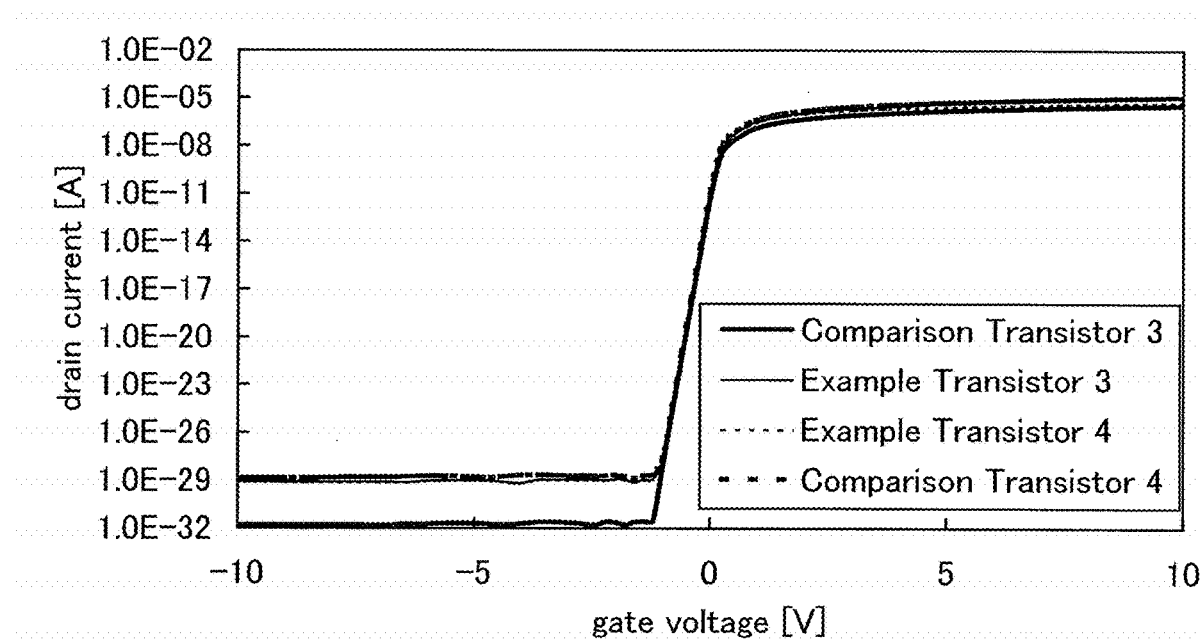
FIGS. 25A and 25B are graphs showing off-state current of transistors.
Figure 25B:
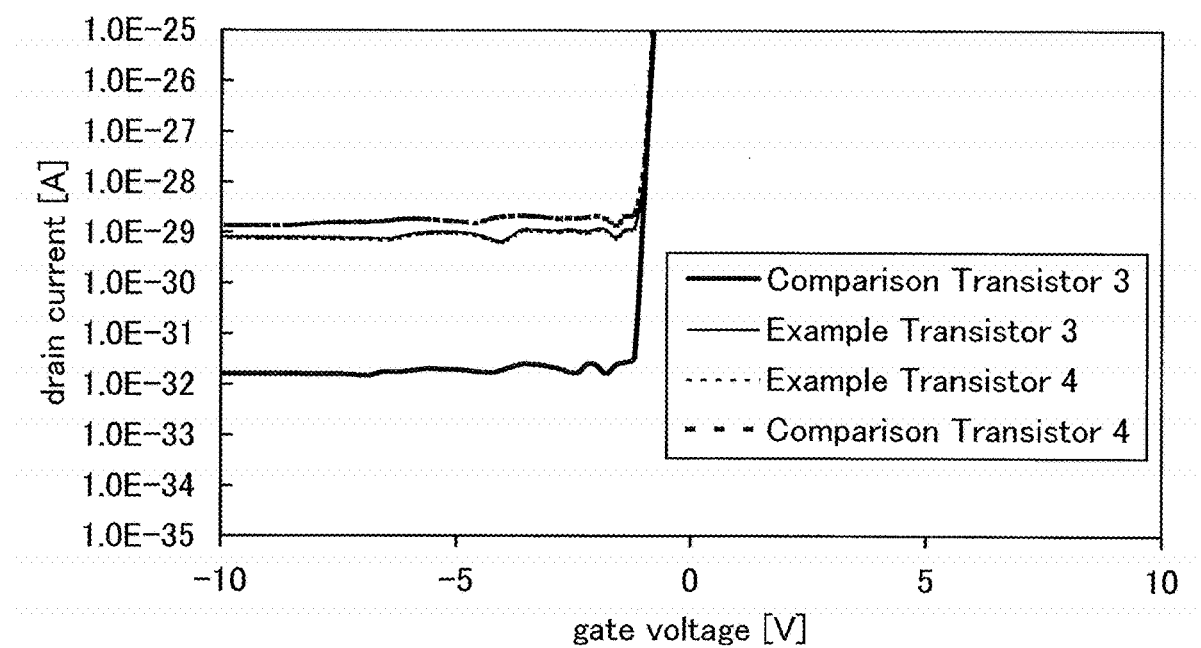

The off-state currents obtained through the calculation of Example Transistors 1 and 2 and Comparison Transistors 1 and 2 are shown in FIGS. 23A and 23B; those obtained through the calculation of Example Transistors 3 and 4 and Comparison Transistors 3 and 4 are shown in FIGS. 25A and 25B. FIGS. 23B and 25B are enlarged graphs at drain currents ranging from $1.0 \times 10^{-35}$ A to $1.0 \times 10^{-25}$ A in FIGS. 23A and 25A, respectively. In FIGS. 23A and 23B, and FIGS. 25A and 25B, the vertical axis indicates the drain current (A) and the horizontal axis indicates the gate voltage (V).

Figure 24:
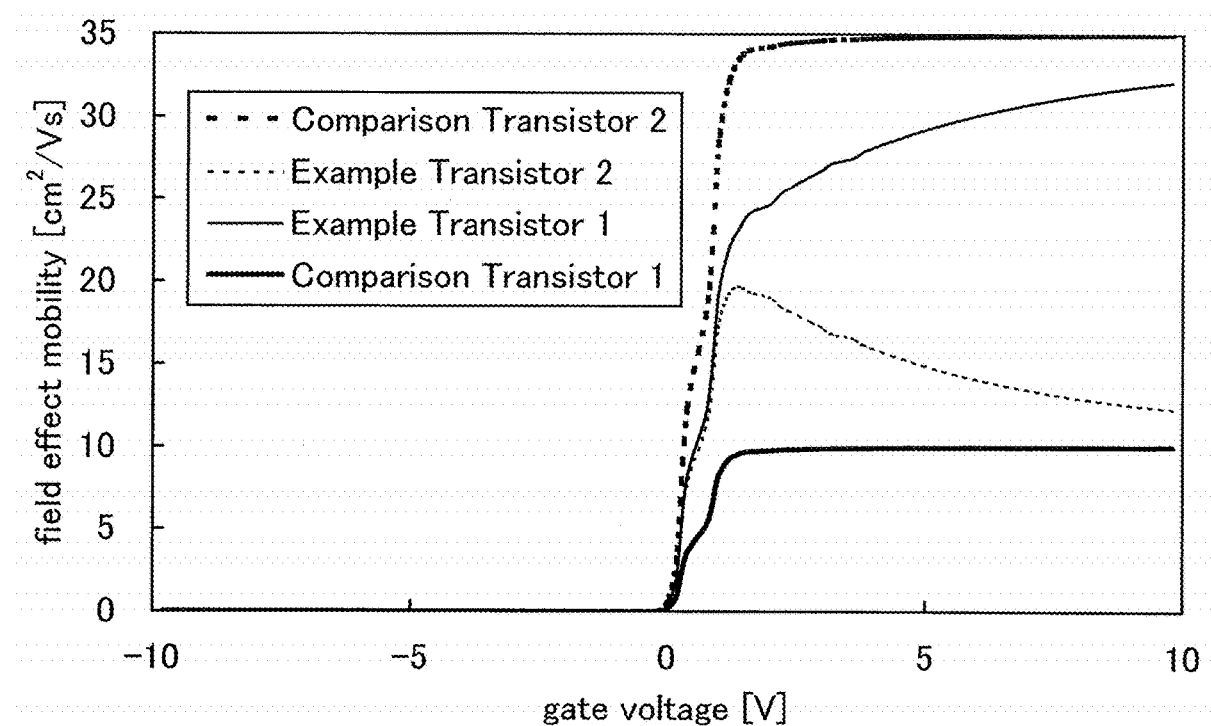
FIG. 24 is a graph showing field-effect mobility of the transistors.
Figure 26:
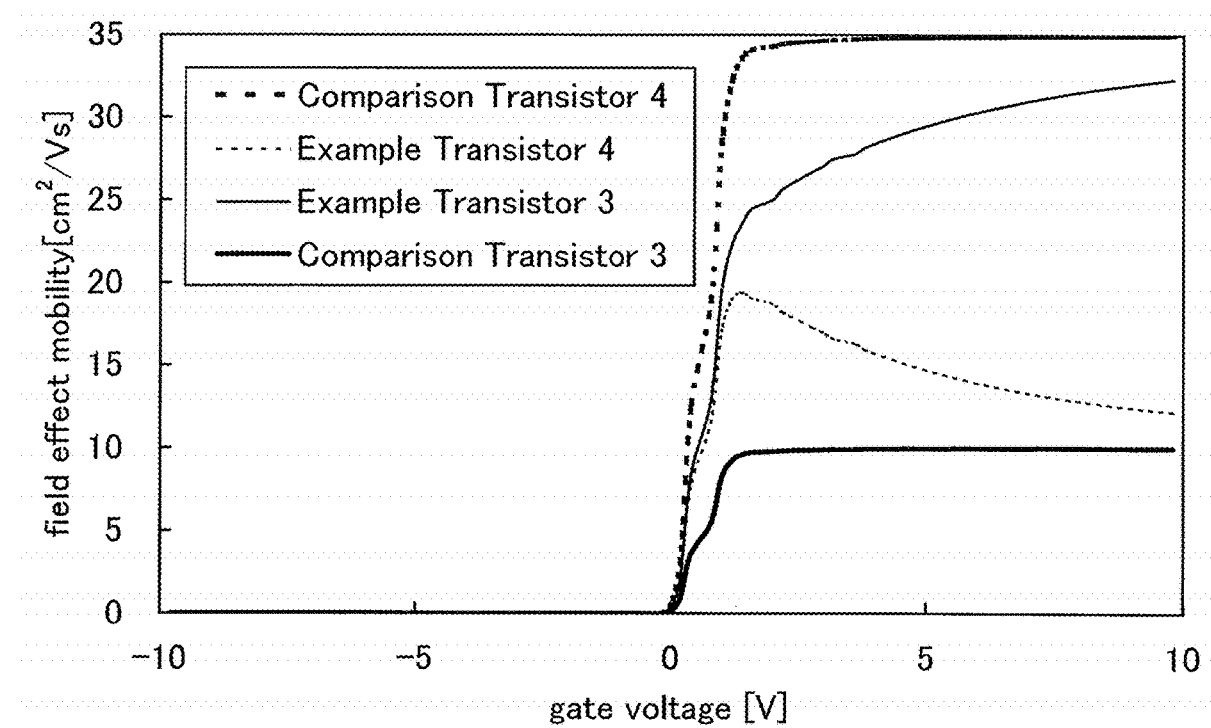
FIG. 26 is a graph showing field-effect mobility of the transistors.

The filed-effect mobilities obtained through the calculation of Example Transistors 1 and 2 and Comparison Transistors 1 and 2 are shown in FIG. 24; those obtained through the calculation of Example Transistors 3 and 4 and Comparison Transistors 3 and 4 are shown in FIG. 26. In FIGS. 24 and 26, the vertical axis indicates the filed-effect mobility (cm$^2$/Vs) and the horizontal axis indicates the gate voltage (V).

In Example Transistors 1 and 2 and Comparison Transistors 1 and 2, which have the same structure, the off-state current was different as shown in FIGS. 23A and 23B, and the field-effect mobility was also different as shown in FIG. 24.

Likewise in Example Transistors 3 and 4 and Comparison Transistors 3 and 4, which have the same structure, the off-state current was different as shown in FIGS. 25A and 25B, and the field-effect mobility was also different as shown in FIG. 26.

In this example, particularly, the difference in the field-effect mobility shown in FIGS. 24 and 26 became remarkable depending on the oxide semiconductor materials and the stack order of layers of the oxide semiconductor stacked layer.

The foregoing results prove that electrical characteristics (the field-effect mobility and the off-state current in this example) of a transistor can be changed variously by a stacked layer of oxide semiconductor layers whose band gaps are different from each other without changing the structure of the transistor.

Thus, by using an oxide semiconductor stacked layer, electrical characteristics of a transistor can be adjusted with high accuracy, providing the transistor with appropriate electrical characteristics.

This application is based on Japanese Patent Application serial no. 2011-152099 filed with Japan Patent Office on Jul. 8, 2011, the entire contents of which are hereby incorporated by reference.

What is claimed is:

1. A semiconductor device comprising:
    a gate electrode;
    a gate insulating film over the gate electrode;
    a first oxide semiconductor layer over and in direct contact with the gate insulating film;
    a second oxide semiconductor layer over and in direct contact with the first oxide semiconductor layer;
    a source electrode over and in direct contact with the second oxide semiconductor layer;
    a drain electrode over and in direct contact with the second oxide semiconductor layer; and
    an oxide insulating layer over the source electrode and the drain electrode,
    wherein the oxide insulating layer is in direct contact with the second oxide semiconductor layer between the source electrode and the drain electrode,
    wherein the first oxide semiconductor layer comprises indium, tin, and zinc,
    wherein the second oxide semiconductor layer comprises indium, gallium, and zinc,
    wherein an energy gap of the first oxide semiconductor layer is smaller than an energy gap of the second oxide semiconductor layer, and
    wherein a c-axis of a crystal in the second oxide semiconductor layer is perpendicular to an upper surface of the second oxide semiconductor layer.

2. The semiconductor device according to claim 1, wherein the second oxide semiconductor layer is in direct contact with a side surface of the first oxide semiconductor layer.

3. The semiconductor device according to claim 1, wherein the oxide insulating layer comprises aluminum and oxygen.

4. The semiconductor device according to claim 1, wherein each of the first oxide semiconductor layer and the second oxide semiconductor layer comprises an oxygen excess region.

5. The semiconductor device according to claim 1, wherein the side surface of the first oxide semiconductor layer is along a channel width direction.

6. The semiconductor device according to claim 1, further comprising:
    a first transistor comprising silicon in a channel formation region; and
    a first insulating layer over the first transistor and under the first oxide semiconductor layer.

7. A semiconductor device comprising:
    a gate electrode;
    a gate insulating film over the gate electrode;
    a first oxide semiconductor layer over and in direct contact with the gate insulating film;
    a second oxide semiconductor layer over and in direct contact with the first oxide semiconductor layer;
    a source electrode over and in direct contact with the second oxide semiconductor layer;
    a drain electrode over and in direct contact with the second oxide semiconductor layer; and
    an oxide insulating layer over the source electrode and the drain electrode,
    wherein the oxide insulating layer is in direct contact with the second oxide semiconductor layer between the source electrode and the drain electrode,
    wherein the first oxide semiconductor layer comprises indium, tin, and zinc,
    wherein the second oxide semiconductor layer comprises indium, gallium, and zinc, and
    wherein an energy gap of the first oxide semiconductor layer is smaller than an energy gap of the second oxide semiconductor layer.

8. The semiconductor device according to claim 7, wherein the second oxide semiconductor layer is in direct contact with a side surface of the first oxide semiconductor layer.

* * * * *